United States Patent
Becker et al.

(10) Patent No.: US 9,425,273 B2
(45) Date of Patent: *Aug. 23, 2016

(54) SEMICONDUCTOR CHIP INCLUDING INTEGRATED CIRCUIT INCLUDING AT LEAST FIVE GATE LEVEL CONDUCTIVE STRUCTURES HAVING PARTICULAR SPATIAL AND ELECTRICAL RELATIONSHIP AND METHOD FOR MANUFACTURING THE SAME

(71) Applicant: Tela Innovations, Inc., Los Gatos, CA (US)

(72) Inventors: Scott T. Becker, Scotts Valley, CA (US); Michael C. Smayling, Fremont, CA (US)

(73) Assignee: Tela Innovations, Inc., Los Gatos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/946,292

(22) Filed: Nov. 19, 2015

(65) Prior Publication Data

US 2016/0079381 A1    Mar. 17, 2016

Related U.S. Application Data

(63) Continuation of application No. 13/774,919, filed on Feb. 22, 2013, which is a continuation of application No. 12/572,225, filed on Oct. 1, 2009, now Pat. No. 8,436,400, which is a continuation of application No.

(Continued)

(51) Int. Cl.
*H01L 27/10* (2006.01)
*H01L 29/423* (2006.01)

(Continued)

(52) U.S. Cl.
CPC ..... *H01L 29/42376* (2013.01); *G06F 17/5068* (2013.01); *G06F 17/5072* (2013.01);

(Continued)

(58) Field of Classification Search
CPC ........... H01L 27/027; H01L 27/11807; H01L 27/1104; H01L 27/11; H01L 27/092
USPC ......................................................... 257/206
See application file for complete search history.

(56) References Cited

U.S. PATENT DOCUMENTS

| 4,069,493 A | 1/1978 | Bobenrieth |
| 4,197,555 A | 4/1980 | Uehara et al. |

(Continued)

FOREIGN PATENT DOCUMENTS

| EP | 0102644 | 7/1989 |
| EP | 0788166 | 8/1997 |

(Continued)

OTHER PUBLICATIONS

U.S. Appl. No. 60/625,342, filed May 25, 2006, Pileggi et al.

(Continued)

*Primary Examiner* — Quoc Hoang
(74) *Attorney, Agent, or Firm* — Marine Penilla Group, LLP

(57) ABSTRACT

A semiconductor chip region includes a first conductive structure (CS) that forms a gate electrode (GE) of a first transistor of a first transistor type (TT) and a GE of a first transistor of a second TT, a second CS that forms a GE of a second transistor of the first TT, a third CS that forms a GE of a second transistor of the second TT, a fourth CS that forms a GE of a third transistor of the first TT, and a fifth CS that forms a GE of a third transistor of the second TT. Diffusion terminals of the first and second transistors of the first TT are electrically connected. Diffusion terminals of the first and second transistors of the second TT are electrically connected. Diffusion terminals of the second and third transistors of both the first TT and second TT are electrically connected.

30 Claims, 28 Drawing Sheets

Related U.S. Application Data

12/212,562, filed on Sep. 17, 2008, now Pat. No. 7,842,975, which is a continuation of application No. 11/683,402, filed on Mar. 7, 2007, now Pat. No. 7,446,352.

(60) Provisional application No. 60/781,288, filed on Mar. 9, 2006.

(51) Int. Cl.
    *H01L 27/092*     (2006.01)
    *H01L 27/02*     (2006.01)
    *G06F 17/50*     (2006.01)
    *H01L 27/088*     (2006.01)
    *H01L 21/8238*     (2006.01)
    *H01L 27/118*     (2006.01)
    *H01L 23/522*     (2006.01)
    *H01L 23/528*     (2006.01)

(52) U.S. Cl.
CPC ... *H01L21/823871* (2013.01); *H01L 23/5226* (2013.01); *H01L 23/5283* (2013.01); *H01L 27/0207* (2013.01); *H01L 27/088* (2013.01); *H01L 27/092* (2013.01); *H01L 27/11807* (2013.01); *H01L 29/42372* (2013.01); *H01L 2027/11888* (2013.01); *H01L 2924/0002* (2013.01)

(56) References Cited

U.S. PATENT DOCUMENTS

| | | |
|---|---|---|
| 4,417,161 A | 11/1983 | Uya |
| 4,424,460 A | 1/1984 | Best |
| 4,602,270 A | 7/1986 | Finegold |
| 4,613,940 A | 9/1986 | Shenton et al. |
| 4,657,628 A | 4/1987 | Holloway et al. |
| 4,682,202 A | 7/1987 | Tanizawa |
| 4,745,084 A | 5/1988 | Rowson et al. |
| 4,780,753 A | 10/1988 | Ohkura et al. |
| 4,801,986 A | 1/1989 | Chang et al. |
| 4,804,636 A | 2/1989 | Groover, III |
| 4,812,688 A | 3/1989 | Chu et al. |
| 4,884,115 A | 11/1989 | Michel et al. |
| 4,928,160 A | 5/1990 | Crafts |
| 4,975,756 A | 12/1990 | Haken et al. |
| 5,047,979 A | 9/1991 | Leung |
| 5,068,603 A | 11/1991 | Mahoney |
| 5,079,614 A | 1/1992 | Khatakhotan |
| 5,097,422 A | 3/1992 | Corbin et al. |
| 5,117,277 A | 5/1992 | Yuyama et al. |
| 5,121,186 A | 6/1992 | Wong et al. |
| 5,208,765 A | 5/1993 | Turnbull |
| 5,224,057 A | 6/1993 | Igarashi |
| 5,242,770 A | 9/1993 | Chen et al. |
| 5,268,319 A | 12/1993 | Harari |
| 5,298,774 A | 3/1994 | Ueda et al. |
| 5,313,426 A | 5/1994 | Sakuma et al. |
| 5,338,963 A | 8/1994 | Klaasen |
| 5,351,197 A | 9/1994 | Upton et al. |
| 5,359,226 A | 10/1994 | DeJong |
| 5,365,454 A | 11/1994 | Nakagawa et al. |
| 5,367,187 A | 11/1994 | Yuen |
| 5,378,649 A | 1/1995 | Huang |
| 5,396,128 A | 3/1995 | Dunning et al. |
| 5,420,447 A | 5/1995 | Waggoner |
| 5,461,577 A | 10/1995 | Shaw et al. |
| 5,471,403 A | 11/1995 | Fujimaga |
| 5,497,334 A | 3/1996 | Russell et al. |
| 5,497,337 A | 3/1996 | Ponnapalli et al. |
| 5,526,307 A | 6/1996 | Lin et al. |
| 5,536,955 A | 7/1996 | Ali |
| 5,545,904 A | 8/1996 | Orbach |
| 5,581,098 A | 12/1996 | Chang |
| 5,581,202 A | 12/1996 | Yano et al. |
| 5,612,893 A | 3/1997 | Hao et al. |
| 5,636,002 A | 6/1997 | Garofalo |
| 5,656,861 A | 8/1997 | Godinho et al. |
| 5,682,323 A | 10/1997 | Pasch et al. |
| 5,684,311 A | 11/1997 | Shaw |
| 5,684,733 A | 11/1997 | Wu et al. |
| 5,698,873 A | 12/1997 | Colwell et al. |
| 5,705,301 A | 1/1998 | Garza et al. |
| 5,723,883 A | 3/1998 | Gheewalla |
| 5,723,908 A | 3/1998 | Fuchida et al. |
| 5,740,068 A | 4/1998 | Liebmann et al. |
| 5,745,374 A | 4/1998 | Matsumoto |
| 5,764,533 A | 6/1998 | deDood |
| 5,774,367 A | 6/1998 | Reyes et al. |
| 5,780,909 A | 7/1998 | Hayashi |
| 5,789,776 A | 8/1998 | Lancaster et al. |
| 5,790,417 A | 8/1998 | Chao et al. |
| 5,796,128 A | 8/1998 | Tran et al. |
| 5,796,624 A | 8/1998 | Sridhar et al. |
| 5,798,298 A | 8/1998 | Yang et al. |
| 5,814,844 A | 9/1998 | Nagata et al. |
| 5,825,203 A | 10/1998 | Kusunoki et al. |
| 5,834,851 A | 11/1998 | Ikeda et al. |
| 5,838,594 A | 11/1998 | Kojima |
| 5,841,663 A | 11/1998 | Sharma et al. |
| 5,847,421 A | 12/1998 | Yamaguchi |
| 5,850,362 A | 12/1998 | Sakuma et al. |
| 5,852,562 A | 12/1998 | Shinomiya et al. |
| 5,858,580 A | 1/1999 | Wang et al. |
| 5,898,194 A | 4/1999 | Gheewala |
| 5,900,340 A | 5/1999 | Reich et al. |
| 5,905,287 A | 5/1999 | Hirata |
| 5,908,827 A | 6/1999 | Sirna |
| 5,915,199 A | 6/1999 | Hsu |
| 5,917,207 A | 6/1999 | Colwell et al. |
| 5,920,486 A | 7/1999 | Beahm et al. |
| 5,923,059 A | 7/1999 | Gheewala |
| 5,923,060 A | 7/1999 | Gheewala |
| 5,929,469 A | 7/1999 | Mimoto et al. |
| 5,930,163 A | 7/1999 | Hara et al. |
| 5,935,763 A | 8/1999 | Caterer et al. |
| 5,949,101 A | 9/1999 | Aritome |
| 5,973,507 A | 10/1999 | Yamazaki |
| 5,977,305 A | 11/1999 | Wigler et al. |
| 5,977,574 A | 11/1999 | Schmitt et al. |
| 5,998,879 A | 12/1999 | Iwaki et al. |
| 6,009,251 A | 12/1999 | Ho et al. |
| 6,026,223 A | 2/2000 | Scepanovic et al. |
| 6,037,613 A | 3/2000 | Mariyama |
| 6,037,617 A | 3/2000 | Kumagai |
| 6,044,007 A | 3/2000 | Capodieci |
| 6,054,872 A | 4/2000 | Fudanuki et al. |
| 6,063,132 A | 5/2000 | DeCamp et al. |
| 6,077,310 A | 6/2000 | Yamamoto et al. |
| 6,080,206 A | 6/2000 | Tadokoro et al. |
| 6,084,255 A | 7/2000 | Ueda |
| 6,084,437 A | 7/2000 | Sako |
| 6,091,845 A | 7/2000 | Pierrat et al. |
| 6,099,584 A | 8/2000 | Arnold et al. |
| 6,100,025 A | 8/2000 | Wigler et al. |
| 6,114,071 A | 9/2000 | Chen et al. |
| 6,144,227 A | 11/2000 | Sato |
| 6,159,839 A | 12/2000 | Jeng et al. |
| 6,166,415 A | 12/2000 | Sakemi et al. |
| 6,166,560 A | 12/2000 | Ogura et al. |
| 6,174,742 B1 | 1/2001 | Sudhindranath et al. |
| 6,182,272 B1 | 1/2001 | Andreev et al. |
| 6,194,104 B1 | 2/2001 | Hsu |
| 6,194,252 B1 | 2/2001 | Yamaguchi |
| 6,194,912 B1 | 2/2001 | Or-Bach |
| 6,209,123 B1 | 3/2001 | Maziasz et al. |
| 6,230,299 B1 | 5/2001 | McSherry et al. |
| 6,232,173 B1 | 5/2001 | Hsu et al. |
| 6,240,542 B1 | 5/2001 | Kapur |
| 6,249,902 B1 | 6/2001 | Igusa et al. |
| 6,255,600 B1 | 7/2001 | Schaper |
| 6,255,845 B1 | 7/2001 | Wong et al. |
| 6,262,487 B1 | 7/2001 | Igarashi et al. |

(56) References Cited

U.S. PATENT DOCUMENTS

| | | | |
|---|---|---|---|
| 6,269,472 | B1 | 7/2001 | Garza et al. |
| 6,275,973 | B1 | 8/2001 | Wein |
| 6,282,696 | B1 | 8/2001 | Garza et al. |
| 6,291,276 | B1 | 9/2001 | Gonzalez |
| 6,297,668 | B1 | 10/2001 | Schober |
| 6,297,674 | B1 | 10/2001 | Kono et al. |
| 6,303,252 | B1 | 10/2001 | Lin |
| 6,331,733 | B1 | 12/2001 | Or-Bach et al. |
| 6,331,791 | B1 | 12/2001 | Huang |
| 6,335,250 | B1 | 1/2002 | Egi |
| 6,338,972 | B1 | 1/2002 | Sudhindranath et al. |
| 6,347,062 | B2 | 2/2002 | Nii et al. |
| 6,356,112 | B1 | 3/2002 | Tran et al. |
| 6,359,804 | B2 | 3/2002 | Kuriyama et al. |
| 6,370,679 | B1 | 4/2002 | Chang et al. |
| 6,378,110 | B1 | 4/2002 | Ho |
| 6,380,592 | B2 | 4/2002 | Tooher et al. |
| 6,388,296 | B1 | 5/2002 | Hsu |
| 6,393,601 | B1 | 5/2002 | Tanaka et al. |
| 6,399,972 | B1 | 6/2002 | Masuda et al. |
| 6,400,183 | B2 | 6/2002 | Yamashita et al. |
| 6,408,427 | B1 | 6/2002 | Cong et al. |
| 6,415,421 | B2 | 7/2002 | Anderson et al. |
| 6,416,907 | B1 | 7/2002 | Winder et al. |
| 6,417,549 | B1 | 7/2002 | Oh |
| 6,421,820 | B1 | 7/2002 | Mansfield et al. |
| 6,425,112 | B1 | 7/2002 | Bula et al. |
| 6,425,117 | B1 | 7/2002 | Pasch et al. |
| 6,426,269 | B1 | 7/2002 | Haffner et al. |
| 6,436,805 | B1 | 8/2002 | Trivedi |
| 6,445,049 | B1 | 9/2002 | Iranmanesh |
| 6,445,065 | B1 | 9/2002 | Gheewala et al. |
| 6,467,072 | B1 | 10/2002 | Yang et al. |
| 6,469,328 | B2 | 10/2002 | Yanai et al. |
| 6,470,489 | B1 | 10/2002 | Chang et al. |
| 6,476,493 | B2 | 11/2002 | Or-Bach et al. |
| 6,477,695 | B1 | 11/2002 | Gandhi |
| 6,480,032 | B1 | 11/2002 | Aksamit |
| 6,480,989 | B2 | 11/2002 | Chan et al. |
| 6,492,066 | B1 | 12/2002 | Capodieci et al. |
| 6,496,965 | B1 | 12/2002 | van Ginneken et al. |
| 6,504,186 | B2 | 1/2003 | Kanamoto et al. |
| 6,505,327 | B2 | 1/2003 | Lin |
| 6,505,328 | B1 | 1/2003 | van Ginneken et al. |
| 6,507,941 | B1 | 1/2003 | Leung et al. |
| 6,509,952 | B1 | 1/2003 | Govil et al. |
| 6,514,849 | B1 | 2/2003 | Hui et al. |
| 6,516,459 | B1 | 2/2003 | Sahouria |
| 6,523,156 | B2 | 2/2003 | Cirit |
| 6,525,350 | B1 | 2/2003 | Kinoshita et al. |
| 6,536,028 | B1 | 3/2003 | Katsioulas et al. |
| 6,543,039 | B1 | 4/2003 | Watanabe |
| 6,553,544 | B2 | 4/2003 | Tanaka et al. |
| 6,553,559 | B2 | 4/2003 | Liebmann et al. |
| 6,553,562 | B2 | 4/2003 | Capodieci et al. |
| 6,566,720 | B2 | 5/2003 | Aldrich |
| 6,570,234 | B1 | 5/2003 | Gardner |
| 6,571,140 | B1 | 5/2003 | Wewalaarachchi |
| 6,571,379 | B2 | 5/2003 | Takayama |
| 6,574,786 | B1 | 6/2003 | Pohlenz et al. |
| 6,578,190 | B2 | 6/2003 | Ferguson et al. |
| 6,583,041 | B1 | 6/2003 | Capodieci |
| 6,588,005 | B1 | 7/2003 | Kobayashi et al. |
| 6,590,289 | B2 | 7/2003 | Shively |
| 6,591,207 | B2 | 7/2003 | Naya et al. |
| 6,609,235 | B2 | 8/2003 | Ramaswamy et al. |
| 6,610,607 | B1 | 8/2003 | Armbrust et al. |
| 6,617,621 | B1 | 9/2003 | Gheewala et al. |
| 6,620,561 | B2 | 9/2003 | Winder et al. |
| 6,621,132 | B2 | 9/2003 | Onishi et al. |
| 6,632,741 | B1 | 10/2003 | Clevenger et al. |
| 6,633,182 | B2 | 10/2003 | Pileggi et al. |
| 6,635,935 | B2 | 10/2003 | Makino |
| 6,642,744 | B2 | 11/2003 | Or-Bach et al. |
| 6,643,831 | B2 | 11/2003 | Chang et al. |
| 6,650,014 | B2 | 11/2003 | Kariyazaki |
| 6,661,041 | B2 | 12/2003 | Keeth |
| 6,662,350 | B2 | 12/2003 | Fried et al. |
| 6,664,587 | B2 | 12/2003 | Guterman et al. |
| 6,673,638 | B1 | 1/2004 | Bendik et al. |
| 6,677,649 | B2 | 1/2004 | Minami et al. |
| 6,687,895 | B2 | 2/2004 | Zhang |
| 6,690,206 | B2 | 2/2004 | Rikino et al. |
| 6,691,297 | B1 | 2/2004 | Misaka et al. |
| 6,700,405 | B1 | 3/2004 | Hirairi |
| 6,703,170 | B1 | 3/2004 | Pindo |
| 6,709,880 | B2 | 3/2004 | Yamamoto et al. |
| 6,714,903 | B1 | 3/2004 | Chu et al. |
| 6,732,334 | B2 | 5/2004 | Nakatsuka |
| 6,732,338 | B2 | 5/2004 | Crouse et al. |
| 6,732,344 | B2 | 5/2004 | Sakamoto et al. |
| 6,734,506 | B2 | 5/2004 | Oyamatsu |
| 6,737,199 | B1 | 5/2004 | Hsieh |
| 6,737,318 | B2 | 5/2004 | Murata et al. |
| 6,737,347 | B1 | 5/2004 | Houston et al. |
| 6,745,372 | B2 | 6/2004 | Cote et al. |
| 6,745,380 | B2 | 6/2004 | Bodendorf et al. |
| 6,749,972 | B2 | 6/2004 | Yu |
| 6,750,555 | B2 | 6/2004 | Satomi et al. |
| 6,760,269 | B2 | 7/2004 | Nakase et al. |
| 6,765,245 | B2 | 7/2004 | Bansal |
| 6,777,138 | B2 | 8/2004 | Pierrat et al. |
| 6,777,146 | B1 | 8/2004 | Samuels |
| 6,787,823 | B2 | 9/2004 | Shibutani |
| 6,789,244 | B1 | 9/2004 | Dasasathyan et al. |
| 6,789,246 | B1 | 9/2004 | Mohan et al. |
| 6,792,591 | B2 | 9/2004 | Shi et al. |
| 6,792,593 | B2 | 9/2004 | Takashima et al. |
| 6,794,677 | B2 | 9/2004 | Tamaki et al. |
| 6,794,914 | B2 | 9/2004 | Sani et al. |
| 6,795,332 | B2 | 9/2004 | Yamaoka et al. |
| 6,795,358 | B2 | 9/2004 | Tanaka et al. |
| 6,795,952 | B1 | 9/2004 | Stine et al. |
| 6,795,953 | B2 | 9/2004 | Bakarian et al. |
| 6,800,883 | B2 | 10/2004 | Furuya et al. |
| 6,806,180 | B2 | 10/2004 | Cho |
| 6,807,663 | B2 | 10/2004 | Cote et al. |
| 6,809,399 | B2 | 10/2004 | Ikeda et al. |
| 6,812,574 | B2 | 11/2004 | Tomita et al. |
| 6,818,389 | B2 | 11/2004 | Fritze et al. |
| 6,818,929 | B2 | 11/2004 | Tsutsumi et al. |
| 6,819,136 | B2 | 11/2004 | Or-Bach |
| 6,820,248 | B1 | 11/2004 | Gan |
| 6,826,738 | B2 | 11/2004 | Cadouri |
| 6,834,375 | B1 | 12/2004 | Stine et al. |
| 6,841,880 | B2 | 1/2005 | Matsumoto et al. |
| 6,850,854 | B2 | 2/2005 | Naya et al. |
| 6,854,096 | B2 | 2/2005 | Eaton et al. |
| 6,854,100 | B1 | 2/2005 | Chuang et al. |
| 6,867,073 | B1 | 3/2005 | Enquist |
| 6,871,338 | B2 | 3/2005 | Yamauchi |
| 6,872,990 | B1 | 3/2005 | Kang |
| 6,877,144 | B1 | 4/2005 | Rittman et al. |
| 6,881,523 | B2 | 4/2005 | Smith |
| 6,884,712 | B2 | 4/2005 | Yelehanka et al. |
| 6,885,045 | B2 | 4/2005 | Hidaka |
| 6,889,370 | B1 | 5/2005 | Kerzman et al. |
| 6,897,517 | B2 | 5/2005 | Houdt et al. |
| 6,897,536 | B2 | 5/2005 | Nomura et al. |
| 6,898,770 | B2 | 5/2005 | Boluki et al. |
| 6,904,582 | B1 | 6/2005 | Rittman et al. |
| 6,918,104 | B2 | 7/2005 | Pierrat et al. |
| 6,920,079 | B2 | 7/2005 | Shibayama |
| 6,921,982 | B2 | 7/2005 | Joshi et al. |
| 6,922,354 | B2 | 7/2005 | Ishikura et al. |
| 6,924,560 | B2 | 8/2005 | Wang et al. |
| 6,928,635 | B2 | 8/2005 | Pramanik et al. |
| 6,931,617 | B2 | 8/2005 | Sanie et al. |
| 6,953,956 | B2 | 10/2005 | Or-Bach et al. |
| 6,954,918 | B2 | 10/2005 | Houston |
| 6,957,402 | B2 | 10/2005 | Templeton et al. |
| 6,968,527 | B2 | 11/2005 | Pierrat |
| 6,974,978 | B1 | 12/2005 | Possley |
| 6,977,856 | B2 | 12/2005 | Tanaka et al. |

(56) References Cited

U.S. PATENT DOCUMENTS

| | | |
|---|---|---|
| 6,978,436 B2 | 12/2005 | Cote et al. |
| 6,978,437 B1 | 12/2005 | Rittman et al. |
| 6,980,211 B2 | 12/2005 | Lin et al. |
| 6,992,394 B2 | 1/2006 | Park |
| 6,992,925 B2 | 1/2006 | Peng |
| 6,993,741 B2 | 1/2006 | Liebmann et al. |
| 6,994,939 B1 | 2/2006 | Ghandehari et al. |
| 6,998,722 B2 | 2/2006 | Madurawe |
| 7,003,068 B2 | 2/2006 | Kushner et al. |
| 7,009,862 B2 | 3/2006 | Higeta et al. |
| 7,016,214 B2 | 3/2006 | Kawamata |
| 7,022,559 B2 | 4/2006 | Barnak et al. |
| 7,028,285 B2 | 4/2006 | Cote et al. |
| 7,041,568 B2 | 5/2006 | Goldbach et al. |
| 7,052,972 B2 | 5/2006 | Sandhu et al. |
| 7,053,424 B2 | 5/2006 | Ono |
| 7,063,920 B2 | 6/2006 | Baba-Ali |
| 7,064,068 B2 | 6/2006 | Chou et al. |
| 7,065,731 B2 | 6/2006 | Jacques et al. |
| 7,079,413 B2 | 7/2006 | Tsukamoto et al. |
| 7,079,989 B2 | 7/2006 | Wimer |
| 7,093,208 B2 | 8/2006 | Williams et al. |
| 7,093,228 B2 | 8/2006 | Andreev et al. |
| 7,103,870 B2 | 9/2006 | Misaka et al. |
| 7,105,871 B2 | 9/2006 | Or-Bach et al. |
| 7,107,551 B1 | 9/2006 | de Dood et al. |
| 7,115,343 B2 | 10/2006 | Gordon et al. |
| 7,115,920 B2 | 10/2006 | Bernstein et al. |
| 7,120,882 B2 | 10/2006 | Kotani et al. |
| 7,124,386 B2 | 10/2006 | Smith et al. |
| 7,126,837 B1 | 10/2006 | Banachowicz et al. |
| 7,132,203 B2 | 11/2006 | Pierrat |
| 7,137,092 B2 | 11/2006 | Maeda |
| 7,141,853 B2 | 11/2006 | Campbell et al. |
| 7,143,380 B1 | 11/2006 | Anderson et al. |
| 7,149,999 B2 | 12/2006 | Kahng et al. |
| 7,152,215 B2 | 12/2006 | Smith et al. |
| 7,155,685 B2 | 12/2006 | Mori et al. |
| 7,155,689 B2 | 12/2006 | Pierrat et al. |
| 7,159,197 B2 | 1/2007 | Falbo et al. |
| 7,174,520 B2 | 2/2007 | White et al. |
| 7,175,940 B2 | 2/2007 | Laidig et al. |
| 7,176,508 B2 | 2/2007 | Joshi et al. |
| 7,177,215 B2 | 2/2007 | Tanaka et al. |
| 7,183,611 B2 | 2/2007 | Bhattacharyya |
| 7,185,294 B2 | 2/2007 | Zhang |
| 7,188,322 B2 | 3/2007 | Cohn et al. |
| 7,194,712 B2 | 3/2007 | Wu |
| 7,200,835 B2 | 4/2007 | Zhang et al. |
| 7,202,517 B2 | 4/2007 | Dixit et al. |
| 7,205,191 B2 | 4/2007 | Kobayashi |
| 7,208,794 B2 | 4/2007 | Hofmann et al. |
| 7,214,579 B2 | 5/2007 | Widdershoven et al. |
| 7,219,326 B2 | 5/2007 | Reed et al. |
| 7,221,031 B2 | 5/2007 | Ryoo et al. |
| 7,225,423 B2 | 5/2007 | Bhattacharya et al. |
| 7,227,183 B2 | 6/2007 | Donze et al. |
| 7,228,510 B2 | 6/2007 | Ono |
| 7,231,628 B2 | 6/2007 | Pack et al. |
| 7,235,424 B2 | 6/2007 | Chen et al. |
| 7,243,316 B2 | 7/2007 | White et al. |
| 7,252,909 B2 | 8/2007 | Shin et al. |
| 7,257,017 B2 | 8/2007 | Liaw |
| 7,264,990 B2 | 9/2007 | Rueckes et al. |
| 7,266,787 B2 | 9/2007 | Hughes et al. |
| 7,269,803 B2 | 9/2007 | Khakzadi et al. |
| 7,278,118 B2 | 10/2007 | Pileggi et al. |
| 7,279,727 B2 | 10/2007 | Ikoma et al. |
| 7,287,320 B2 | 10/2007 | Wang et al. |
| 7,294,534 B2 | 11/2007 | Iwaki |
| 7,302,651 B2 | 11/2007 | Allen et al. |
| 7,308,669 B2 | 12/2007 | Buehler et al. |
| 7,312,003 B2 | 12/2007 | Cote et al. |
| 7,315,994 B2 | 1/2008 | Aller et al. |
| 7,327,591 B2 | 2/2008 | Sadra et al. |
| 7,329,938 B2 | 2/2008 | Kinoshita |
| 7,335,966 B2 | 2/2008 | Ihme et al. |
| 7,337,421 B2 | 2/2008 | Kamat |
| 7,338,896 B2 | 3/2008 | Vanhaelemeersch et al. |
| 7,345,909 B2 | 3/2008 | Chang et al. |
| 7,346,885 B2 | 3/2008 | Semmler |
| 7,350,183 B2 | 3/2008 | Cui et al. |
| 7,353,492 B2 | 4/2008 | Gupta et al. |
| 7,358,131 B2 | 4/2008 | Bhattacharyya |
| 7,360,179 B2 | 4/2008 | Smith et al. |
| 7,360,198 B2 | 4/2008 | Rana et al. |
| 7,366,997 B1 | 4/2008 | Rahmat et al. |
| 7,367,008 B2 | 4/2008 | White et al. |
| 7,376,931 B2 | 5/2008 | Kokubun |
| 7,383,521 B2 | 6/2008 | Smith et al. |
| 7,397,260 B2 | 7/2008 | Chanda et al. |
| 7,400,627 B2 | 7/2008 | Wu et al. |
| 7,402,848 B2 | 7/2008 | Chang et al. |
| 7,404,154 B1 | 7/2008 | Venkatraman et al. |
| 7,404,173 B2 | 7/2008 | Wu et al. |
| 7,411,252 B2 | 8/2008 | Anderson et al. |
| 7,421,678 B2 | 9/2008 | Barnes et al. |
| 7,423,298 B2 | 9/2008 | Mariyama et al. |
| 7,424,694 B2 | 9/2008 | Ikeda |
| 7,424,695 B2 | 9/2008 | Tamura et al. |
| 7,424,696 B2 | 9/2008 | Vogel et al. |
| 7,426,710 B2 | 9/2008 | Zhang et al. |
| 7,432,562 B2 | 10/2008 | Bhattacharyya |
| 7,434,185 B2 | 10/2008 | Dooling et al. |
| 7,441,211 B1 | 10/2008 | Gupta et al. |
| 7,442,630 B2 | 10/2008 | Kelberlau et al. |
| 7,444,609 B2 | 10/2008 | Charlebois et al. |
| 7,446,352 B2 | 11/2008 | Becker et al. |
| 7,449,371 B2 | 11/2008 | Kemerling et al. |
| 7,458,045 B2 | 11/2008 | Cote et al. |
| 7,459,792 B2 | 12/2008 | Chen |
| 7,465,973 B2 | 12/2008 | Chang et al. |
| 7,466,607 B2 | 12/2008 | Hollis et al. |
| 7,469,396 B2 | 12/2008 | Hayashi et al. |
| 7,480,880 B2 | 1/2009 | Visweswariah et al. |
| 7,480,891 B2 | 1/2009 | Sezginer |
| 7,484,197 B2 | 1/2009 | Allen et al. |
| 7,485,934 B2 | 2/2009 | Liaw |
| 7,487,475 B1 | 2/2009 | Kriplani et al. |
| 7,492,013 B2 | 2/2009 | Correale, Jr. |
| 7,500,211 B2 | 3/2009 | Komaki |
| 7,502,275 B2 | 3/2009 | Nii et al. |
| 7,503,026 B2 | 3/2009 | Ichiryu et al. |
| 7,504,184 B2 | 3/2009 | Hung et al. |
| 7,506,300 B2 | 3/2009 | Sezginer et al. |
| 7,508,238 B2 | 3/2009 | Yamagami |
| 7,509,621 B2 | 3/2009 | Melvin, III |
| 7,509,622 B2 | 3/2009 | Sinha et al. |
| 7,512,017 B2 | 3/2009 | Chang |
| 7,512,921 B2 | 3/2009 | Shibuya |
| 7,514,355 B2 | 4/2009 | Katase |
| 7,514,959 B2 | 4/2009 | Or-Bach et al. |
| 7,523,429 B2 | 4/2009 | Kroyan et al. |
| 7,527,900 B2 | 5/2009 | Zhou et al. |
| 7,538,368 B2 | 5/2009 | Yano |
| 7,543,262 B2 | 6/2009 | Wang et al. |
| 7,563,701 B2 | 7/2009 | Chang et al. |
| 7,564,134 B2 | 7/2009 | Lee et al. |
| 7,568,174 B2 | 7/2009 | Sezginer et al. |
| 7,569,309 B2 | 8/2009 | Blatchford et al. |
| 7,569,310 B2 | 8/2009 | Wallace et al. |
| 7,569,894 B2 | 8/2009 | Suzuki |
| 7,575,973 B2 | 8/2009 | Mokhlesi et al. |
| 7,598,541 B2 | 10/2009 | Okamoto et al. |
| 7,598,558 B2 | 10/2009 | Hashimoto et al. |
| 7,614,030 B2 | 11/2009 | Hsu |
| 7,625,790 B2 | 12/2009 | Yang |
| 7,632,610 B2 | 12/2009 | Wallace et al. |
| 7,640,522 B2 | 12/2009 | Gupta et al. |
| 7,646,651 B2 | 1/2010 | Lee et al. |
| 7,653,884 B2 | 1/2010 | Furnish et al. |
| 7,665,051 B2 | 2/2010 | Ludwig et al. |
| 7,700,466 B2 | 4/2010 | Booth et al. |
| 7,712,056 B2 | 5/2010 | White et al. |

(56) References Cited

U.S. PATENT DOCUMENTS

| | | |
|---|---|---|
| 7,739,627 B2 | 6/2010 | Chew et al. |
| 7,749,662 B2 | 7/2010 | Matthew et al. |
| 7,755,110 B2 | 7/2010 | Gliese et al. |
| 7,770,144 B2 | 8/2010 | Dellinger |
| 7,791,109 B2 | 9/2010 | Wann et al. |
| 7,802,219 B2 | 9/2010 | Tomar et al. |
| 7,825,437 B2 | 11/2010 | Pillarisetty et al. |
| 7,842,975 B2 | 11/2010 | Becker et al. |
| 7,873,929 B2 | 1/2011 | Kahng et al. |
| 7,882,456 B2 | 2/2011 | Zach |
| 7,888,705 B2 | 2/2011 | Becker et al. |
| 7,898,040 B2 | 3/2011 | Nawaz |
| 7,906,801 B2 | 3/2011 | Becker et al. |
| 7,908,578 B2 | 3/2011 | Becker et al. |
| 7,910,958 B2 | 3/2011 | Becker et al. |
| 7,910,959 B2 | 3/2011 | Becker et al. |
| 7,917,877 B2 | 3/2011 | Singh et al. |
| 7,917,879 B2 | 3/2011 | Becker et al. |
| 7,923,266 B2 | 4/2011 | Thijs et al. |
| 7,923,337 B2 | 4/2011 | Chang et al. |
| 7,923,757 B2 | 4/2011 | Becker et al. |
| 7,926,001 B2 | 4/2011 | Pierrat |
| 7,932,544 B2 | 4/2011 | Becker et al. |
| 7,932,545 B2 | 4/2011 | Becker et al. |
| 7,934,184 B2 | 4/2011 | Zhang |
| 7,939,443 B2 | 5/2011 | Fox et al. |
| 7,943,966 B2 | 5/2011 | Becker et al. |
| 7,943,967 B2 | 5/2011 | Becker et al. |
| 7,948,012 B2 | 5/2011 | Becker et al. |
| 7,948,013 B2 | 5/2011 | Becker et al. |
| 7,952,119 B2 | 5/2011 | Becker et al. |
| 7,956,421 B2 | 6/2011 | Becker |
| 7,958,465 B2 | 6/2011 | Lu et al. |
| 7,962,867 B2 | 6/2011 | White et al. |
| 7,962,879 B2 | 6/2011 | Tang et al. |
| 7,964,267 B1 | 6/2011 | Lyons et al. |
| 7,971,160 B2 | 6/2011 | Osawa et al. |
| 7,989,847 B2 | 8/2011 | Becker et al. |
| 7,989,848 B2 | 8/2011 | Becker et al. |
| 7,992,122 B1 | 8/2011 | Burstein et al. |
| 7,994,583 B2 | 8/2011 | Inaba |
| 8,004,042 B2 | 8/2011 | Yang et al. |
| 8,022,441 B2 | 9/2011 | Becker et al. |
| 8,030,689 B2 | 10/2011 | Becker et al. |
| 8,035,133 B2 | 10/2011 | Becker et al. |
| 8,044,437 B1 | 10/2011 | Venkatraman et al. |
| 8,058,671 B2 | 11/2011 | Becker et al. |
| 8,058,690 B2 | 11/2011 | Chang |
| 8,072,003 B2 | 12/2011 | Becker et al. |
| 8,072,053 B2 | 12/2011 | Li |
| 8,088,679 B2 | 1/2012 | Becker et al. |
| 8,088,680 B2 | 1/2012 | Becker et al. |
| 8,088,681 B2 | 1/2012 | Becker et al. |
| 8,088,682 B2 | 1/2012 | Becker et al. |
| 8,089,098 B2 | 1/2012 | Becker et al. |
| 8,089,099 B2 | 1/2012 | Becker et al. |
| 8,089,100 B2 | 1/2012 | Becker et al. |
| 8,089,101 B2 | 1/2012 | Becker et al. |
| 8,089,102 B2 | 1/2012 | Becker et al. |
| 8,089,103 B2 | 1/2012 | Becker et al. |
| 8,089,104 B2 | 1/2012 | Becker et al. |
| 8,101,975 B2 | 1/2012 | Becker et al. |
| 8,110,854 B2 | 2/2012 | Becker et al. |
| 8,129,750 B2 | 3/2012 | Becker et al. |
| 8,129,751 B2 | 3/2012 | Becker et al. |
| 8,129,752 B2 | 3/2012 | Becker et al. |
| 8,129,754 B2 | 3/2012 | Becker et al. |
| 8,129,755 B2 | 3/2012 | Becker et al. |
| 8,129,756 B2 | 3/2012 | Becker et al. |
| 8,129,757 B2 | 3/2012 | Becker et al. |
| 8,129,819 B2 | 3/2012 | Becker et al. |
| 8,130,529 B2 | 3/2012 | Tanaka |
| 8,134,183 B2 | 3/2012 | Becker et al. |
| 8,134,184 B2 | 3/2012 | Becker et al. |
| 8,134,185 B2 | 3/2012 | Becker et al. |
| 8,134,186 B2 | 3/2012 | Becker et al. |
| 8,138,525 B2 | 3/2012 | Becker et al. |
| 8,161,427 B2 | 4/2012 | Morgenshtein et al. |
| 8,178,905 B2 | 5/2012 | Toubou |
| 8,178,909 B2 | 5/2012 | Venkatraman et al. |
| 8,198,656 B2 | 6/2012 | Becker et al. |
| 8,207,053 B2 | 6/2012 | Becker et al. |
| 8,214,778 B2 | 7/2012 | Quandt et al. |
| 8,217,428 B2 | 7/2012 | Becker et al. |
| 8,225,239 B2 | 7/2012 | Reed et al. |
| 8,225,261 B2 | 7/2012 | Hong et al. |
| 8,245,180 B2 | 8/2012 | Smayling et al. |
| 8,247,846 B2 | 8/2012 | Becker |
| 8,253,172 B2 | 8/2012 | Becker et al. |
| 8,253,173 B2 | 8/2012 | Becker et al. |
| 8,258,547 B2 | 9/2012 | Becker et al. |
| 8,258,548 B2 | 9/2012 | Becker et al. |
| 8,258,549 B2 | 9/2012 | Becker et al. |
| 8,258,550 B2 | 9/2012 | Becker et al. |
| 8,258,551 B2 | 9/2012 | Becker et al. |
| 8,258,552 B2 | 9/2012 | Becker et al. |
| 8,258,581 B2 | 9/2012 | Becker et al. |
| 8,264,007 B2 | 9/2012 | Becker et al. |
| 8,264,008 B2 | 9/2012 | Becker et al. |
| 8,264,009 B2 | 9/2012 | Becker et al. |
| 8,283,701 B2 | 10/2012 | Becker et al. |
| 8,294,212 B2 | 10/2012 | Wang et al. |
| 8,316,327 B2 | 11/2012 | Herold |
| 8,356,268 B2 | 1/2013 | Becker et al. |
| 8,378,407 B2 | 2/2013 | Audzeyeu et al. |
| 8,395,224 B2 | 3/2013 | Becker et al. |
| 8,402,397 B2 | 3/2013 | Robles et al. |
| 8,405,163 B2 | 3/2013 | Becker et al. |
| 8,422,274 B2 | 4/2013 | Tomita et al. |
| 8,436,400 B2 | 5/2013 | Becker et al. |
| 8,453,094 B2 | 5/2013 | Kornachuk et al. |
| 8,575,706 B2 | 11/2013 | Becker et al. |
| 8,667,443 B2 | 3/2014 | Smayling et al. |
| 8,701,071 B2 | 4/2014 | Kornachuk et al. |
| 8,735,995 B2 | 5/2014 | Becker et al. |
| 8,756,551 B2 | 6/2014 | Becker et al. |
| 8,836,045 B2 | 9/2014 | Becker et al. |
| 8,839,162 B2 | 9/2014 | Amundson et al. |
| 8,839,175 B2 | 9/2014 | Smayling et al. |
| 8,847,329 B2 | 9/2014 | Becker et al. |
| 8,863,063 B2 | 10/2014 | Becker et al. |
| 9,202,779 B2 | 12/2015 | Kornachuk et al. |
| 2001/0049813 A1 | 12/2001 | Chan et al. |
| 2002/0003270 A1 | 1/2002 | Makino |
| 2002/0015899 A1 | 2/2002 | Chen et al. |
| 2002/0030510 A1 | 3/2002 | Kono et al. |
| 2002/0063582 A1 | 5/2002 | Rikino |
| 2002/0068423 A1 | 6/2002 | Park et al. |
| 2002/0079927 A1 | 6/2002 | Katoh et al. |
| 2002/0149392 A1 | 10/2002 | Cho |
| 2002/0166107 A1 | 11/2002 | Capodieci et al. |
| 2002/0194575 A1 | 12/2002 | Allen et al. |
| 2003/0042930 A1 | 3/2003 | Pileggi et al. |
| 2003/0046653 A1 | 3/2003 | Liu |
| 2003/0061592 A1 | 3/2003 | Agrawal et al. |
| 2003/0088839 A1 | 5/2003 | Watanabe |
| 2003/0088842 A1 | 5/2003 | Cirit |
| 2003/0103176 A1 | 6/2003 | Abe et al. |
| 2003/0106037 A1 | 6/2003 | Moniwa et al. |
| 2003/0117168 A1 | 6/2003 | Uneme et al. |
| 2003/0124847 A1 | 7/2003 | Houston et al. |
| 2003/0125917 A1 | 7/2003 | Rich et al. |
| 2003/0126569 A1 | 7/2003 | Rich et al. |
| 2003/0145288 A1 | 7/2003 | Wang et al. |
| 2003/0145299 A1 | 7/2003 | Fried et al. |
| 2003/0177465 A1 | 9/2003 | MacLean et al. |
| 2003/0185076 A1 | 10/2003 | Worley |
| 2003/0203287 A1 | 10/2003 | Miyagawa |
| 2003/0229868 A1 | 12/2003 | White et al. |
| 2003/0229875 A1 | 12/2003 | Smith et al. |
| 2004/0029372 A1 | 2/2004 | Jang et al. |
| 2004/0049754 A1 | 3/2004 | Liao et al. |
| 2004/0063038 A1 | 4/2004 | Shin et al. |
| 2004/0115539 A1 | 6/2004 | Broeke et al. |

(56) References Cited

U.S. PATENT DOCUMENTS

| | | |
|---|---|---|
| 2004/0139412 A1 | 7/2004 | Ito et al. |
| 2004/0145028 A1 | 7/2004 | Matsumoto et al. |
| 2004/0153979 A1 | 8/2004 | Chang |
| 2004/0161878 A1 | 8/2004 | Or-Bach et al. |
| 2004/0164360 A1 | 8/2004 | Nishida et al. |
| 2004/0169201 A1 | 9/2004 | Hidaka |
| 2004/0194050 A1 | 9/2004 | Hwang et al. |
| 2004/0196705 A1 | 10/2004 | Ishikura et al. |
| 2004/0229135 A1 | 11/2004 | Wang et al. |
| 2004/0232444 A1 | 11/2004 | Shimizu |
| 2004/0243966 A1 | 12/2004 | Dellinger |
| 2004/0262640 A1 | 12/2004 | Suga |
| 2005/0009312 A1 | 1/2005 | Butt et al. |
| 2005/0009344 A1 | 1/2005 | Hwang et al. |
| 2005/0012157 A1 | 1/2005 | Cho et al. |
| 2005/0044522 A1 | 2/2005 | Maeda |
| 2005/0055828 A1 | 3/2005 | Wang et al. |
| 2005/0076320 A1 | 4/2005 | Maeda |
| 2005/0087806 A1 | 4/2005 | Hokazono |
| 2005/0093147 A1 | 5/2005 | Tu |
| 2005/0101112 A1 | 5/2005 | Rueckes et al. |
| 2005/0110130 A1 | 5/2005 | Kitabayashi et al. |
| 2005/0135134 A1 | 6/2005 | Yen |
| 2005/0136340 A1 | 6/2005 | Baselmans et al. |
| 2005/0138598 A1 | 6/2005 | Kokubun |
| 2005/0156200 A1 | 7/2005 | Kinoshita |
| 2005/0185325 A1 | 8/2005 | Hur |
| 2005/0189604 A1 | 9/2005 | Gupta et al. |
| 2005/0189614 A1 | 9/2005 | Ihme et al. |
| 2005/0196685 A1 | 9/2005 | Wang et al. |
| 2005/0205894 A1 | 9/2005 | Sumikawa et al. |
| 2005/0212018 A1 | 9/2005 | Schoellkopf et al. |
| 2005/0224982 A1 | 10/2005 | Kemerling et al. |
| 2005/0229130 A1 | 10/2005 | Wu et al. |
| 2005/0251771 A1 | 11/2005 | Robles |
| 2005/0264320 A1 | 12/2005 | Chan et al. |
| 2005/0264324 A1 | 12/2005 | Nakazato |
| 2005/0266621 A1 | 12/2005 | Kim |
| 2005/0268256 A1 | 12/2005 | Tsai et al. |
| 2005/0278673 A1 | 12/2005 | Kawachi |
| 2005/0280031 A1 | 12/2005 | Yano |
| 2006/0038234 A1 | 2/2006 | Liaw |
| 2006/0063334 A1 | 3/2006 | Donze et al. |
| 2006/0070018 A1 | 3/2006 | Semmler |
| 2006/0084261 A1 | 4/2006 | Iwaki |
| 2006/0091550 A1 | 5/2006 | Shimazaki et al. |
| 2006/0095872 A1 | 5/2006 | McElvain |
| 2006/0101370 A1 | 5/2006 | Cui et al. |
| 2006/0112355 A1 | 5/2006 | Pileggi et al. |
| 2006/0113533 A1 | 6/2006 | Tamaki et al. |
| 2006/0113567 A1 | 6/2006 | Ohmori et al. |
| 2006/0120143 A1 | 6/2006 | Liaw |
| 2006/0121715 A1 | 6/2006 | Chang et al. |
| 2006/0123376 A1 | 6/2006 | Vogel et al. |
| 2006/0125024 A1 | 6/2006 | Ishigaki |
| 2006/0131609 A1 | 6/2006 | Kinoshita et al. |
| 2006/0136848 A1 | 6/2006 | Ichiryu et al. |
| 2006/0146638 A1 | 7/2006 | Chang et al. |
| 2006/0151810 A1 | 7/2006 | Ohshige |
| 2006/0158270 A1 | 7/2006 | Gibet et al. |
| 2006/0177744 A1 | 8/2006 | Bodendorf et al. |
| 2006/0181310 A1 | 8/2006 | Rhee |
| 2006/0195809 A1 | 8/2006 | Cohn et al. |
| 2006/0195810 A1 | 8/2006 | Morton |
| 2006/0197557 A1 | 9/2006 | Chung |
| 2006/0206854 A1 | 9/2006 | Barnes et al. |
| 2006/0223302 A1 | 10/2006 | Chang et al. |
| 2006/0248495 A1 | 11/2006 | Sezginer |
| 2006/0261417 A1 | 11/2006 | Suzuki |
| 2006/0277521 A1 | 12/2006 | Chen |
| 2007/0001304 A1 | 1/2007 | Liaw |
| 2007/0002617 A1 | 1/2007 | Houston |
| 2007/0004147 A1 | 1/2007 | Toubou |
| 2007/0007574 A1 | 1/2007 | Ohsawa |
| 2007/0038973 A1 | 2/2007 | Li et al. |
| 2007/0074145 A1 | 3/2007 | Tanaka |
| 2007/0094634 A1 | 4/2007 | Seizginer et al. |
| 2007/0101305 A1 | 5/2007 | Smith et al. |
| 2007/0105023 A1 | 5/2007 | Zhou et al. |
| 2007/0106971 A1 | 5/2007 | Lien et al. |
| 2007/0113216 A1 | 5/2007 | Zhang |
| 2007/0172770 A1 | 7/2007 | Witters et al. |
| 2007/0186196 A1 | 8/2007 | Tanaka |
| 2007/0196958 A1 | 8/2007 | Bhattacharya et al. |
| 2007/0209029 A1 | 9/2007 | Ivonin et al. |
| 2007/0210391 A1 | 9/2007 | Becker et al. |
| 2007/0234252 A1 | 10/2007 | Visweswariah et al. |
| 2007/0234262 A1 | 10/2007 | Uedi et al. |
| 2007/0241810 A1 | 10/2007 | Onda |
| 2007/0256039 A1 | 11/2007 | White |
| 2007/0257277 A1 | 11/2007 | Takeda et al. |
| 2007/0264758 A1 | 11/2007 | Correale |
| 2007/0274140 A1 | 11/2007 | Joshi et al. |
| 2007/0277129 A1 | 11/2007 | Allen et al. |
| 2007/0288882 A1 | 12/2007 | Kniffin et al. |
| 2007/0290361 A1 | 12/2007 | Chen |
| 2007/0294652 A1 | 12/2007 | Bowen |
| 2007/0297249 A1 | 12/2007 | Chang et al. |
| 2008/0001176 A1 | 1/2008 | Gopalakrishnan et al. |
| 2008/0005712 A1 | 1/2008 | Charlebois et al. |
| 2008/0021689 A1 | 1/2008 | Yamashita et al. |
| 2008/0022247 A1 | 1/2008 | Kojima et al. |
| 2008/0046846 A1 | 2/2008 | Chew et al. |
| 2008/0081472 A1 | 4/2008 | Tanaka |
| 2008/0082952 A1 | 4/2008 | O'Brien |
| 2008/0086712 A1 | 4/2008 | Fujimoto |
| 2008/0097641 A1 | 4/2008 | Miyashita et al. |
| 2008/0098334 A1 | 4/2008 | Pileggi et al. |
| 2008/0098341 A1 | 4/2008 | Kobayashi et al. |
| 2008/0099795 A1 | 5/2008 | Bernstein et al. |
| 2008/0127000 A1 | 5/2008 | Majumder et al. |
| 2008/0127029 A1 | 5/2008 | Graur et al. |
| 2008/0134128 A1 | 6/2008 | Blatchford et al. |
| 2008/0144361 A1 | 6/2008 | Wong |
| 2008/0148216 A1 | 6/2008 | Chan et al. |
| 2008/0163141 A1 | 7/2008 | Scheffer et al. |
| 2008/0168406 A1 | 7/2008 | Rahmat et al. |
| 2008/0211028 A1 | 9/2008 | Suzuki |
| 2008/0216207 A1 | 9/2008 | Tsai |
| 2008/0244494 A1 | 10/2008 | McCullen |
| 2008/0251779 A1 | 10/2008 | Kakoschke et al. |
| 2008/0265290 A1 | 10/2008 | Nielsen et al. |
| 2008/0276105 A1 | 11/2008 | Hoberman et al. |
| 2008/0283910 A1 | 11/2008 | Dreeskornfeld et al. |
| 2008/0285331 A1 | 11/2008 | Torok et al. |
| 2008/0308848 A1 | 12/2008 | Inaba |
| 2008/0308880 A1 | 12/2008 | Inaba |
| 2008/0315258 A1 | 12/2008 | Masuda et al. |
| 2009/0014811 A1 | 1/2009 | Becker et al. |
| 2009/0024974 A1 | 1/2009 | Yamada |
| 2009/0031261 A1 | 1/2009 | Smith et al. |
| 2009/0032898 A1 | 2/2009 | Becker et al. |
| 2009/0032967 A1 | 2/2009 | Becker et al. |
| 2009/0037864 A1 | 2/2009 | Becker et al. |
| 2009/0057780 A1 | 3/2009 | Wong et al. |
| 2009/0075485 A1 | 3/2009 | Ban et al. |
| 2009/0077524 A1 | 3/2009 | Nagamura |
| 2009/0085067 A1 | 4/2009 | Hayashi et al. |
| 2009/0087991 A1 | 4/2009 | Yatsuda et al. |
| 2009/0101940 A1 | 4/2009 | Barrows et al. |
| 2009/0106714 A1 | 4/2009 | Culp et al. |
| 2009/0155990 A1 | 6/2009 | Yanagidaira et al. |
| 2009/0181314 A1 | 7/2009 | Shyu et al. |
| 2009/0187871 A1 | 7/2009 | Cork |
| 2009/0206443 A1 | 8/2009 | Juengling |
| 2009/0224408 A1 | 9/2009 | Fox |
| 2009/0228853 A1 | 9/2009 | Hong et al. |
| 2009/0228857 A1 | 9/2009 | Kornachuk et al. |
| 2009/0235215 A1 | 9/2009 | Lavin et al. |
| 2009/0273100 A1 | 11/2009 | Aton et al. |
| 2009/0280582 A1 | 11/2009 | Thijs et al. |
| 2009/0302372 A1 | 12/2009 | Chang et al. |
| 2009/0319977 A1 | 12/2009 | Saxena et al. |
| 2010/0001321 A1 | 1/2010 | Becker et al. |

(56) References Cited

U.S. PATENT DOCUMENTS

| | | |
|---|---|---|
| 2010/0006897 A1 | 1/2010 | Becker et al. |
| 2010/0006898 A1 | 1/2010 | Becker et al. |
| 2010/0006899 A1 | 1/2010 | Becker et al. |
| 2010/0006900 A1 | 1/2010 | Becker et al. |
| 2010/0006901 A1 | 1/2010 | Becker et al. |
| 2010/0006902 A1 | 1/2010 | Becker et al. |
| 2010/0006903 A1 | 1/2010 | Becker et al. |
| 2010/0006947 A1 | 1/2010 | Becker et al. |
| 2010/0006948 A1 | 1/2010 | Becker et al. |
| 2010/0006950 A1 | 1/2010 | Becker et al. |
| 2010/0006951 A1 | 1/2010 | Becker et al. |
| 2010/0006986 A1 | 1/2010 | Becker et al. |
| 2010/0011327 A1 | 1/2010 | Becker et al. |
| 2010/0011328 A1 | 1/2010 | Becker et al. |
| 2010/0011329 A1 | 1/2010 | Becker et al. |
| 2010/0011330 A1 | 1/2010 | Becker et al. |
| 2010/0011331 A1 | 1/2010 | Becker et al. |
| 2010/0011332 A1 | 1/2010 | Becker et al. |
| 2010/0011333 A1 | 1/2010 | Becker et al. |
| 2010/0012981 A1 | 1/2010 | Becker et al. |
| 2010/0012982 A1 | 1/2010 | Becker et al. |
| 2010/0012983 A1 | 1/2010 | Becker et al. |
| 2010/0012984 A1 | 1/2010 | Becker et al. |
| 2010/0012985 A1 | 1/2010 | Becker et al. |
| 2010/0012986 A1 | 1/2010 | Becker et al. |
| 2010/0017766 A1 | 1/2010 | Becker et al. |
| 2010/0017767 A1 | 1/2010 | Becker et al. |
| 2010/0017768 A1 | 1/2010 | Becker et al. |
| 2010/0017769 A1 | 1/2010 | Becker et al. |
| 2010/0017770 A1 | 1/2010 | Becker et al. |
| 2010/0017771 A1 | 1/2010 | Becker et al. |
| 2010/0017772 A1 | 1/2010 | Becker et al. |
| 2010/0019280 A1 | 1/2010 | Becker et al. |
| 2010/0019281 A1 | 1/2010 | Becker et al. |
| 2010/0019282 A1 | 1/2010 | Becker et al. |
| 2010/0019283 A1 | 1/2010 | Becker et al. |
| 2010/0019284 A1 | 1/2010 | Becker et al. |
| 2010/0019285 A1 | 1/2010 | Becker et al. |
| 2010/0019286 A1 | 1/2010 | Becker et al. |
| 2010/0019287 A1 | 1/2010 | Becker et al. |
| 2010/0019288 A1 | 1/2010 | Becker et al. |
| 2010/0019308 A1 | 1/2010 | Chan et al. |
| 2010/0023906 A1 | 1/2010 | Becker et al. |
| 2010/0023907 A1 | 1/2010 | Becker et al. |
| 2010/0023908 A1 | 1/2010 | Becker et al. |
| 2010/0023911 A1 | 1/2010 | Becker et al. |
| 2010/0025731 A1 | 2/2010 | Becker et al. |
| 2010/0025732 A1 | 2/2010 | Becker et al. |
| 2010/0025733 A1 | 2/2010 | Becker et al. |
| 2010/0025734 A1 | 2/2010 | Becker et al. |
| 2010/0025735 A1 | 2/2010 | Becker et al. |
| 2010/0025736 A1 | 2/2010 | Becker et al. |
| 2010/0032722 A1 | 2/2010 | Becker et al. |
| 2010/0032723 A1 | 2/2010 | Becker et al. |
| 2010/0032724 A1 | 2/2010 | Becker et al. |
| 2010/0032726 A1 | 2/2010 | Becker et al. |
| 2010/0037194 A1 | 2/2010 | Becker et al. |
| 2010/0037195 A1 | 2/2010 | Becker et al. |
| 2010/0096671 A1 | 4/2010 | Becker et al. |
| 2010/0115484 A1 | 5/2010 | Frederick |
| 2010/0203689 A1 | 8/2010 | Bernstein et al. |
| 2010/0224943 A1 | 9/2010 | Kawasaki |
| 2010/0229140 A1 | 9/2010 | Strolenberg et al. |
| 2010/0232212 A1 | 9/2010 | Anderson et al. |
| 2010/0252865 A1 | 10/2010 | Van Der Zanden |
| 2010/0264468 A1 | 10/2010 | Xu |
| 2010/0270681 A1 | 10/2010 | Bird et al. |
| 2010/0287518 A1 | 11/2010 | Becker |
| 2010/0301482 A1 | 12/2010 | Schultz et al. |
| 2011/0016909 A1 | 1/2011 | Mirza et al. |
| 2011/0108890 A1 | 5/2011 | Becker et al. |
| 2011/0108891 A1 | 5/2011 | Becker et al. |
| 2011/0154281 A1 | 6/2011 | Zach |
| 2011/0207298 A1 | 8/2011 | Anderson et al. |
| 2011/0260253 A1 | 10/2011 | Inaba |
| 2011/0298025 A1 | 12/2011 | Haensch et al. |
| 2011/0317477 A1 | 12/2011 | Liaw |
| 2012/0012932 A1 | 1/2012 | Perng et al. |
| 2012/0273841 A1 | 11/2012 | Quandt et al. |
| 2013/0097574 A1 | 4/2013 | Balabanov et al. |
| 2013/0200465 A1 | 8/2013 | Becker et al. |
| 2013/0200469 A1 | 8/2013 | Becker et al. |
| 2013/0207198 A1 | 8/2013 | Becker et al. |
| 2013/0207199 A1 | 8/2013 | Becker et al. |
| 2013/0254732 A1 | 9/2013 | Kornachuk et al. |
| 2014/0197543 A1 | 7/2014 | Kornachuk et al. |
| 2015/0249041 A1* | 9/2015 | Becker ................ H01L 27/0207 257/204 |
| 2015/0270218 A1* | 9/2015 | Becker ................ H01L 27/0207 257/369 |

FOREIGN PATENT DOCUMENTS

| | | |
|---|---|---|
| EP | 1394858 | 3/2004 |
| EP | 1670062 | 6/2006 |
| EP | 1833091 | 8/2007 |
| EP | 1730777 | 9/2007 |
| EP | 2251901 | 11/2010 |
| FR | 2860920 | 4/2005 |
| JP | 58-182242 | 10/1983 |
| JP | 58-215827 | 12/1983 |
| JP | 61-182244 | 8/1986 |
| JP | S63-310136 A | 12/1988 |
| JP | H01284115 | 11/1989 |
| JP | 03-165061 | 7/1991 |
| JP | H05152937 A | 6/1993 |
| JP | H05211437 | 8/1993 |
| JP | H05218362 | 8/1993 |
| JP | H07-153927 A | 6/1995 |
| JP | 2684980 | 7/1995 |
| JP | 1995-302706 | 11/1995 |
| JP | 1997-09289251 A | 11/1997 |
| JP | 10-116911 | 5/1998 |
| JP | 1999-045948 | 2/1999 |
| JP | 2001-068558 | 3/2001 |
| JP | 2001-168707 | 6/2001 |
| JP | 2002-026125 | 1/2002 |
| JP | 2002-026296 A | 1/2002 |
| JP | 2002-184870 A | 6/2002 |
| JP | 2001-056463 | 9/2002 |
| JP | 2002-258463 | 9/2002 |
| JP | 2002-289703 | 10/2002 |
| JP | 2001-272228 | 3/2003 |
| JP | 2003-100872 | 4/2003 |
| JP | 2003-264231 | 9/2003 |
| JP | 2004-013920 | 1/2004 |
| JP | 2004-200300 | 7/2004 |
| JP | 2004-241529 | 8/2004 |
| JP | 2004-342757 A | 12/2004 |
| JP | 2005-020008 | 1/2005 |
| JP | 2003-359375 | 5/2005 |
| JP | 2005-135971 A | 5/2005 |
| JP | 2005-149265 | 6/2005 |
| JP | 2005-183793 | 7/2005 |
| JP | 2005-203447 | 7/2005 |
| JP | 2005-268610 | 9/2005 |
| JP | 2005-114752 | 10/2006 |
| JP | 2006-303022 A | 11/2006 |
| JP | 2007-012855 | 1/2007 |
| JP | 2007-013060 | 1/2007 |
| JP | 2007-043049 | 2/2007 |
| JP | 2011-515841 | 5/2011 |
| KR | 10-0417093 | 6/1997 |
| KR | 10-1998-087485 | 12/1998 |
| KR | 1998-0084215 A | 12/1998 |
| KR | 10-1999-0057943 A | 7/1999 |
| KR | 2000-0005660 | 1/2000 |
| KR | 10-2000-0028830 A | 5/2000 |
| KR | 10-2002-0034313 | 5/2002 |
| KR | 10-2002-0070777 | 9/2002 |
| KR | 2003-0022006 | 3/2003 |
| KR | 10-2005-0030347 A | 3/2005 |
| KR | 2005-0037965 A | 4/2005 |
| KR | 2006-0108233 A | 10/2006 |

(56) References Cited

FOREIGN PATENT DOCUMENTS

| TW | 386288 | 4/2000 |
|---|---|---|
| TW | 200709309 | 3/2007 |
| TW | 200709565 | 3/2007 |
| TW | 200811704 A | 3/2008 |
| TW | 200947567 A | 11/2009 |
| WO | WO 2005/104356 | 11/2005 |
| WO | WO 2006/014849 | 2/2006 |
| WO | WO 2006/052738 | 5/2006 |
| WO | WO 2006/090445 | 8/2006 |
| WO | WO 2007/014053 | 2/2007 |
| WO | WO 2007/103587 | 9/2007 |

OTHER PUBLICATIONS

Acar, et al., "A Linear-Centric Simulation Framework for Parametric Fluctuations", 2002, IEEE, Carnegie Mellon University USA, pp. 1-8, Jan. 28, 2002.
Amazawa, et al., "Fully Planarized Four-Level Interconnection with Stacked VLAS Using CMP of Selective CVD-A1 and Insulator and its Application to Quarter Micron Gate Array LSIs", 1995, IEEE, Japan, pp. 473-476, Dec. 10, 1995.
Axelrad et al. "Efficient Full-Chip Yield Analysis Methodology for OPC-Corrected VLSI Design", 2000, International Symposium on Quality Electronic Design (ISQED), Mar. 20, 2000.
Balasinski et al. "Impact of Subwavelength CD Tolerance on Device Performance", 2002, SPIE vol. 4692, Jul. 11, 2002.
Burkhardt, et al., "Dark Field Double Dipole Lithography (DDL) for Back-End-Of-Line Processes", 2007, SPIE Proceeding Series, vol. 6520; Mar. 26, 2007.
Capetti, et al., "Sub kl = 0.25 Lithography with Double Patterning Technique for 45nm Technology Node Flash Memory Devices at λ = 193nm", 2007, SPIE Proceeding Series, vol. 6520; Mar. 27, 2007.
Capodieci, L., et al., "Toward a Methodology for Manufacturability-Driven Design Rule Exploration," DAC 2004, Jun. 7, 2004, San Diego, CA.
Chandra, et al., "An Interconnect Channel Design Methodology for High Performance Integrated Circuits", 2004, IEEE, Carnegie Mellon University, pp. 1-6, Feb. 16, 2004.
Cheng, et al., "Feasibility Study of Splitting Pitch Technology on 45nm Contact Patterning with 0.93 NA", 2007, SPIE Proceeding Series, vol. 6520; Feb. 25, 2007.
Chow, et al., "The Design of a SRAM-Based Field-Programmable Gate Array—Part II: Circuit Design and Layout", 1999, IEEE, vol. 7 # 3 pp. 321-330, Sep. 1, 1999.
Clark et al. "Managing Standby and Active Mode Leakage Power in Deep Sub-Micron Design", Aug. 9, 2004, ACM.
Cobb et al. "Using OPC to Optimize for Image Slope and Improve Process Window", 2003, SPIE vol. 5130, Apr. 16, 2003.
Devgan "Leakage Issues in IC Design: Part 3", 2003, ICCAD, Nov. 9, 2003.
DeVor, et al., "Statistical Quality Design and Control", 1992, Macmillan Publishing Company, pp. 264-267, Jan. 3, 1992.
Dictionary.com, "channel," in Collins English Dictionary—Complete & Unabridged 10th Edition. Source location: HarperCollins Publishers. Sep. 3, 2009.
Dusa, et al. "Pitch Doubling Through Dual Patterning Lithography Challenges in Integration and Litho Budgets", 2007, SPIE Proceeding Series, vol. 6520; Feb. 25, 2007.
El-Gamal, "Fast, Cheap and Under Control: The Next Implementation Fabric", Jun. 2, 2003, ACM Press, pp. 354-355.
Firedberg, et al., "Modeling Within-Field Gate Length Spatial Variation for Process-Design Co-Optimization," 2005 Proc. of SPIE vol. 5756, pp. 178-188, Feb. 27, 2005.
Frankel, "Quantum State Control Interference Lithography and Trim Double Patterning for 32-16nm Lithography", 2007, SPIE Proceeding Series, vol. 6520; Feb. 27, 2007.
Garg, et al. "Lithography Driven Layout Design", 2005, IEEE VLSI Design 2005, Jan. 3, 2005.

Grobman et al. "Reticle Enhancement Technology Trends: Resource and Manufacturability Implications for the Implementation of Physical Designs" Apr. 1, 2001, ACM.
Grobman et al. "Reticle Enhancement Technology: Implications and Challenges for Physical Design" Jun. 18, 2001, ACM.
Gupta et al. "Enhanced Resist and Etch CD Control by Design Perturbation", Oct. 4, 2006, Society of Photo-Optical Instrumentation Engineers.
Gupta et al. "A Practical Transistor-Level Dual Threshold Voltage Assignment Methodology", 2005, Sixth International Symposium on Quality Electronic Design (ISQED), Mar. 21, 2005.
Gupta et al. "Detailed Placement for Improved Depth of Focus and CD Control", 2005, ACM, Jan. 18, 2005.
Gupta et al. "Joining the Design and Mask Flows for Better and Cheaper Masks", Oct. 14, 2004, Society of Photo-Optical Instrumentation Engineers.
Gupta et al. "Manufacturing—Aware Physical Design", ICCAD 2003, Nov. 9, 2003.
Gupta et al. "Selective Gate-Length Biasing for Cost-Effective Runtime Leakage Control", Jun. 7, 2004, ACM.
Gupta et al. "Wafer Topography—Aware Optical Proximity Correction for Better DOF Margin and CD Control", Apr. 13, 2005, SPIE.
Gupta, Puneet, et al., "Manufacturing—aware Design Methodology for Assist Feature Correctness," SPIE vol. 5756, May 13, 2005.
Ha et al., "Reduction in the Mask Error Factor by Optimizing the Diffraction Order of a Scattering Bar in Lithography," Journal of the Korean Physical Society, vol. 46, No. 5, May 5, 2005, pp. 1213-1217.
Hakko, et al., "Extension of the 2D-TCC Technique to Optimize Mask Pattern Layouts," 2008 Proc. of SPIE vol. 7028, 11 pages, Apr. 16, 2008.
Halpin et al., "Detailed Placement with Net Length Constraints," Publication Year 2003, Proceedings of the 3rd IEEE International Workshop on System-on-Chip for Real-Time Applications, pp. 22-27, Jun. 30, 2003.
Hayashida, et al., "Manufacturable Local Interconnect technology Fully Compatible with Titanium Salicide Process", Jun. 11, 1991, VMIC Conference.
Heng, et al., "A VLSI Artwork Legalization Technique Base on a New Criterion of Minimum Layout Perturbation", Proceedings of 1997 International Symposium on Physical Design, pp. 116-121, Apr. 14, 1997.
Heng, et al., "Toward Through-Process Layout Quality Metrics", Mar. 3, 2005, Society of Photo-Optical Instrumentation Engineers.
Hu, et al., "Synthesis and Placement Flow for Gain-Based Programmable Regular Fabrics", Apr. 6, 2003, ACM Press, pp. 197-203.
Hur et al., "Mongrel: Hybrid Techniques for Standard Cell Placement," Publication Year 2000, IEEE/ACM International Conference on Computer Aided Design, ICCAD-2000, pp. 165-170, Nov. 5, 2000.
Hutton, et al., "A Methodology for FPGA to Structured—ASIC Synthesis and Verification", 2006, EDAA, pp. 64-69, Mar. 6, 2006.
Intel Core Microarchitecture White Paper "Introducing the 45 nm Next-Generation Intel Core Microarchitecture," Intel Corporation, 2007 (best available publication date).
Jayakumar, et al., "A Metal and VIA Maskset Programmable VLSI Design Methodology using PLAs", 2004, IEEE, pp. 590-594, Nov. 7, 2004.
Jhaveri, T. et al., Maximization of Layout Printability/Manufacturability by Extreme Layout Regularity, Proc. of the SPIE vol. 6156, Feb. 19, 2006.
Kang, S.M., Metal-Metal Matrix (M3) for High-Speed MOS VLSI Layout, IEEE Trans. on CAD, vol. CAD-6, No. 5, Sep. 1, 1987.
Kawashima, et al., "Mask Optimization for Arbitrary Patterns with 2D-TCC Resolution Enhancement Technique," 2008 Proc. of SPIE vol. 6924, 12 pages, Feb. 24, 2008.
Kheterpal, et al., "Design Methodology for IC Manufacturability Based on Regular Logic-Bricks", DAC, Jun. 13, 2005, IEEE/AMC, vol. 6520.
Kheterpal, et al., "Routing Architecture Exploration for Regular Fabrics", DAC, Jun. 7, 2004, ACM Press, pp. 204-207.

(56) References Cited

OTHER PUBLICATIONS

Kim, et al., "Double Exposure Using 193nm Negative Tone Photoresist", 2007, SPIE Proceeding Series, vol. 6520; Feb. 25, 2007.
Kim, et al., "Issues and Challenges of Double Patterning Lithography in DRAM", 2007, SPIE Proceeding Series, vol. 6520; Feb. 25, 2007.
Koorapaty, et al., "Exploring Logic Block Granularity for Regular Fabrics", 2004, IEEE, pp. 1-6, Feb. 16, 2004.
Koorapaty, et al., "Heterogeneous Logic Block Architectures for Via-Patterned Programmable Fabric", 13th International Conference on Field Programmable Logic and Applications (FPL) 2003, Lecture Notes in Computer Science (LNCS), Sep. 1, 2003, Springer-Verlag, vol. 2778, pp. 426-436.
Koorapaty, et al., "Modular, Fabric-Specific Synthesis for Programmable Architectures", 12th International Conference on Field Programmable Logic and Applications (FPL_2002, Lecture Notes in Computer Science (LNCS)), Sep. 2, 2002, Springer-Verlag, vol. 2438 pp. 132-141.
Kuh et al., "Recent Advances in VLSI Layout," Proceedings of the IEEE, vol. 78, Issue 2, pp. 237-263, Feb. 1, 1990.
Lavin et al. "Backend DAC Flows for "Restrictive Design Rules"", 2004, IEEE, Nov. 7, 2004.
Li, et al., "A Linear-Centric Modeling Approach to Harmonic Balance Analysis", 2002, IEEE, pp. 1-6, Mar. 4, 2002.
Li, et al., "Nonlinear Distortion Analysis Via Linear-Centric Models", 2003, IEEE, pp. 897-903, Jan. 21, 2003.
Liebmann et al., "Integrating DfM Components into a Cohesive Design-to-Silicon Solution," Proc. SPIE 5756, Design and Process Integration for Microelectronic Manufacturing III, Feb. 27, 2005.
Liebmann et al., "Optimizing Style Options for Sub-Resolution Assist Features," Proc. of SPIE vol. 4346, Feb. 25, 2001, pp. 141-152.
Liebmann, et al., "High-Performance Circuit Design for the RET-Enabled 65nm Technology Node", Feb. 26, 2004, SPIE Proceeding Series, vol. 5379 pp. 20-29.
Liebmann, L. W., Layout Impact of Resolution Enhancement Techniques: Impediment or Opportunity?, International Symposium on Physical Design, Apr. 6, 2003.
Liu et al., "Double Patterning with Multilayer Hard Mask Shrinkage for Sub 0.25 kl Lithography," Proc. SPIE 6520, Optical Microlithography XX, Feb. 25, 2007.
Mansfield et al., "Lithographic Comparison of Assist Feature Design Strategies," Proc. of SPIE vol. 4000, Feb. 27, 2000, pp. 63-76.
Miller, "Manufacturing—Aware Design Helps Boost IC Yield", Sep. 9, 2004, http://www.eetimes.com/showArticle.jhtml?articleID=47102054.
Mishra, P., et al., "FinFET Circuit Design," Nanoelectronic Circuit Design, pp. 23-54, Dec. 21, 2010.
Mo, et al., "Checkerboard: A Regular Structure and its Synthesis, International Workshop on Logic and Synthesis", Department of Electrical Engineering and Computer Sciences, UC Berkeley, California, pp. 1-7, Jun. 1, 2003.
Mo, et al., "PLA-Based Regular Structures and Their Synthesis", Department of Electrical Engineering and Computer Sciences, IEEE, pp. 723-729, Jun. 1, 2003.
Mo, et al., "Regular Fabrics in Deep Sub-Micron Integrated-Circuit Design", Kluwer Academic Publishers, Entire Book, Jun. 1, 2002.
Moore, Samuel K., "Intel 45-nanometer Penryn Processors Arrive," Nov. 13, 2007, IEEE Spectrum, http://spectrum.ieee.org/semiconductors/design/intel-45nanometer-penryn-processors-arrive.
Mutoh et al. "1-V Power Supply High-Speed Digital Circuit Technology with Multithreshold-Voltage CMOS", 1995, IEEE, Aug. 1, 1995.
Op de Beek, et al., "Manufacturability issues with Double Patterning for 50nm half pitch damascene applications, using RELACS® shrink and corresponding OPC", 2007, SPIE Proceeding Series, vol. 6520; Feb. 25, 2007.
Or-Bach, "Programmable Circuit Fabrics", Sep. 18, 2001, e-ASIC, pp. 1-36.

Otten, et al., "Planning for Performance", DAC 1998, ACM Inc., pp. 122-127, Jun. 15, 1998.
Pack et al. "Physical & Timing Verification of Subwavelength-Scale Designs—Part I: Lithography Impact on MOSFETs", 2003, SPIE vol. 5042, Feb. 23, 2003.
Pandini, et al., "Congestion—Aware Logic Synthesis", 2002, IEEE, pp. 1-8, Mar. 4, 2002.
Pandini, et al., "Understanding and Addressing the Impact of Wiring Congestion During Technology Mapping", ISPD Apr. 7, 2002, ACM Press, pp. 131-136.
Patel, et al., "An Architectural Exploration of Via Patterned Gate Arrays, ISPD 2003", Apr. 6, 2003, pp. 184-189.
Pham, D., et al., "FINFET Device Junction Formation Challenges," 2006 International Workshop on Junction Technology, pp. 73-77, Aug. 1, 2006.
Pileggi, et al., "Exploring Regular Fabrics to Optimize the Performance—Cost Trade-Offs, Proceedings of the 40th ACM/IEEE Design Automation Conference (DAC) 2003", Jun. 2, 2003, ACM Press, pp. 782-787.
Poonawala, et al., "ILT for Double Exposure Lithography with Conventional and Novel Materials", 2007, SPIE Proceeding Series, vol. 6520; Feb. 25, 2007.
Qian et al. "Advanced Physical Models for Mask Data Verification and Impacts on Physical Layout Synthesis" 2003 IEEE, Mar. 24, 2003.
Ran, et al., "An Integrated Design Flow for a Via-Configurable Gate Array", 2004, IEEE, pp. 582-589, Nov. 7, 2004.
Ran, et al., "Designing a Via-Configurable Regular Fabric", Custom Integrated Circuits Conference (CICC). Proceedings of the IEEE, Oct. 1, 2004, pp. 423-426.
Ran, et al., "On Designing Via-Configurable Cell Blocks for Regular Fabrics" Proceedings of the Design Automation Conference (DAC) 2004, Jun. 7, 2004, ACM Press, s 198-203.
Ran, et al., "The Magic of a Via-Configurable Regular Fabric", Proceedings of the IEEE International Conference on Computer Design (ICCD) Oct. 11, 2004.
Ran, et al., "Via-Configurable Routing Architectures and Fast Design Mappability Estimation for Regular Fabrics", 2005, IEEE, pp. 25-32, Sep. 1, 2006.
Reis, et al., "Physical Design Methodologies for Performance Predictability and Manufacturability", Apr. 14, 2004, ACM Press, pp. 390-397.
Robertson, et al., "The Modeling of Double Patterning Lithographic Processes", 2007, SPIE Proceeding Series, vol. 6520; Feb. 25, 2007.
Rosenbluth, et al., "Optimum Mask and Source Patterns to Print a Given Shape," 2001 Proc. of SPIE vol. 4346, pp. 486-502, Feb. 25, 2001.
Rovner, "Design for Manufacturability in Via Programmable Gate Arrays", May 1, 2003, Graduate School of Carnegie Mellon University.
Sengupta, "An Integrated CAD Framework Linking VLSI Layout Editors and Process Simulators", 1998, Thesis for Rice University, pp. 1-101, Nov. 1, 1998.
Sengupta, et al., "An Integrated CAD Framework Linking VLSI Layout Editors and Process Simulators", 1996, SPIE Proceeding Series, vol. 2726; pp. 244-252, Mar. 10, 1996.
Sherlekar, "Design Considerations for Regular Fabrics", Apr. 18, 2004, ACM Press, pp. 97-102.
Shi et al., "Understanding the Forbidden Pitch and Assist Feature Placement," Proc. of SPIE vol. 4562, pp. 968-979, Mar. 11, 2002.
Smayling et al., "APF Pitch Halving for 22 nm Logic Cells Using Gridded Design Rules," Proceedings of SPIE, USA, vol. 6925, Jan. 1, 2008, pp. 69251E-1-69251E-7.
Socha, et al., "Simultaneous Source Mask Optimization (SMO)," 2005 Proc. of SPIE vol. 5853, pp. 180-193, Apr. 13, 2005.
Sreedhar et al. "Statistical Yield Modeling for Sub-Wavelength Lithography", 2008 IEEE, Oct. 28, 2008.
Stapper, "Modeling of Defects in Integrated Circuit Photolithographic Patterns", Jul. 1, 1984, IBM, vol. 28 # 4, pp. 461-475.
Taylor, et al., "Enabling Energy Efficiency in Via-Patterned Gate Array Devices", Jun. 7, 2004, ACM Press, pp. 874-877.

(56) References Cited

OTHER PUBLICATIONS

Tian et al. "Model-Based Dummy Feature Placement for Oxide Chemical_Mechanical Polishing Manufacturability" IEEE, vol. 20, Issue 7, Jul. 1, 2001.
Tong, et al., "Regular Logic Fabrics for a Via Patterned Gate Array (VPGA), Custom Integrated Circuits Conference", Sep. 21, 2003, Proceedings of the IEEE, pp. 53-56.
Vanleenhove, et al., "A Litho-Only Approach to Double Patterning", 2007, SPIE Proceeding Series, vol. 6520; Feb. 25, 2007.
Wang, et al., "Performance Optimization for Gridded-Layout Standard Cells", vol. 5567 SPIE, Sep. 13, 2004.
Wang, J. et al., Standard Cell Layout with Regular Contact Placement, IEEE Trans. on Semicon. Mfg., vol. 17, No. 3, Aug. 9, 2004.
Webb, Clair, "45nm Design for Manufacturing," Intel Technology Journal, vol. 12, Issue 02, Jun. 17, 2008, ISSN 1535-864X, pp. 121-130.
Webb, Clair, "Layout Rule Trends and Affect upon CPU Design", vol. 6156 SPIE, Feb. 19, 2006.
Wenren, et al., "The Improvement of Photolithographic Fidelity of Two-dimensional Structures Though Double Exposure Method", 2007, SPIE Proceeding Series, vol. 6520; Feb. 25, 2007.
Wilcox, et al., "Design for Manufacturability: A Key to Semiconductor Manufacturing Excellence", 1998 IEEE, pp. 308-313, Sep. 23, 1998.
Wong, et al., "Resolution Enhancement Techniques and Design for Manufacturability: Containing and Accounting for Variabilities in Integrated Circuit Creation," J. Micro/Nanolith. MEMS MOEMS, Sep. 27, 2007, vol. 6(3), 2 pages.
Wu, et al., "A Study of Process Window Capabilities for Two-dimensional Structures under Double Exposure Condition", 2007, SPIE Proceeding Series, vol. 6520; Feb. 25, 2007.
Xiong, et al., "The Constrained Via Minimization Problem for PCB and VLSI Design", 1988 ACM Press/IEEE, pp. 573-578, Jun. 12, 1998.
Yamamoto, et al., "New Double Exposure Technique without Alternating Phase Shift Mask", SPIE Proceeding Series, vol. 6520; Feb. 25, 2007.
Yamazoe, et al., "Resolution Enhancement by Aerial Image Approximation with 2D-TCC," 2007 Proc. of SPIE vol. 6730, 12 pages, Sep. 17, 2007.
Yang, et al., "Interconnection Driven VLSI Module Placement Based on Quadratic Programming and Considering Congestion Using LFF Principles", 2004 IEEE, pp. 1243-1247, Jun. 27, 2004.
Yao, et al., "Multilevel Routing With Redundant Via Insertion", Oct. 23, 2006, IEEE, pp. 1148-1152.
Yu, et al., "True Process Variation Aware Optical Proximity Correction with Variational Lithography Modeling and Model Calibration," J. Micro/Nanolith. MEMS MOEMS, Sep. 11, 2007, vol. 6(3), 16 pages.
Zheng, et al."Modeling and Analysis of Regular Symmetrically Structured Power/Ground Distribution Networks", DAC, Jun. 10, 2002, ACM Press, pp. 395-398.
Zhu, et al., "A Stochastic Integral Equation Method for Modeling the Rough Surface Effect on Interconnect Capacitance", 2004 IEEE, Nov. 7, 2004.
Zhu, et al., "A Study of Double Exposure Process Design with Balanced Performance Parameters for Line/Space Applications", 2007, SPIE Proceeding Series, vol. 6520; Feb. 25, 2007.
Zuchowski, et al., "A Hybrid ASIC and FPGA Architecture", 2003 IEEE, pp. 187-194, Nov. 10, 2002.
Alam, Syed M. et al., "A Comprehensive Layout Methodology and Layout-Specific Circuit Analyses for Three-Dimensional Integrated Circuits," Mar. 21, 2002.
Alam, Syed M. et al., "Layout-Specific Circuit Evaluation in 3-D Integrated Circuits," May 1, 2003.
Aubusson, Russel, "Wafer-Scale Integration of Semiconductor Memory," Apr. 1, 1979.
Bachtold, "Logic Circuits with Carbon," Nov. 9, 2001.
Baker, R. Jacob, "CMOS: Circuit Design, Layout, and Simulation (2nd Edition)," Nov. 1, 2004.
Baldi et al., "A Scalable Single Poly EEPROM Cell for Embedded Memory Applications," pp. 1-4, Fig. 1, Sep. 1, 1997.
Cao, Ke, "Design for Manufacturing (DFM) in Submicron VLSI Design," Aug. 1, 2007.
Capodieci, Luigi, "From Optical Proximity Correction to Lithography-Driven Physical Design (1996-2006): 10 years of Resolution Enhancement Technology and the roadmap enablers for the next decade," Proc. SPIE 6154, Optical Microlithography XIX, 615401, Mar. 20, 2006.
Chang, Leland et al., "Stable SRAM Cell Design for the 32 nm Node and Beyond," Jun. 16, 2005.
Cheung, Peter, "Layout Design," Apr. 4, 2004.
Chinnery, David, "Closing the Gap Between ASIC & Custom: Tools and Techniques for High-Performance ASIC Design," Jun. 30, 2002.
Chou, Dyiann et al., "Line End Optimization through Optical Proximity Correction (OPC): A Case Study," Feb. 19, 2006.
Clein, Dan, "CMOS IC Layout: Concepts, Methodologies, and Tools," Dec. 22, 1999.
Cowell, "Exploiting Non-Uniform Access Time," Jul. 1, 2003.
Das, Shamik, "Design Automation and Analysis of Three-Dimensional Integrated Circuits," May 1, 2004.
Dehaene, W. et al., "Technology—Aware Design of SRAM Memory Circuits," Mar. 1, 2007.
Deng, Liang et al., "Coupling—aware Dummy Metal Insertion for Lithography," p. 1, col. 2, Jan. 23, 2007.
Devoivre et al., "Validated 90nm CMOS Technology Platform with Low-k Copper Interconnects for Advanced System-on-Chip (SoC)," Jul. 12, 2002.
Enbody, R. J., "Near-Optimal n-Layer Channel Routing," Jun. 29, 1986.
Ferretti, Marcos et al., "High Performance Asynchronous ASIC Back-End Design Flow Using Single-Track Full-Buffer Standard Cells," Apr. 23, 2004.
Garg, Manish et al., "Litho-driven Layouts for Reducing Performance Variability," p. 2, Figs. 2b-2c, May 23, 2005.
Greenway, Robert et al., "32nm 1-D Regular Pitch SRAM Bitcell Design for Interference-Assisted Lithography," Oct. 6, 2008.
Gupta et al., "Modeling Edge Placement Error Distribution in Standard Cell Library," Feb. 23, 2006.
Grad, Johannes et al., "A standard cell library for student projects," Proceedings of the 2003 IEEE International Conference on Microelectronic Systems Education, Jun. 2, 2003.
Hartono, Roy et al., "Active Device Generation for Automatic Analog Layout Retargeting Tool," May 13, 2004.
Hartono, Roy et al., "IPRAIL—Intellectual Property Reuse-based Analog IC Layout Automation," Mar. 17, 2003.
Hastings, Alan, "The Art of Analog Layout (2nd Edition)," Jul. 4, 2005.
Hurata et al., "A Genuine Design Manufacturability Check for Designers," Feb. 19, 2006.
Institute of Microelectronic Systems, "Digital Subsystem Design," Oct. 13, 2006.
Ishida, M. et al., "A Novel 6T-SRAM Cell Technology Designed with Rectangular Patterns Scalable beyond 0.18 pm Generation and Desirable for Ultra High Speed Operation," IEDM 1998, Dec. 6, 1998.
Jakusovszky, "Linear IC Parasitic Element Simulation Methodology," Oct. 1, 1993.
Jangkrajarng, Nuttorn et al., "Template-Based Parasitic-Aware Optimization and Retargeting of Analog and RF Integrated Circuit Layouts," Nov. 5, 2006.
Kahng, Andrew B., "Design Optimizations DAC-2006 DFM Tutorial, part V)," Jul. 24, 2006.
Kang, Sung-Mo et al., "CMOS Digital Integrated Circuits Analysis & Design," Oct. 29, 2002.
Kottoor, Mathew Francis, "Development of a Standard Cell Library based on Deep Sub-Micron SCMOS Design Rules using Open Source Software (MS Thesis)," Aug. 1, 2005.
Kubicki, "Intel 65nm and Beyond (or Below): IDF Day 2 Coverage (available at http://www.anandtech.com/show/1468/4)," Sep. 9, 2004.

(56) References Cited

OTHER PUBLICATIONS

Kuhn, Kelin J., "Reducing Variation in Advanced Logic Technologies: Approaches to Process and Design for Manufacturability of Nanoscale CMOS," p. 27, Dec. 12, 2007.
Kurokawa, Atsushi et al., "Dummy Filling Methods for Reducing Interconnect Capacitance and Number of Fills, Proc. of ISQED," pp. 586-591, Mar. 21, 2005.
Lavin, Mark, "Open Access Requirements from RDR Design Flows," Nov. 11, 2004.
Liebmann, Lars et al., "Layout Methodology Impact of Resolution Enhancement Techniques," pp. 5-6, Apr. 6, 2003.
Liebmann, Lars et al., "TCAD development for lithography resolution enhancement," Sep. 1, 2001.
Lin, Chung-Wei et al., "Recent Research and Emerging Challenges in Physical Design for Manufacturability/Reliability," Jan. 26, 2007.
McCullen, Kevin W., "Layout Techniques for Phase Correct and Gridded Wiring," pp. 13, 17, Fig. 5, Dec. 1, 2006.
MOSIS, "Design Rules MOSIS Scalable CMOS (SCMOS) (Revision 8.00)," Oct. 4, 2004.
MOSIS, "MOSIS Scalable CMOS (SCMOS) Design Rules (Revision 7.2)," Jan. 1, 1995.
Muta et al., "Manufacturability—Aware Design of Standard Cells," pp. 2686-2690, Figs. 3, 12, Dec. 1, 2007.
Na, Kee-Yeol et al., "A Novel Single Polysilicon EEPROM Cell With a Polyfinger Capacitor," Nov. 30, 2007.
Pan et al., "Redundant Via Enhanced Maze Routing for Yield Improvement," DAC 2005, Jan. 18, 2005.
Park, Tae Hong, "Characterization and Modeling of Pattern Dependencies in Copper Interconnects for Integrated Circuits," Ph.D. Thesis, MIT, May 24, 2002.
Patel, Chetan, "An Architectural Exploration of Via Patterned Gate Arrays (CMU Master's Project)," May 1, 2003.
Pease, R. Fabian et al., "Lithography and Other Patterning Techniques for Future Electronics," IEEE 2008, vol. 96, Issue 2, Jan. 16, 2008.
Serrano, Diego Emilio, Pontificia Universidad Javeriana Facultad De Ingenieria, Departamento De Electronica, "Diseño De Multiplicador 4 X 8 en VLSI, Introduccion al VLSI," 2006 (best available publication date).
Pramanik, "Impact of layout on variability of devices for sub 90nm technologies," 2004 (best available publication date).
Pramanik, Dipankar et al., "Lithography-driven layout of logic cells for 65-nm node (SPIE Proceedings vol. 5042)," Jul. 10, 2003.
Roy et al., "Extending Aggressive Low-K1 Design Rule Requirements for 90 and 65 Nm Nodes Via Simultaneous Optimization of Numerical Aperture, Illumination and Optical Proximity Correction," J.Micro/Nanolith, MEMS MOEMS, 4(2), 023003, Apr. 26, 2005.
Saint, Christopher et al., "IC Layout Basics: A Practical Guide," Chapter 3, Nov. 5, 2001.
Saint, Christopher et al., "IC Mask Design: Essential Layout Techniques," May 24, 2002.
Scheffer, "Physical CAD Changes to Incorporate Design for Lithography and Manufacturability," Feb. 4, 2004.
Smayling, Michael C., "Part 3: Test Structures, Test Chips, In-Line Metrology & Inspection," Jul. 24, 2006.
Spence, Chris, "Full-Chip Lithography Simulation and Design Analysis: How OPC is changing IC Design, Emerging Lithographic Technologies IX," May 6, 2005.
Subramaniam, Anupama R., "Design Rule Optimization of Regular layout for Leakage Reduction in Nanoscale Design," pp. 474-478, Mar. 24, 2008.
Tang, C. W. et al., "A compact large signal model of LDMOS," Solid-State Electronics 46(2002) 2111-2115, May 17, 2002.
Taylor, Brian et al., "Exact Combinatorial Optimization Methods for Physical Design of Regular Logic Bricks," Jun. 8, 2007.
Tian, Ruiqi et al., "Dummy Feature Placement for Chemical—Mechanical Uniformity in a Shallow Trench Isolation Process," IEEE Trans. on Computer-Aided Design of Integrated Circuits and Systems, vol. 21, No. 1, pp. 63-71, Jan. 1, 2002.
Tian, Ruiqi et al., "Proximity Dummy Feature Placement and Selective Via Sizing for Process Uniformity in a Trench-First-Via-Last Dual-Inlaid Metal Process," Proc. of IITC, pp. 48-50, Jun. 6, 2001.
Torres, J. A. et al., "RET Compliant Cell Generation for sub-130nm Processes," SPIE vol. 4692, Mar. 6, 2002.
Uyemura, John P., "Introduction to VLSI Circuits and Systems," Chapters 2, 3, 5, and Part 3, Jul. 30, 2001.
Uyemura, John, "Chip Design for Submicron VLSI: CMOS Layout and Simulation," Chapters 2-5, 7-9, Feb. 8, 2005.
Verhaegen et al., "Litho Enhancements for 45nm-nod MuGFETs," Aug. 1, 2005.
Wong, Ban P., "Bridging the Gap between Dreams and Nano-Scale Reality (DAC-2006 DFM Tutorial)," Jul. 28, 2006.
Wang, Dunwei et al., "Complementary Symmetry Silicon Nanowire Logic: Power-Efficient Inverters with Gain," Aug. 17, 2006.
Wang, Jun et al., "Effects of grid-placed contacts on circuit performance," pp. 135-139, Figs. 2, 4-8, Feb. 28, 2003.
Wang, Jun et al., "Standard cell design with regularly placed contacts and gates (SPIE vol. 5379)," Feb. 22, 2004.
Wang, Jun et al., "Standard cell design with resolution-enhancement-technique-driven regularly placed contacts and gates," J. Micro/Nanolith, MEMS MOEMS, 4(1), 013001, Mar. 16, 2005.
Watson, Bruce, "Challenges and Automata Applications in Chip-Design Software," pp. 38-40, Jul. 16, 2007.
Weste, Neil et al., "CMOS VLSI Design: A Circuits and Systems Perspective, 3rd Edition," May 21, 2004.
Wingerden, Johannes van, "Experimental verification of improved printability for litho-driven designs," Mar. 14, 2005.
Wong, Alfred K., "Microlithography: Trends, Challenges, Solutions,, and Their Impact on Design," Micro IEEE vol. 23, Issue 2, Apr. 29, 2003.
Xu, Gang, "Redundant-Via Enhanced Maze Routing for Yield Improvement," Proceedings of ASP-DAC 2005, Jan. 18, 2005.
Yang, Jie, "Manufacturability Aware Design," pp. 93, 102, Fig. 5.2, Jan. 16, 2008.
Yongshun, Wang et al., "Static Induction Devices with Planar Type Buried Gate," Chinese Journal of Semiconductors, vol. 25, No. 2, Feb. 1, 2004.
Zobrist, George (editor), "Progress in Computer Aided VLSI Design: Implementations (Ch. 5)," Ablex Publishing Corporation, Feb. 1, 1990.
Petley, Graham, "VLSI and ASIC Technology Standard Cell Library Design," from website www.vlsitechnology.org, Jan. 11, 2005.
Liebmann, Lars, et al., "Layout Optimization at the Pinnacle of Optical Lithography," Design and Process Integration for Microelectronic Manufacturing II, Proceedings of SPIE vol. 5042, Jul. 8, 2003.
Kawasaki, H., et al., "Challenges and Solutions of FinFET Integration in an SRAM Cell and a Logic Circuit for 22 nm node and beyond," Electron Devices Meeting (IEDM), 2009 IEEE International, IEEE, Piscataway, NJ, USA, Dec. 7, 2009, pp. 1-4.

* cited by examiner

SEMICONDUCTOR CHIP INCLUDING INTEGRATED CIRCUIT INCLUDING AT LEAST FIVE GATE LEVEL CONDUCTIVE STRUCTURES HAVING PARTICULAR SPATIAL AND ELECTRICAL RELATIONSHIP AND METHOD FOR MANUFACTURING THE SAME

CLAIM OF PRIORITY

This application is a continuation application under 35 U.S.C. 120 of prior U.S. application Ser. No. 13/774,919, filed on Feb. 22, 2013, which is a continuation application under 35 U.S.C. 120 of prior U.S. application Ser. No. 12/572,225, filed on Oct. 1, 2009, issued as U.S. Pat. No. 8,436,400, on May 7, 2013, which is a continuation application under 35 U.S.C. 120 of prior U.S. application Ser. No. 12/212,562, filed Sep. 17, 2008, issued as U.S. Pat. No. 7,842,975, on Nov. 30, 2010, which is a continuation application under 35 U.S.C. 120 of prior U.S. application Ser. No. 11/683,402, filed Mar. 7, 2007, issued as U.S. Pat. No. 7,446,352, on Nov. 4, 2008, which claims priority under 35 U.S.C. 119(e) to U.S. Provisional Patent Application No. 60/781,288, filed Mar. 9, 2006. Each of the above-identified applications is incorporated herein by reference in its entirety.

CROSS-REFERENCE TO RELATED APPLICATIONS

This application is related to each application identified in the table below. The disclosure of each application identified in the table below is incorporated herein by reference in its entirety.

| application Ser. No. | Filing Date |
| --- | --- |
| 12/561,207 | Sep. 16, 2009 |
| 12/561,216 | Sep. 16, 2009 |
| 12/561,220 | Sep. 16, 2009 |
| 12/561,224 | Sep. 16, 2009 |
| 12/561,229 | Sep. 16, 2009 |
| 12/561,234 | Sep. 16, 2009 |
| 12/561,238 | Sep. 16, 2009 |
| 12/561,243 | Sep. 16, 2009 |
| 12/561,246 | Sep. 16, 2009 |
| 12/561,247 | Sep. 16, 2009 |
| 12/563,031 | Sep. 18, 2009 |
| 12/563,042 | Sep. 18, 2009 |
| 12/563,051 | Sep. 18, 2009 |
| 12/563,056 | Sep. 18, 2009 |
| 12/563,061 | Sep. 18, 2009 |
| 12/563,063 | Sep. 18, 2009 |
| 12/563,066 | Sep. 18, 2009 |
| 12/563,074 | Sep. 18, 2009 |
| 12/563,076 | Sep. 18, 2009 |
| 12/563,077 | Sep. 18, 2009 |
| 12/567,528 | Sep. 25, 2009 |
| 12/567,542 | Sep. 25, 2009 |
| 12/567,555 | Sep. 25, 2009 |
| 12/567,565 | Sep. 25, 2009 |
| 12/567,574 | Sep. 25, 2009 |
| 12/567,586 | Sep. 25, 2009 |
| 12/567,597 | Sep. 25, 2009 |
| 12/567,602 | Sep. 25, 2009 |
| 12/567,609 | Sep. 25, 2009 |
| 12/567,616 | Sep. 25, 2009 |
| 12/567,623 | Sep. 25, 2009 |
| 12/567,630 | Sep. 25, 2009 |
| 12/567,634 | Sep. 25, 2009 |
| 12/567,641 | Sep. 25, 2009 |
| 12/567,648 | Sep. 25, 2009 |
| 12/567,654 | Sep. 25, 2009 |
| 12/571,343 | Sep. 30, 2009 |
| 12/571,351 | Sep. 30, 2009 |
| 12/571,357 | Sep. 30, 2009 |
| 12/571,998 | Oct. 1, 2009 |
| 12/572,011 | Oct. 1, 2009 |
| 12/572,022 | Oct. 1, 2009 |
| 12/572,046 | Oct. 1, 2009 |
| 12/572,055 | Oct. 1, 2009 |
| 12/572,061 | Oct. 1, 2009 |
| 12/572,068 | Oct. 1, 2009 |
| 12/572,077 | Oct. 1, 2009 |
| 12/572,091 | Oct. 1, 2009 |
| 12/572,194 | Oct. 1, 2009 |
| 12/572,201 | Oct. 1, 2009 |
| 12/572,212 | Oct. 1, 2009 |
| 12/572,218 | Oct. 1, 2009 |
| 12/572,221 | Oct. 1, 2009 |
| 12/572,225 | Oct. 1, 2009 |
| 12/572,228 | Oct. 1, 2009 |
| 12/572,229 | Oct. 1, 2009 |
| 12/572,232 | Oct. 1, 2009 |
| 12/572,237 | Oct. 1, 2009 |
| 12/572,239 | Oct. 1, 2009 |
| 12/572,243 | Oct. 1, 2009 |
| 13/774,919 | Feb. 22, 2013 |
| 13/774,940 | Feb. 22, 2013 |
| 13/774,954 | Feb. 22, 2013 |
| 13/774,970 | Feb. 22, 2013 |
| 13/827,615 | Mar. 14, 2013 |
| 13/827,755 | Mar. 14, 2013 |
| 13/834,302 | Mar. 15, 2013 |
| 13/837,123 | Mar. 15, 2013 |
| 14/304,778 | Jun. 13, 2014 |
| 14/711,731 | May 13, 2015 |
| 14/731,316 | Jun. 4, 2015 |
| 12/013,342 | Jan. 11, 2008 |
| 13/073,994 | Mar. 28, 2011 |
| 12/013,356 | Jan. 11, 2008 |
| 13/047,474 | Mar. 14, 2011 |
| 14/276,528 | May 13, 2014 |
| 12/013,366 | Jan. 11, 2008 |
| 13/007,582 | Jan. 14, 2011 |
| 13/007,584 | Jan. 14, 2011 |
| 12/363,705 | Jan. 30, 2009 |
| 13/897,307 | May 17, 2013 |
| 14/216,891 | Mar. 17, 2014 |
| 12/402,465 | Mar. 11, 2009 |
| 12/753,711 | Apr. 2, 2010 |
| 12/753,727 | Apr. 2, 2010 |
| 12/753,733 | Apr. 2, 2010 |
| 12/753,740 | Apr. 2, 2010 |
| 12/753,753 | Apr. 2, 2010 |
| 12/753,758 | Apr. 2, 2010 |
| 13/741,298 | Jan. 14, 2013 |
| 12/753,766 | Apr. 2, 2010 |
| 13/589,028 | Aug. 17, 2012 |
| 12/753,776 | Apr. 2, 2010 |
| 12/753,789 | Apr. 2, 2010 |
| 12/753,793 | Apr. 2, 2010 |
| 12/753,795 | Apr. 2, 2010 |
| 12/753,798 | Apr. 2, 2010 |
| 13/741,305 | Jan. 14, 2013 |
| 12/753,805 | Apr. 2, 2010 |
| 12/753,810 | Apr. 2, 2010 |
| 12/753,817 | Apr. 2, 2010 |
| 12/754,050 | Apr. 5, 2010 |
| 12/754,061 | Apr. 5, 2010 |
| 12/754,078 | Apr. 5, 2010 |
| 12/754,091 | Apr. 5, 2010 |
| 12/754,103 | Apr. 5, 2010 |
| 12/754,114 | Apr. 5, 2010 |
| 12/754,129 | Apr. 5, 2010 |
| 12/754,147 | Apr. 5, 2010 |
| 12/754,168 | Apr. 5, 2010 |

-continued

| application Ser. No. | Filing Date |
| --- | --- |
| 12/754,215 | Apr. 5, 2010 |
| 12/754,233 | Apr. 5, 2010 |
| 12/754,351 | Apr. 5, 2010 |
| 13/591,141 | Aug. 21, 2012 |
| 12/754,384 | Apr. 5, 2010 |
| 12/754,563 | Apr. 5, 2010 |
| 12/754,566 | Apr. 5, 2010 |
| 13/831,530 | Mar. 14, 2013 |
| 13/831,605 | Mar. 15, 2013 |
| 13/831,636 | Mar. 15, 2013 |
| 13/831,664 | Mar. 15, 2013 |
| 13/831,717 | Mar. 15, 2013 |
| 13/831,742 | Mar. 15, 2013 |
| 13/831,811 | Mar. 15, 2013 |
| 13/831,832 | Mar. 15, 2013 |
| 14/242,308 | Apr. 1, 2014 |
| 14/273,483 | May 8, 2014 |
| 14/303,587 | Jun. 12, 2014 |
| 14/476,511 | Sep. 3, 2014 |
| 14/642,633 | Mar. 9, 2015 |
| 14/945,361 | Nov. 18, 2015 |
| 12/399,948 | Mar. 7, 2009 |
| 12/411,249 | Mar. 25, 2009 |
| 13/085,447 | Apr. 12, 2011 |
| 13/918,890 | Jun. 14, 2013 |
| 14/298,206 | Jun. 6, 2014 |
| 12/484,130 | Jun. 12, 2009 |
| 12/479,674 | Jun. 5, 2009 |
| 12/481,445 | Jun. 9, 2009 |
| 13/898,155 | May 20, 2013 |
| 12/497,052 | Jul. 2, 2009 |
| 13/540,529 | Jul. 2, 2012 |
| 14/040,590 | Sep. 27, 2013 |
| 14/605,946 | Jan. 26, 2015 |
| 12/466,335 | May 14, 2009 |
| 12/466,341 | May 14, 2009 |
| 12/512,932 | Jul. 30, 2009 |
| 14/834,295 | Aug. 24, 2015 |
| 12/435,672 | May 5, 2009 |
| 14/181,556 | Feb. 14, 2014 |
| 12/775,429 | May 6, 2010 |
| 12/904,134 | Oct. 13, 2010 |
| 14/187,171 | Feb. 21, 2014 |
| 13/373,470 | Nov. 14, 2011 |
| 14/875,570 | Oct. 5, 2015 |
| 13/312,673 | Dec. 6, 2011 |
| 14/481,845 | Sep. 9, 2014 |
| 13/473,439 | May 16, 2012 |
| 14/187,088 | Feb. 21, 2014 |
| 13/740,191 | Jan. 12, 2013 |
| 13/841,951 | Mar. 15, 2013 |

BACKGROUND

A push for higher performance and smaller die size drives the semiconductor industry to reduce circuit chip area by approximately 50% every two years. The chip area reduction provides an economic benefit for migrating to newer technologies. The 50% chip area reduction is achieved by reducing the feature sizes between 25% and 30%. The reduction in feature size is enabled by improvements in manufacturing equipment and materials. For example, improvement in the lithographic process has enabled smaller feature sizes to be achieved, while improvement in chemical mechanical polishing (CMP) has in-part enabled a higher number of interconnect layers.

In the evolution of lithography, as the minimum feature size approached the wavelength of the light source used to expose the feature shapes, unintended interactions occurred between neighboring features. Today minimum feature sizes are approaching 45 nm (nanometers), while the wavelength of the light source used in the photolithography process remains at 193 nm. The difference between the minimum feature size and the wavelength of light used in the photolithography process is defined as the lithographic gap. As the lithographic gap grows, the resolution capability of the lithographic process decreases.

An interference pattern occurs as each shape on the mask interacts with the light. The interference patterns from neighboring shapes can create constructive or destructive interference. In the case of constructive interference, unwanted shapes may be inadvertently created. In the case of destructive interference, desired shapes may be inadvertently removed. In either case, a particular shape is printed in a different manner than intended, possibly causing a device failure. Correction methodologies, such as optical proximity correction (OPC), attempt to predict the impact from neighboring shapes and modify the mask such that the printed shape is fabricated as desired. The quality of the light interaction prediction is declining as process geometries shrink and as the light interactions become more complex.

In view of the foregoing, a solution is needed for managing lithographic gap issues as technology continues to progress toward smaller semiconductor device features sizes.

SUMMARY

In one embodiment, an integrated circuit is disclosed to include a first gate electrode feature of a first gate electrode track. The first gate electrode feature of the first gate electrode track forms a first n-channel transistor as it crosses an n-diffusion region. The integrated circuit also includes a second gate electrode feature of the first gate electrode track. The second gate electrode feature of the first gate electrode track forms a first p-channel transistor as it crosses a p-diffusion region. The first and second gate electrode features of the first gate electrode track are separated by a first end-to-end spacing. The integrated circuit also includes a first gate electrode feature of a second gate electrode track. The first gate electrode feature of the second gate electrode track forms a second n-channel transistor as it crosses the n-diffusion region. The integrated circuit also includes a second gate electrode feature of the second gate electrode track. The second gate electrode feature of the second gate electrode track forms a second p-channel transistor as it crosses the p-diffusion region. The first and second gate electrode features of the second gate electrode track are separated by a second end-to-end spacing that is offset from the first end-to-end spacing such that a line of sight perpendicular to the first and second gate electrode tracks does not exist through the first and second end-to-end spacings.

In another embodiment, a cell of a semiconductor device is disclosed. The cell includes a substrate portion formed to include a plurality of diffusion regions. The plurality of diffusion regions respectively correspond to active areas of the substrate portion within which one or more processes are applied to modify one or more electrical characteristics of the active areas of the substrate portion. The plurality of diffusion regions are separated from each other by one or more non-active regions of the substrate portion.

Also in this embodiment, the cell includes a gate electrode level of the cell formed above the substrate portion. The gate electrode level includes a number of conductive features defined to extend in only a first parallel direction. Adjacent ones of the number of conductive features that share a common line of extent in the first parallel direction are fabricated from respective originating layout features that are separated from each other by an end-to-end spacing having a size measured in the first parallel direction. The size of each end-to-end spacing between originating layout features corresponding to adjacent ones of the number of conductive features within the gate electrode level of the cell is substantially equal and is minimized to an extent allowed by a semiconductor device manufacturing capability. The number of conductive features within the gate electrode level of the cell includes conductive features defined along at least four different virtual lines of extent in the first parallel direction across the gate electrode level of the cell.

A width size of the conductive features within the gate electrode level is measured perpendicular to the first parallel direction. The width size of the conductive features within a photolithographic interaction radius within the gate electrode level is less than a wavelength of light used in a photolithography process to fabricate the conductive features within the gate electrode level. The wavelength of light used in the photolithography process is less than or equal to 193 nanometers. The photolithographic interaction radius is five wavelengths of light used in the photolithography process.

Some of the number of conductive features within the gate electrode level of the cell are defined to include one or more gate electrode portions which extend over one or more of the active areas of the substrate portion corresponding to the plurality of diffusion regions. Each gate electrode portion and a corresponding active area of the substrate portion over which it extends together define a respective transistor device.

Also in this embodiment, the cell includes a number of interconnect levels formed above the gate electrode level of the cell. The substrate portion, the gate electrode level of the cell, and the number of interconnect levels are spatially aligned such that structures fabricated within each of the substrate portion, the gate electrode level of the cell, and the number of interconnect levels spatially relate to connect as required to form functional electronic devices within the semiconductor device.

In one embodiment, a semiconductor chip includes a region including a plurality of transistors, where each of the plurality of transistors in the region forms part of circuitry associated with execution of one or more logic functions. The region includes at least ten conductive structures formed within the semiconductor chip, where some of the at least ten conductive structures form at least one transistor gate electrode. Each of the at least ten conductive structures respectively has a corresponding top surface, wherein an entirety of a periphery of the corresponding top surface is defined by a corresponding first end, a corresponding second end, a corresponding first edge, and a corresponding second edge, such that a total distance along the entirety of the periphery of the corresponding top surface is equal to a sum of a total distance along the corresponding first edge and a total distance along the corresponding second edge and a total distance along the corresponding first end and a total distance along the corresponding second end. The total distance along the corresponding first edge is greater than two times the total distance along the corresponding first end. The total distance along the corresponding first edge is greater than two times the total distance along the corresponding second end. The total distance along the corresponding second edge is greater than two times the total distance along the corresponding first end. The total distance along the corresponding second edge is greater than two times the total distance along the corresponding second end. The corresponding first end extends from the corresponding first edge to the corresponding second edge and is located principally within a space between the corresponding first and second edges. The corresponding second end extends from the corresponding first edge to the corresponding second edge and is located principally within the space between the corresponding first and second edges. The top surfaces of the at least ten conductive structures are co-planar with each other. Each of the at least ten conductive structures has a corresponding lengthwise centerline oriented in a first direction along its top surface and extending from its first end to its second end. Each of the at least ten conductive structures has a length as measured along its lengthwise centerline from its first end to its second end. The first edge of each of the at least ten conductive structures is substantially straight. The second edge of each of the at least ten conductive structures is substantially straight. Each of the at least ten conductive structures has both its first edge and its second edge oriented substantially parallel to its lengthwise centerline. Each of the at least ten conductive structures has a width measured in a second direction perpendicular to the first direction at a midpoint of its lengthwise centerline. Each of the first direction and the second direction is oriented substantially parallel to the co-planar top surfaces of the at least ten conductive structures. The at least ten conductive structures are positioned in a side-by-side manner such that each of the at least ten conductive structures is positioned to have at least a portion of its length beside at least a portion of the length of another of the at least ten conductive structures. The width of each of the at least ten conductive structures is less than 45 nanometers. The region has a size of about 965 nanometers as measured in the second direction. Each of the at least ten conductive structures is positioned such that a distance as measured in the second direction between its lengthwise centerline and the lengthwise centerline of at least one other of the at least ten conductive structures is substantially equal to a first pitch that is less than or equal to about 193 nanometers. The at least ten conductive structures includes a first conductive structure. The first conductive structure includes a portion that forms a gate electrode of first transistor of a first transistor type. The first conductive structure also includes a portion that forms a gate electrode of a first transistor of a second transistor type. The at least ten conductive structures includes a second conductive structure. The second conductive structure includes a portion that forms a gate electrode of a second transistor of the first transistor type, wherein any transistor having its gate electrode formed by the second conductive structure is of the first transistor type. The at least ten conductive structures includes a third conductive structure. The third conductive structure includes a portion that forms a gate electrode of a second transistor of the second transistor type, wherein any transistor having its gate electrode formed by the third conductive structure is of the second transistor type. The at least ten conductive structures includes a fourth conductive structure. The fourth conductive structure includes a portion that forms a gate electrode of a third transistor of the first transistor type, wherein any transistor having its gate electrode formed by the fourth conductive structure is of the first transistor type. The at least ten conductive structures includes a fifth conductive structure. The fifth conductive structure includes a portion that forms a gate electrode of a third transistor of the second transistor type, wherein any transistor having its gate electrode formed by the fifth conductive structure is of the second transistor type. The first transistor of the first transistor type includes a first diffusion terminal. The second transistor of the first transistor type includes a first diffusion terminal. The first diffusion terminal of the first transistor of the first transistor type is electrically connected to the first diffusion terminal of the second transistor of the first transistor type through a first electrical connection. The first transistor of the second transistor type includes a first diffusion terminal. The second transistor of the second transistor type includes a first diffusion terminal. The first diffusion terminal of the first transistor of the second transistor type is electrically connected to the first diffusion terminal of the second transistor of the second transistor type through a second electrical connection. The second transistor of the first transistor type includes a second diffusion terminal. The third transistor of the first transistor type includes a first diffusion terminal. The second diffusion terminal of the second transistor of the first transistor type is electrically connected to the first diffusion terminal of the third transistor of the first transistor type through a third electrical connection. The second transistor of the second transistor type includes a second diffusion terminal. The third transistor of the second transistor type includes a first diffusion terminal. The second diffusion terminal of the second transistor of the second transistor type is electrically connected to the first diffusion terminal of the third transistor of the second transistor type through a fourth electrical connection. The third transistor of the first transistor type includes a second diffusion terminal electrically connected to a first diffusion terminal of a fourth transistor of the first transistor type through a fifth electrical connection. The third transistor of the second transistor type includes a second diffusion terminal electrically connected to a first diffusion terminal of a fourth transistor of the second transistor type through a sixth electrical connection. The third electrical connection is electrically connected to the fourth electrical connection through a seventh electrical connection. The gate electrode of the second transistor of the first transistor type is electrically connected to the gate electrode of the third transistor of the second transistor type through an eighth electrical connection. The gate electrode of the third transistor of the first transistor type is electrically connected to the gate electrode of the second transistor of the second transistor type through a ninth electrical connection. Each transistor of the first transistor type having its gate electrode formed by any of the at least ten conductive structures is included in a first collection of transistors. Each transistor of the second transistor type having its gate electrode formed by any of the at least ten conductive structures is included in a second collection of transistors. The first collection of transistors is separated from the second collection of transistors by an inner sub-region of the region. The inner sub-region does not include a source or a drain of any transistor.

Other aspects and advantages of the invention will become more apparent from the following detailed description, taken in conjunction with the accompanying drawings, illustrating by way of example the present invention.

DETAILED DESCRIPTION

Figure 1:
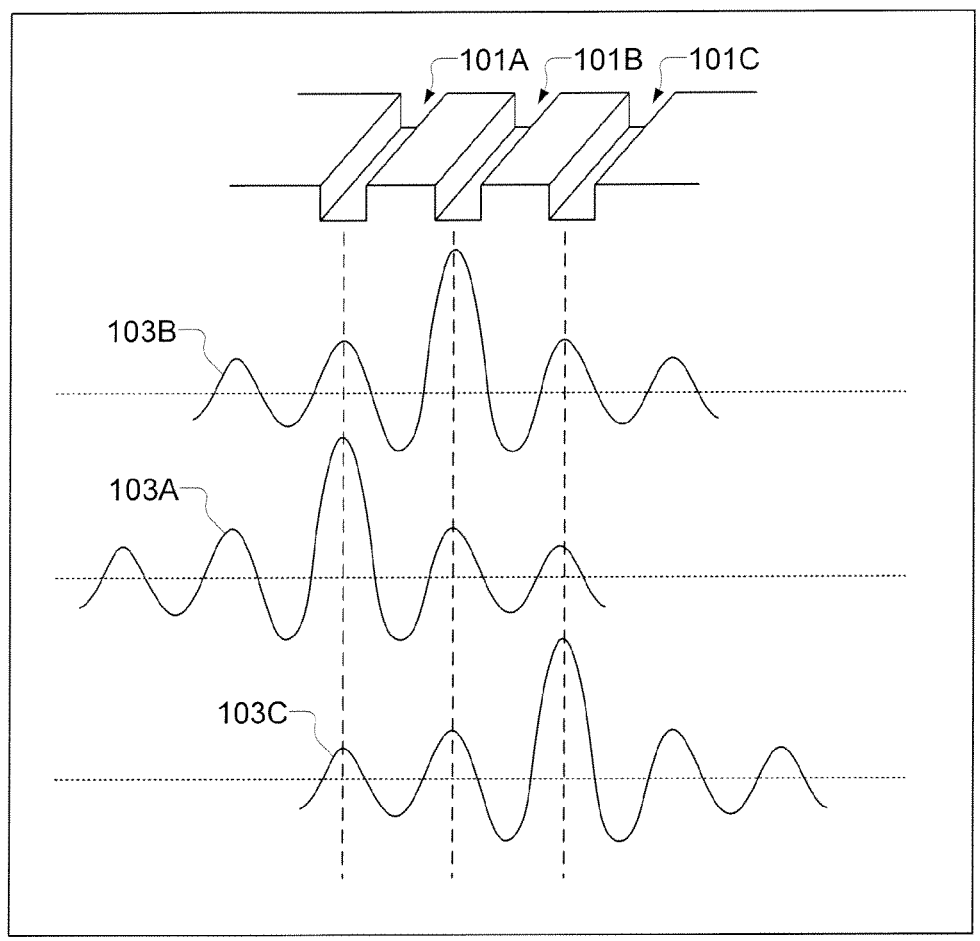
FIG. 1 is an illustration showing a number of neighboring layout features and a representation of light intensity used to render each of the layout features, in accordance with one embodiment of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Generally speaking, a dynamic array architecture is provided to address semiconductor manufacturing process variability associated with a continually increasing lithographic gap. In the area of semiconductor manufacturing, lithographic gap is defined as the difference between the minimum size of a feature to be defined and the wavelength of light used to render the feature in the lithographic process, wherein the feature size is less than the wavelength of the light. Current lithographic processes utilize a light wavelength of 193 nm. However, current feature sizes are as small as 65 nm and are expected to soon approach sizes as small as 45 nm. With a size of 65 nm, the shapes are three times smaller than the wavelength of the light used to define the shapes. Also, considering that the interaction radius of light is about five light wavelengths, it should be appreciated that shapes exposed with a 193 nm light source will influence the exposure of shapes approximately 5*193 nm (965 nm) away. When considering the 65 nm sized features with respect to 90 nm sized features, it should be appreciated that approximately two times as many 65 nm sizes features may be within the 965 nm interaction radius of the 193 nm light source as compared to the 90 nm sized features.

Due to the increased number of features within the interaction radius of the light source, the extent and complexity of light interference contributing to exposure of a given feature is significant. Additionally, the particular shapes associated with the features within the interaction radius of the light source weighs heavily on the type of light interactions that occur. Traditionally, designers were allowed to define essentially any two-dimensional topology of feature shapes so long as a set of design rules were satisfied. For example, in a given layer of the chip, i.e., in a given mask, the designer may have defined two-dimensionally varying features having bends that wrap around each other. When such two-dimensionally varying features are located in neighboring proximity to each other, the light used to expose the features will interact in a complex and generally unpredictable manner. The light interaction becomes increasingly more complex and unpredictable as the feature sizes and relative spacing become smaller.

Traditionally, if a designer follows the established set of design rules, the resulting product will be manufacturable with a specified probability associated with the set of design rules. Otherwise, for a design that violates the set of design rules, the probability of successful manufacture of the resulting product is unknown. To address the complex light interaction between neighboring two-dimensionally varying features, in the interest of successful product manufacturing, the set of design rules is expanded significantly to adequately address the possible combinations of two-dimensionally varying features. This expanded set of design rules quickly becomes so complicated and unwieldy that application of the expanded set of design rules becomes prohibitively time consuming, expensive, and prone to error. For example, the expanded set of design rules requires complex verification. Also, the expanded set of design rules may not be universally applied. Furthermore, manufacturing yield is not guaranteed even if all design rules are satisfied.

It should be appreciated that accurate prediction of all possible light interactions when rendering arbitrarily-shaped two-dimensional features is generally not feasible. Moreover, as an alternative to or in combination with expansion of the set of design rules, the set of design rules may also be modified to include increased margin to account for unpredictable light interaction between the neighboring two-dimensionally varying features. Because the design rules are established in an attempt to cover the random two-dimensional feature topology, the design rules may incorporate a significant amount of margin. While addition of margin in the set of design rules assists with the layout portions that include the neighboring two-dimensionally varying features, such global addition of margin causes other portions of the layout that do not include the neighboring two-dimensionally varying features to be overdesigned, thus leading to decreased optimization of chip area utilization and electrical performance.

In view of the foregoing, it should be appreciated that semiconductor product yield is reduced as a result of parametric failures that stem from variability introduced by design-dependent unconstrained feature topologies, i.e., arbitrary two-dimensionally varying features disposed in proximity to each other. By way of example, these parametric failures may result from failure to accurately print contacts and vias and from variability in fabrication processes. The variability in fabrication processes may include CMP dishing, layout feature shape distortion due to photolithography, gate distortion, oxide thickness variability, implant variability, and other fabrication related phenomena. The dynamic array architecture of the present invention is defined to address the above-mentioned semiconductor manufacturing process variability.

FIG. 1 is an illustration showing a number of neighboring layout features and a representation of light intensity used to render each of the layout features, in accordance with one embodiment of the present invention. Specifically, three neighboring linear-shaped layout features (101A-101C) are depicted as being disposed in a substantially parallel relationship within a given mask layer. The distribution of light intensity from a layout feature shape is represented by a sinc function. The sinc functions (103A-103C) represent the distribution of light intensity from each of the layout features (101A-101C, respectively). The neighboring linear-shaped layout features (101A-101C) are spaced apart at locations corresponding to peaks of the sinc functions (103A-103C). Thus, constructive interference between the light energy associated with the neighboring layout features (101A-101C), i.e., at the peaks of the sine functions (103A-103C), serves to reinforce the exposure of the neighboring shapes (101A-101C) for the layout feature spacing illustrated. In accordance with the foregoing, the light interaction represented in FIG. 1 represents a synchronous case.

As illustrated in FIG. 1, when linear-shaped layout features are defined in a regular repeating pattern at an appropriate spacing, constructive interference of the light energy associated with the various layout features serves to enhance the exposure of each layout feature. The enhanced exposure of the layout features provided by the constructive light interference can dramatically reduce or even eliminate a need to utilize optical proximity correction (OPC) and/or reticle enhancement technology (RET) to obtain sufficient rendering of the layout features.

A forbidden pitch, i.e., forbidden layout feature spacing, occurs when the neighboring layout features (101A-101C) are spaced such that peaks of the sinc function associated with one layout feature align with valleys of the sinc function associated with another layout feature, thus causing destructive interference of the light energy. The destructive interference of the light energy causes the light energy focused at a given location to be reduced. Therefore, to realize the beneficial constructive light interference associated with neighboring layout features, it is necessary to predict the layout feature spacing at which the constructive overlap of the sinc function peaks will occur. Predictable constructive overlap of the sinc function peaks and corresponding layout feature shape enhancement can be realized if the layout feature shapes are rectangular, near the same size, and are oriented in the same direction, as illustrated by the layout features (101A-101C) in FIG. 1. In this manner, resonant light energy from neighboring layout feature shapes is used to enhance the exposure of a particular layout feature shape.

Figure 2:
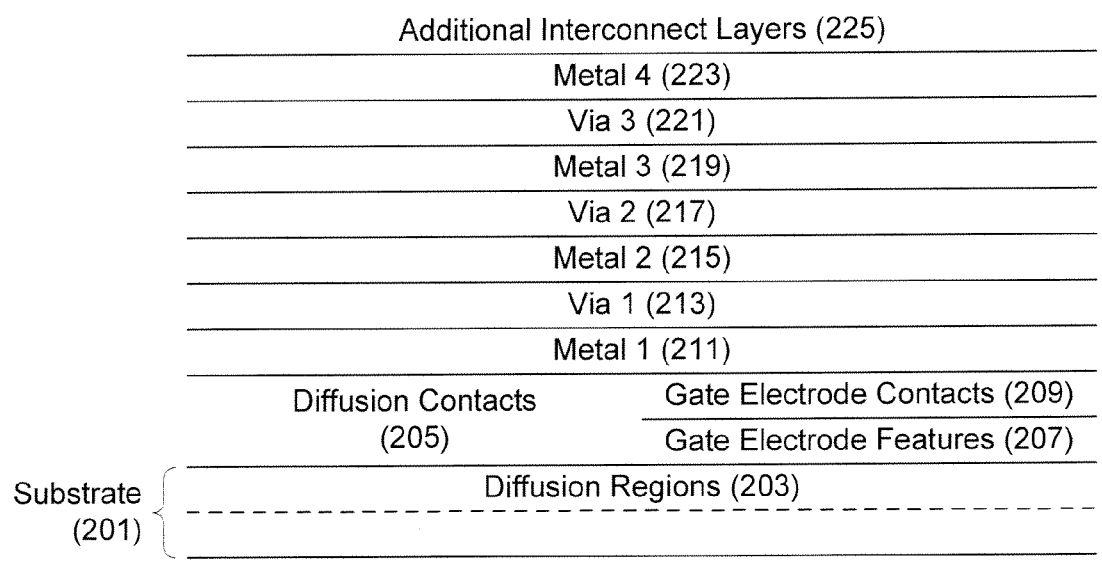
FIG. 2 is an illustration showing a generalized stack of layers used to define a dynamic array architecture, in accordance with one embodiment of the present invention.

FIG. 2 is an illustration showing a generalized stack of layers used to define a dynamic array architecture, in accordance with one embodiment of the present invention. It should be appreciated that the generalized stack of layers used to define the dynamic array architecture, as described with respect to FIG. 2, is not intended to represent an exhaustive description of the CMOS manufacturing process. However, the dynamic array is to be built in accordance with standard CMOS manufacturing processes. Generally speaking, the dynamic array architecture includes both the definition of the underlying structure of the dynamic array and the techniques for assembling the dynamic array for optimization of area utilization and manufacturability. Thus, the dynamic array is designed to optimize semiconductor manufacturing capabilities.

With regard to the definition of the underlying structure of the dynamic array, the dynamic array is built-up in a layered manner upon a base substrate 201, e.g., upon a silicon substrate, or silicon-on-insulator (SOI) substrate. Diffusion regions 203 are defined in the base substrate 201. The diffusion regions 203 represent selected regions of the base substrate 201 within which impurities are introduced for the purpose of modifying the electrical properties of the base substrate 201. Above the diffusion regions 203, diffusion contacts 205 are defined to enable connection between the diffusion regions 203 and conductor lines. For example, the diffusion contacts 205 are defined to enable connection between source and drain diffusion regions 203 and their respective conductor nets. Also, gate electrode features 207 are defined above the diffusion regions 203 to form transistor gates. Gate electrode contacts 209 are defined to enable connection between the gate electrode features 207 and conductor lines. For example, the gate electrode contacts 209 are defined to enable connection between transistor gates and their respective conductor nets.

Interconnect layers are defined above the diffusion contact 205 layer and the gate electrode contact layer 209. The interconnect layers include a first metal (metal 1) layer 211, a first via (via 1) layer 213, a second metal (metal 2) layer 215, a second via (via 2) layer 217, a third metal (metal 3) layer 219, a third via (via 3) layer 221, and a fourth metal (metal 4) layer 223. The metal and via layers enable definition of the desired circuit connectivity. For example, the metal and via layers enable electrical connection of the various diffusion contacts 205 and gate electrode contacts 209 such that the logic function of the circuitry is realized. It should be appreciated that the dynamic array architecture is not limited to a specific number of interconnect layers, i.e., metal and via layers. In one embodiment, the dynamic array may include additional interconnect layers 225, beyond the fourth metal (metal 4) layer 223. Alternatively, in another embodiment, the dynamic array may include less than four metal layers.

The dynamic array is defined such that layers (other than the diffusion region layer 203) are restricted with regard to layout feature shapes that can be defined therein. Specifically, in each layer other than the diffusion region layer 203, only linear-shaped layout features are allowed. A linear-shaped layout feature in a given layer is characterized as having a consistent vertical cross-section shape and extending in a single direction over the substrate. Thus, the linear-shaped layout features define structures that are one-dimensionally varying. The diffusion regions 203 are not required to be one-dimensionally varying, although they are allowed to be if necessary. Specifically, the diffusion regions 203 within the substrate can be defined to have any two-dimensionally varying shape with respect to a plane coincident with a top surface of the substrate. In one embodiment, the number of diffusion bend topologies is limited such that the interaction between the bend in diffusion and the conductive material, e.g., polysilicon, that forms the gate electrode of the transistor is predictable and can be accurately modeled. The linear-shaped layout features in a given layer are positioned to be parallel with respect to each other. Thus, the linear-shaped layout features in a given layer extend in a common direction over the substrate and parallel with the substrate.

The underlying layout methodology of the dynamic array uses constructive light interference of light waves in the lithographic process to reinforce exposure of neighboring shapes in a given layer. Therefore, the spacing of the parallel, linear-shaped layout features in a given layer is designed around the constructive light interference of the standing light waves such that lithographic correction (e.g., OPC/RET) is minimized or eliminated. Thus, in contrast to conventional OPC/RET-based lithographic processes, the dynamic array defined herein exploits the light interaction between neighboring features, rather than attempting to compensate for the light interaction between neighboring features.

Because the standing light wave for a given linear-shaped layout feature can be accurately modeled, it is possible to predict how the standing light waves associated with the neighboring linear-shaped layout features disposed in parallel in a given layer will interact. Therefore, it is possible to predict how the standing light wave used to expose one linear-shaped feature will contribute to the exposure of its neighboring linear-shaped features. Prediction of the light interaction between neighboring linear-shaped features enables the identification of an optimum feature-to-feature spacing such that light used to render a given shape will reinforce its neighboring shapes. The feature-to-feature spacing in a given layer is defined as the feature pitch, wherein the pitch is the center-to-center separation distance between adjacent linear-shaped features in a given layer.

To provide the desired exposure reinforcement between neighboring features, the linear-shaped layout features in a given layer are spaced such that constructive and destructive interference of the light from neighboring features will be optimized to produce the best rendering of all features in the neighborhood. The feature-to-feature spacing in a given layer is proportional to the wavelength of the light used to expose the features. The light used to expose each feature within about a five light wavelength distance from a given feature will serve to enhance the exposure of the given feature to some extent. The exploitation of constructive interference of the standing light waves used to expose neighboring features enables the manufacturing equipment capability to be maximized and not be limited by concerns regarding light interactions during the lithography process.

As discussed above, the dynamic array incorporates a restricted topology in which the features within each layer (other than diffusion) are required to be linear-shaped features that are oriented in a parallel manner to traverse over the substrate in a common direction. With the restricted topology of the dynamic array, the light interaction in the photolithography process can be optimized such that the printed image on the mask is essentially identical to the drawn shape in the layout, i.e., essentially a 100% accurate transfer of the layout onto the resist is achieved.

Figure 3A:
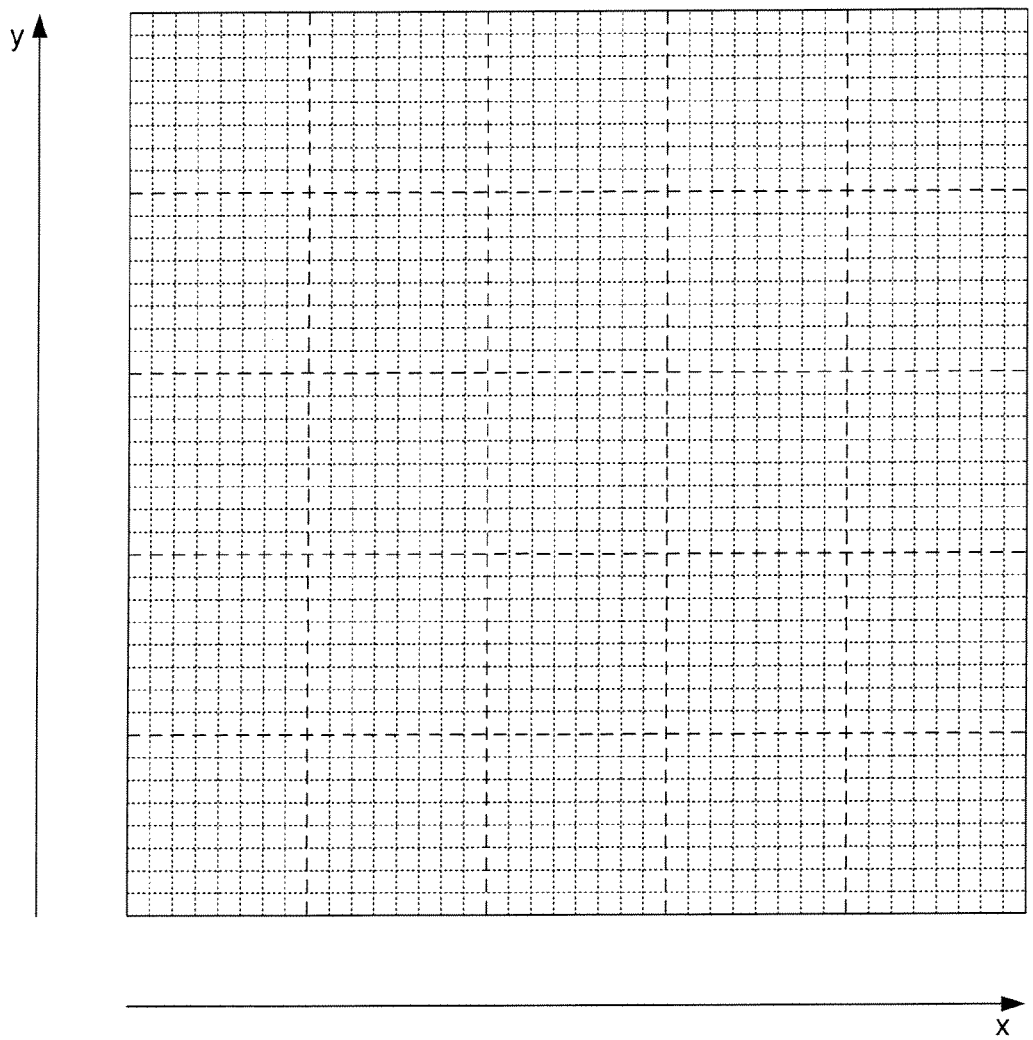
FIG. 3A is an illustration showing an exemplary base grid to be projected onto the dynamic array to facilitate definition of the restricted topology, in accordance with one embodiment of the present invention.

FIG. 3A is an illustration showing an exemplary base grid to be projected onto the dynamic array to facilitate definition of the restricted topology, in accordance with one embodiment of the present invention. The base grid can be used to facilitate parallel placement of the linear-shaped features in each layer of the dynamic array at the appropriate optimized pitch. Although not physically defined as part of the dynamic array, the base grid can be considered as a projection on each layer of the dynamic array. Also, it should be understood that the base grid is projected in a substantially consistent manner with respect to position on each layer of the dynamic array, thus facilitating accurate feature stacking and alignment.

Figure 3B:
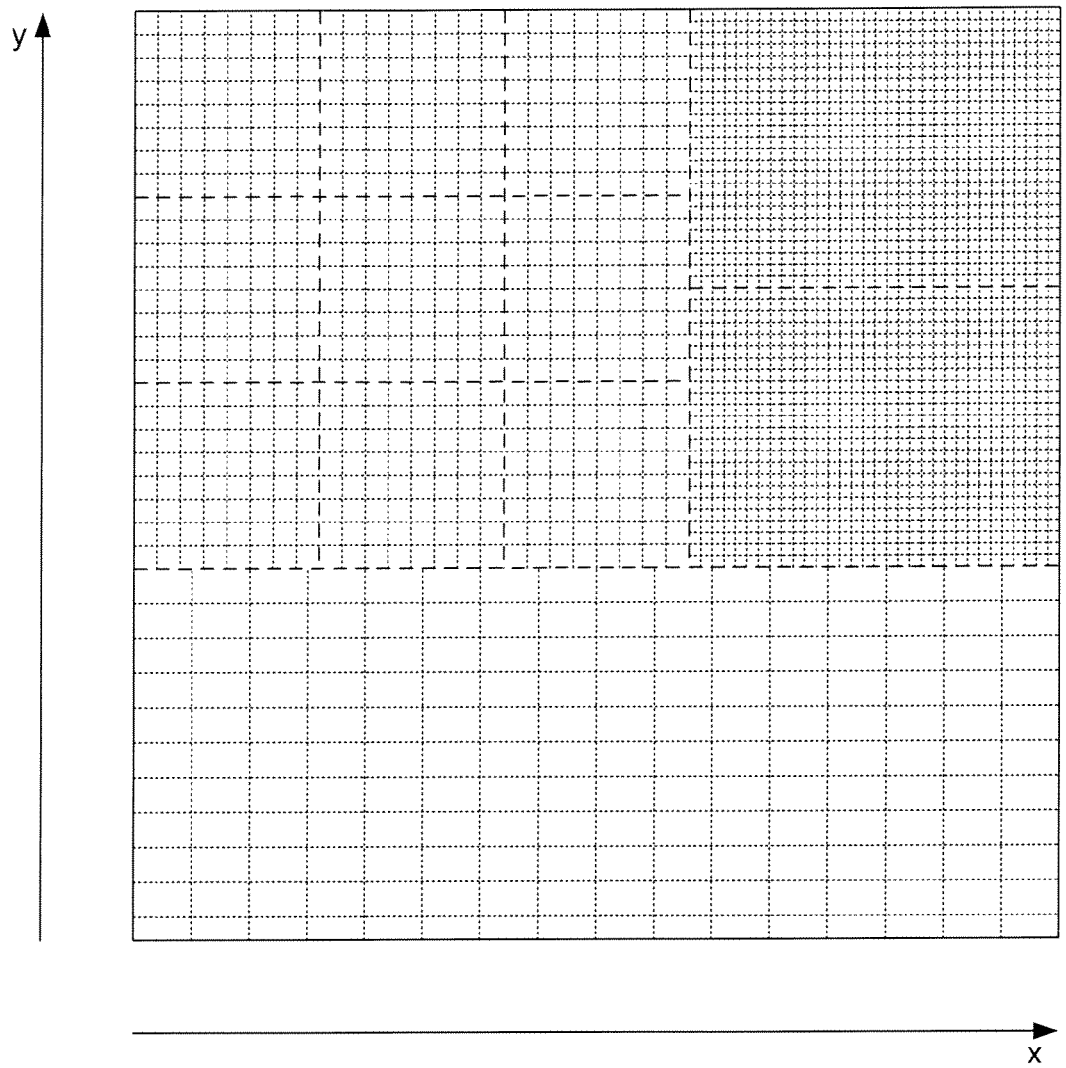
FIG. 3B is an illustration showing separate base grids projected across separate regions of the die, in accordance with an exemplary embodiment of the present invention.

In the exemplary embodiment of FIG. 3A, the base grid is defined as a rectangular grid, i.e., Cartesian grid, in accordance with a first reference direction (x) and a second reference direction (y). The gridpoint-to-gridpoint spacing in the first and second reference directions can be defined as necessary to enable definition of the linear-shaped features at the optimized feature-to-feature spacing. Also, the gridpoint spacing in the first reference direction (x) can be different than the gridpoint spacing in the second reference direction (y). In one embodiment, a single base grid is projected across the entire die to enable location of the various linear-shaped features in each layer across the entire die. However, in other embodiments, separate base grids can be projected across separate regions of the die to support different feature-to-feature spacing requirements within the separate regions of the die. FIG. 3B is an illustration showing separate base grids projected across separate regions of the die, in accordance with an exemplary embodiment of the present invention.

The base grid is defined with consideration for the light interaction function, i.e., the sinc function, and the manufacturing capability, wherein the manufacturing capability is defined by the manufacturing equipment and processes to be utilized in fabricating the dynamic array. With regard to the light interaction function, the base grid is defined such that the spacing between gridpoints enables alignment of peaks in the sinc functions describing the light energy projected upon neighboring gridpoints. Therefore, linear-shaped features optimized for lithographic reinforcement can be specified by drawing a line from a first gridpoint to a second gridpoint, wherein the line represents a rectangular structure of a given width. It should be appreciated that the various linear-shaped features in each layer can be specified according to their endpoint locations on the base grid and their width.

Figure 3C:
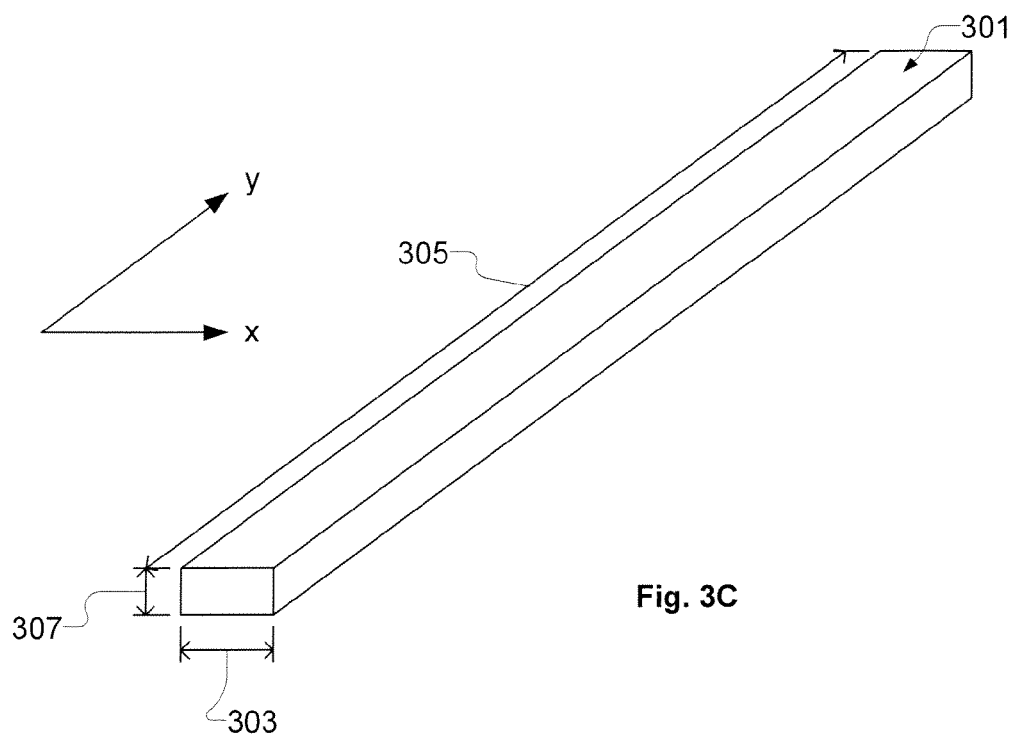
FIG. 3C is an illustration showing an exemplary linear-shaped feature defined to be compatible with the dynamic array, in accordance with one embodiment of the present invention.

FIG. 3C is an illustration showing an exemplary linear-shaped feature 301 defined to be compatible with the dynamic array, in accordance with one embodiment of the present invention. The linear-shaped feature 301 has a substantially rectangular cross-section defined by a width 303 and a height 307. The linear-shaped feature 301 extends in a linear direction to a length 305. In one embodiment, a cross-section of the linear-shaped feature, as defined by its width 303 and height 307, is substantially uniform along its length 305. It should be understood, however, that lithographic effects may cause a rounding of the ends of the linear-shaped feature 301. The first and second reference directions (x) and (y), respectively, of FIG. 3A are shown to illustrate an exemplary orientation of the linear-shaped feature on the dynamic array. It should be appreciated that the linear-shaped feature may be oriented to have its length 305 extend in either the first reference direction (x), the second reference direction (y), or in diagonal direction defined relative to the first and second reference directions (x) and (y). Regardless of the linear-shaped features' particular orientation with respect to the first and second reference directions (x) and (y), it should be understood that the linear-shaped feature is defined in a plane that is substantially parallel to a top surface of the substrate upon which the dynamic array is built. Also, it should be understood that the linear-shaped feature is free of bends, i.e., change in direction, in the plane defined by the first and second reference directions.

Figure 3D:
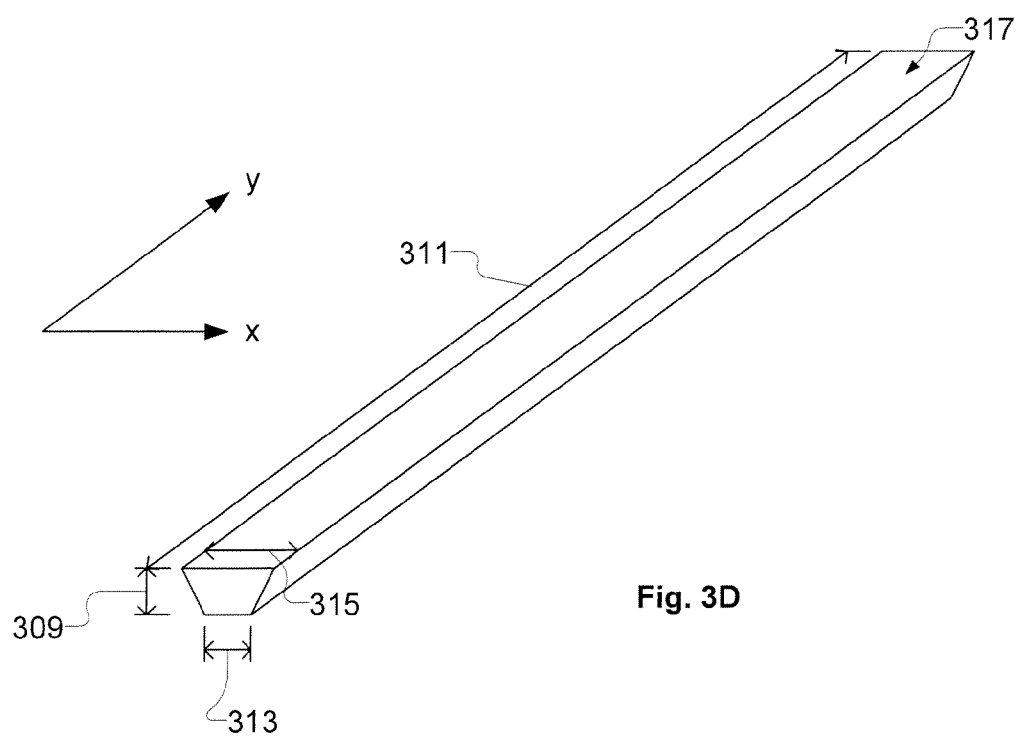
FIG. 3D is an illustration showing another exemplary linear-shaped feature defined to be compatible with the dynamic array, in accordance with one embodiment of the present invention.

FIG. 3D is an illustration showing another exemplary linear-shaped feature 317 defined to be compatible with the dynamic array, in accordance with one embodiment of the present invention. The linear-shaped feature 317 has a trapezoidal cross-section defined by a lower width 313, an upper width 315, and a height 309. The linear-shaped feature 317 extends in a linear direction to a length 311. In one embodiment, the cross-section of the linear-shaped feature 317 is substantially uniform along its length 311. It should be understood, however, that lithographic effects may cause a rounding of the ends of the linear-shaped feature 317. The first and second reference directions (x) and (y), respectively, of FIG. 3A are shown to illustrate an exemplary orientation of the linear-shaped feature on the dynamic array. It should be appreciated that the linear-shaped feature 317 may be oriented to have its length 311 extend in either the first reference direction (x), the second reference direction (y), or in diagonal direction defined relative to the first and second reference directions (x) and (y). Regardless of the particular orientation of the linear-shaped feature 317 with regard to the first and second reference directions (x) and (y), it should be understood that the linear-shaped feature 317 is defined in a plane that is substantially parallel to a top surface of the substrate upon which the dynamic array is built. Also, it should be understood that the linear-shaped feature 317 is free of bends, i.e., change in direction, in the plane defined by the first and second reference directions.

Although FIGS. 3C and 3D explicitly discuss linear shaped features having rectangular and trapezoidal cross-sections, respectively, it should be understood that the linear shaped features having other types of cross-sections can be defined within the dynamic array. Therefore, essentially any suitable cross-sectional shape of the linear-shaped feature can be utilized so long as the linear-shaped feature is defined to have a length that extends in one direction, and is oriented to have its length extend in either the first reference direction (x), the second reference direction (y), or in diagonal direction defined relative to the first and second reference directions (x) and (y).

The layout architecture of the dynamic array follows the base grid pattern. Thus, it is possible to use grid points to represent where changes in direction occur in diffusion, wherein gate electrode and metal linear-shaped features are placed, where contacts are placed, where opens are in the linear-shaped gate electrode and metal features, etc. The pitch of the gridpoints, i.e., the gridpoint-to-gridpoint spacing, should be set for a given feature line width, e.g., width 303 in FIG. 3C, such that exposure of neighboring linear-shaped features of the given feature line width will reinforce each other, wherein the linear-shaped features are centered on gridpoints. With reference to the dynamic array stack of FIG. 2 and the exemplary base grid of FIG. 3A, in one embodiment, the gridpoint spacing in the first reference direction (x) is set by the required gate electrode gate pitch. In this same embodiment, the gridpoint pitch in the second reference direction (y) is set by the metal 1 and metal 3 pitch. For example, in a 90 nm process technology, i.e., minimum feature size equal to 90 nm, the gridpoint pitch in the second reference direction (y) is about 0.24 micron. In one embodiment, metal 1 and metal 2 layers will have a common spacing and pitch. A different spacing and pitch may be used above the metal 2 layer.

The various layers of the dynamic array are defined such that the linear-shaped features in adjacent layers extend in a crosswise manner with respect to each other. For example, the linear-shaped features of adjacent layers may extend orthogonally, i.e., perpendicularly with respect to each other. Also, the linear-shaped features of one layer may extend across the linear-shaped features of an adjacent layer at an angle, e.g., at about 45 degrees. For example, in one embodiment the linear-shaped feature of one layer extend in the first reference direction (x) and the linear-shaped features of the adjacent layer extend diagonally with respect to the first (x) and second (y) reference directions. It should be appreciated that to route a design in the dynamic array having the linear-shaped features positioned in the crosswise manner in adjacent layers, opens can be defined in the linear-shaped features, and contacts and vias can be defined as necessary.

The dynamic array minimizes the use of bends in layout shapes to eliminate unpredictable lithographic interactions. Specifically, prior to OPC or other RET processing, the dynamic array allows bends in the diffusion layer to enable control of device sizes, but does not allow bends in layers above the diffusion layer. The layout features in each layer above the diffusion layer are linear in shape, e.g., FIG. 3C, and disposed in a parallel relationship with respect to each other. The linear shapes and parallel positioning of layout features are implemented in each stack layer of the dynamic array where predictability of constructive light interference is necessary to ensure manufacturability. In one embodiment, the linear shapes and parallel positioning of layout features are implemented in the dynamic array in each layer above diffusion through metal 2. Above metal 2, the layout features may be of sufficient size and shape that constructive light interference is not required to ensure manufacturability. However, the presence of constructive light interference in patterning layout features above metal 2 may be beneficial.

An exemplary buildup of dynamic array layers from diffusion through metal 2 are described with respect to FIGS. 4 through 14. It should be appreciated that the dynamic array described with respect to FIGS. 4 through 14 is provided by way of example only, and is not intended to convey limitations of the dynamic array architecture. The dynamic array can be used in accordance with the principles presented herein to define essentially any integrated circuit design.

Figure 4:
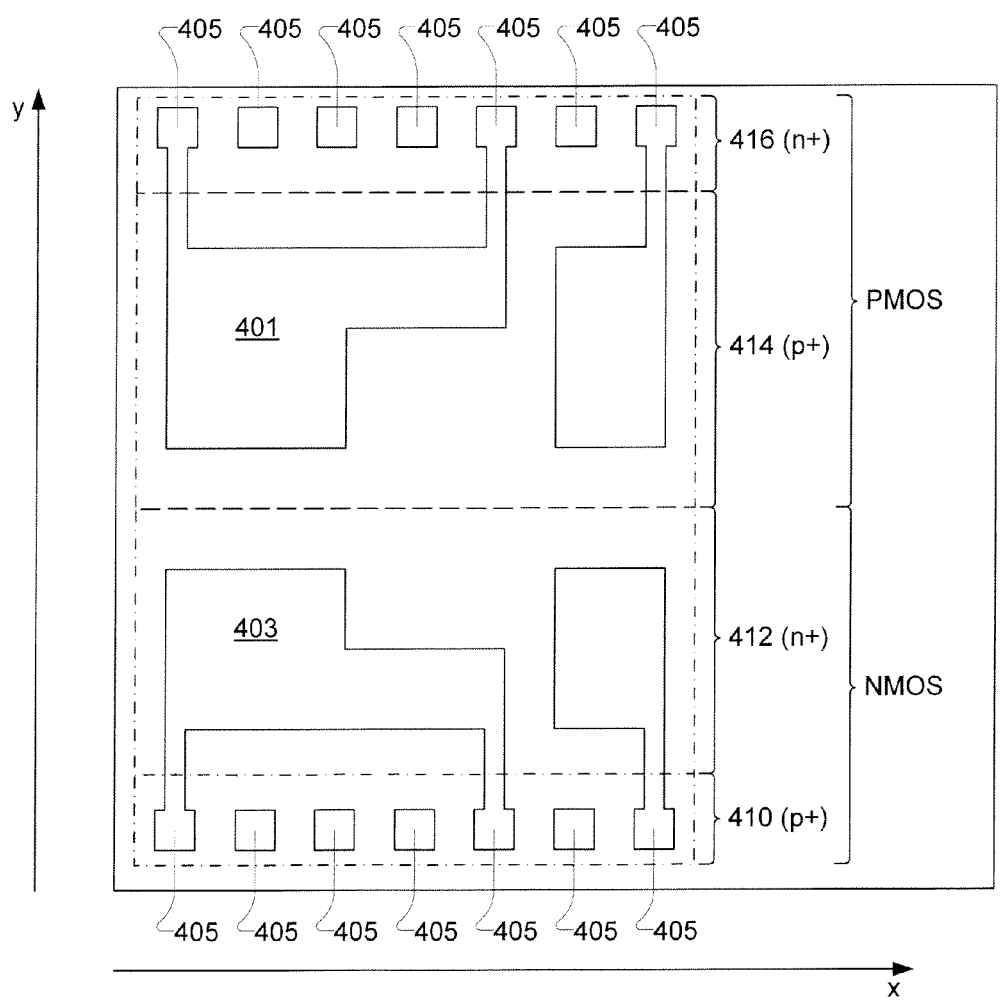
FIG. 4 is an illustration showing a diffusion layer layout of an exemplary dynamic array, in accordance with one embodiment of the present invention.

FIG. 4 is an illustration showing a diffusion layer layout of an exemplary dynamic array, in accordance with one embodiment of the present invention. The diffusion layer of FIG. 4 shows a p-diffusion region 401 and an n-diffusion region 403. While the diffusion regions are defined according to the underlying base grid, the diffusion regions are not subject to the linear-shaped feature restrictions associated with the layers above the diffusion layer. The diffusion regions 401 and 403 include diffusion squares 405 defined where diffusion contacts will be located. The diffusion regions 401 and 403 do not include extraneous jogs or corners, thus improving the use of lithographic resolution and enabling more accurate device extraction. Additionally, n+ mask regions (412 and 416) and p+ mask regions (410 and 414) are defined as rectangles on the (x), (y) grid with no extraneous jogs or notches. This style permits use of larger diffusion regions, eliminates need for OPC/RET, and enables use of lower resolution and lower cost lithographic systems, e.g., i-line illumination at 365 nm. It should be appreciated that the n+ mask region 416 and the p+ mask region 410, as depicted in FIG. 4, are for an embodiment that does not employ well-biasing. In an alternative embodiment where well-biasing is to be used, the n+ mask region 416 shown in FIG. 4 will actually be defined as a p+ mask region. Also, in this alternative embodiment, the p+ mask region 410 shown in FIG. 4 will actually be defined as a n+ mask region.

Figure 5:
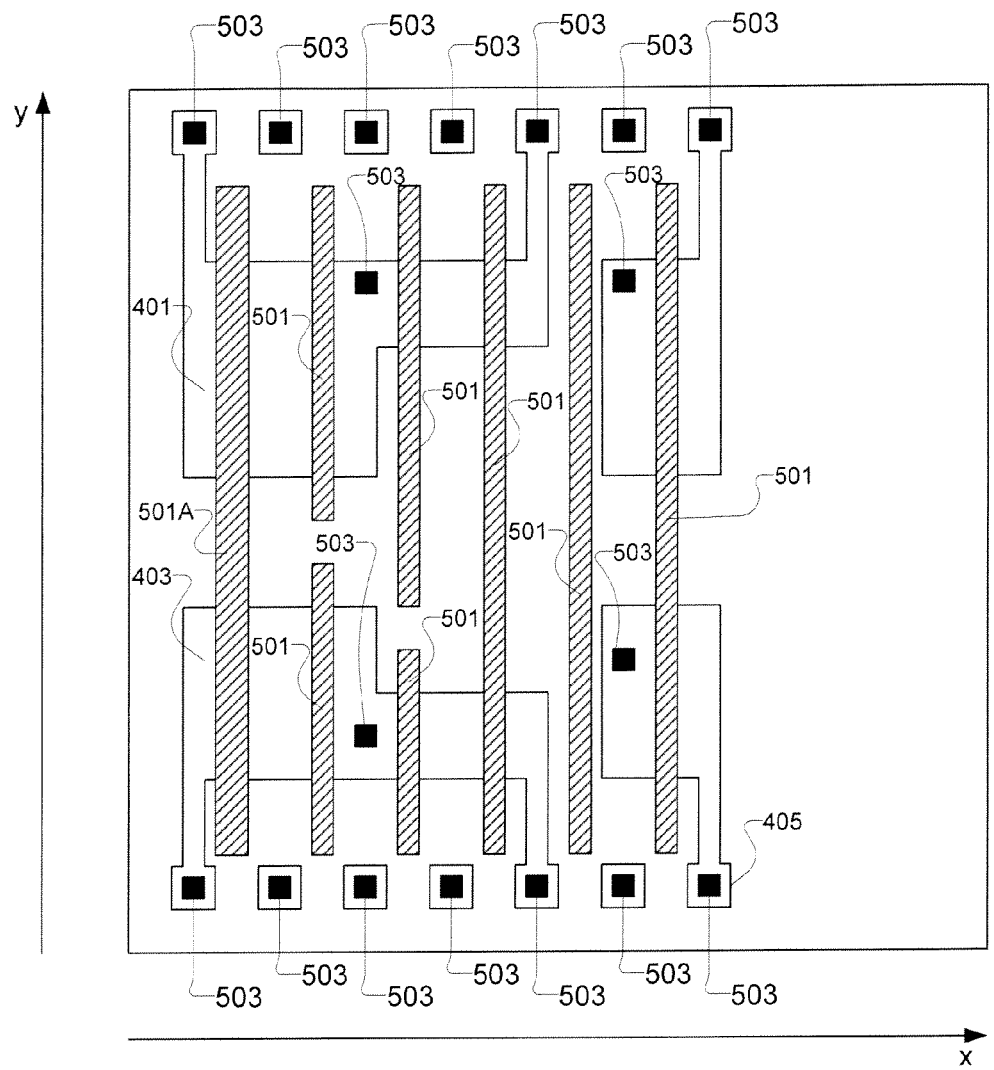
FIG. 5 is an illustration showing a gate electrode layer and a diffusion contact layer above and adjacent to the diffusion layer of FIG. 4, in accordance with one embodiment of the present invention.

FIG. 5 is an illustration showing a gate electrode layer and a diffusion contact layer above and adjacent to the diffusion layer of FIG. 4, in accordance with one embodiment of the present invention. As those skilled in the CMOS arts will appreciate, the gate electrode features 501 define the transistor gates. The gate electrode features 501 are defined as linear shaped features extending in a parallel relationship across the dynamic array in the second reference direction (y). In one embodiment, the gate electrode features 501 are defined to have a common width. However, in another embodiment, one or more of the gate electrode features can be defined to have a different width. For example, FIG. 5 shows a gate electrode features 501A that has a larger width relative to the other gate electrode features 501. The pitch (center-to-center spacing) of the gate electrode features 501 is minimized while ensuring optimization of lithographic reinforcement, i.e., resonant imaging, provided by neighboring gate electrode features 501. For discussion purposes, gate electrode features 501 extending across the dynamic array in a given line are referred to as a gate electrode track.

The gate electrode features 501 form n-channel and p-channel transistors as they cross the diffusion regions 403 and 401, respectively. Optimal gate electrode feature 501 printing is achieved by drawing gate electrode features 501 at every grid location, even though no diffusion region may be present at some grid locations. Also, long continuous gate electrode features 501 tend to improve line end shortening effects at the ends of gate electrode features within the interior of the dynamic array. Additionally, gate electrode printing is significantly improved when all bends are removed from the gate electrode features 501.

Each of the gate electrode tracks may be interrupted, i.e., broken, any number of times in linearly traversing across the dynamic array in order to provide required electrical connectivity for a particular logic function to be implemented. When a given gate electrode track is required to be interrupted, the separation between ends of the gate electrode track segments at the point of interruption is minimized to the extent possible taking into consideration the manufacturing capability and electrical effects. In one embodiment, optimal manufacturability is achieved when a common end-to-end spacing is used between features within a particular layer.

Minimizing the separation between ends of the gate electrode track segments at the points of interruption serves to maximize the lithographic reinforcement, and uniformity thereof, provided from neighboring gate electrode tracks. Also, in one embodiment, if adjacent gate electrode tracks need to be interrupted, the interruptions of the adjacent gate electrode tracks are made such that the respective points of interruption are offset from each other so as to avoid, to the extent possible, an occurrence of neighboring points of interruption. More specifically, points of interruption within adjacent gate electrode tracks are respectively positioned such that a line of sight does not exist through the points of interruption, wherein the line of sight is considered to extend perpendicularly to the direction in which the gate electrode tracks extend over the substrate. Additionally, in one embodiment, the gate electrodes may extend through the boundaries at the top and bottom of the cells, i.e., the PMOS or NMOS cells. This embodiment would enable bridging of neighboring cells.

With further regard to FIG. 5, diffusion contacts 503 are defined at each diffusion square 405 to enhance the printing of diffusion contacts via resonant imaging. The diffusion squares 405 are present around every diffusion contact 503 to enhance the printing of the power and ground connection polygons at the diffusion contacts 503.

The gate electrode features 501 and diffusion contacts 503 share a common grid spacing. More specifically, the gate electrode feature 501 placement is offset by one-half the grid spacing relative to the diffusion contacts 503. For example, if the gate electrode features 501 and diffusion contact 503 grid spacing is 0.36 μm, then the diffusion contacts are placed such that the x-coordinate of their center falls on an integer multiple of 0.36 μm, while the x-coordinate of the center of each gate electrode feature 501 minus 0.18 μm should be an integer multiple of 0.36 μm. In the present example, the x-coordinates are represented by the following:

Diffusion contact center x-coordinate=I*0.36 μm, where I is the grid number;

Gate electrode feature center x-coordinate=0.18 μm+I*0.36 μm, where I is the grid number.

The grid based system of the dynamic array ensures that all contacts (diffusion and gate electrode) will land on a horizontal grid that is equal to a multiple of one-half of the diffusion contact grid and a vertical grid that is set by the metal 1 pitch. In the example above, the gate electrode feature and diffusion contact grid is 0.36 μm. The diffusion contacts and gate electrode contacts will land on a horizontal grid that is a multiple of 0.18 μm. Also, the vertical grid for 90 nm process technologies is about 0.24 μm.

Figure 6:
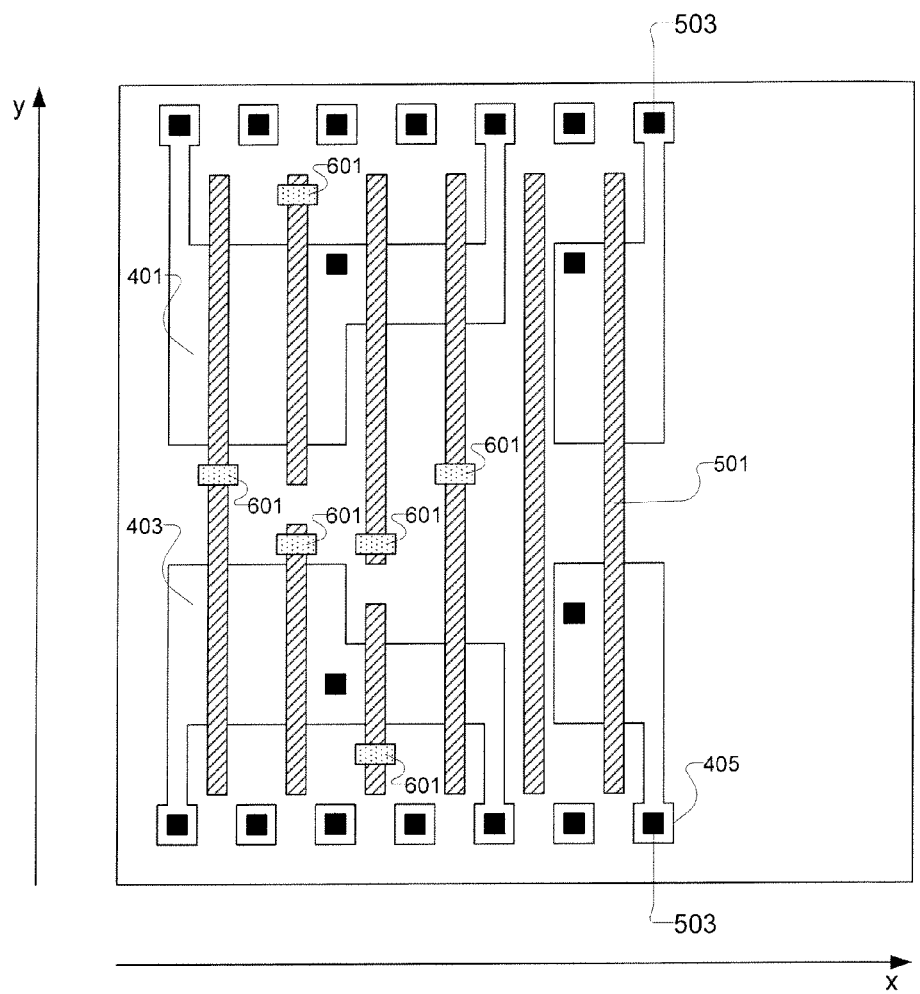
FIG. 6 is an illustration showing a gate electrode contact layer defined above and adjacent to the gate electrode layer of FIG. 5, in accordance with one embodiment of the present invention.

FIG. 6 is an illustration showing a gate electrode contact layer defined above and adjacent to the gate electrode layer of FIG. 5, in accordance with one embodiment of the present invention. In the gate electrode contact layer, gate electrode contacts 601 are drawn to enable connection of the gate electrode features 501 to the overlying metal conduction lines. In general, design rules will dictate the optimum placement of the gate electrode contacts 601. In one embodiment, the gate electrode contacts are drawn on top of the transistor endcap regions. This embodiment minimizes white space in the dynamic array when design rules specify long transistor endcaps. In some process technologies white space may be minimized by placing a number of gate electrode contacts for a cell in the center of the cell. Also, it should be appreciated that in the present invention, the gate electrode contact 601 is oversized in the direction perpendicular to the gate electrode feature 501 to ensure overlap between the gate electrode contact 601 and the gate electrode feature 501.

Figure 6A:
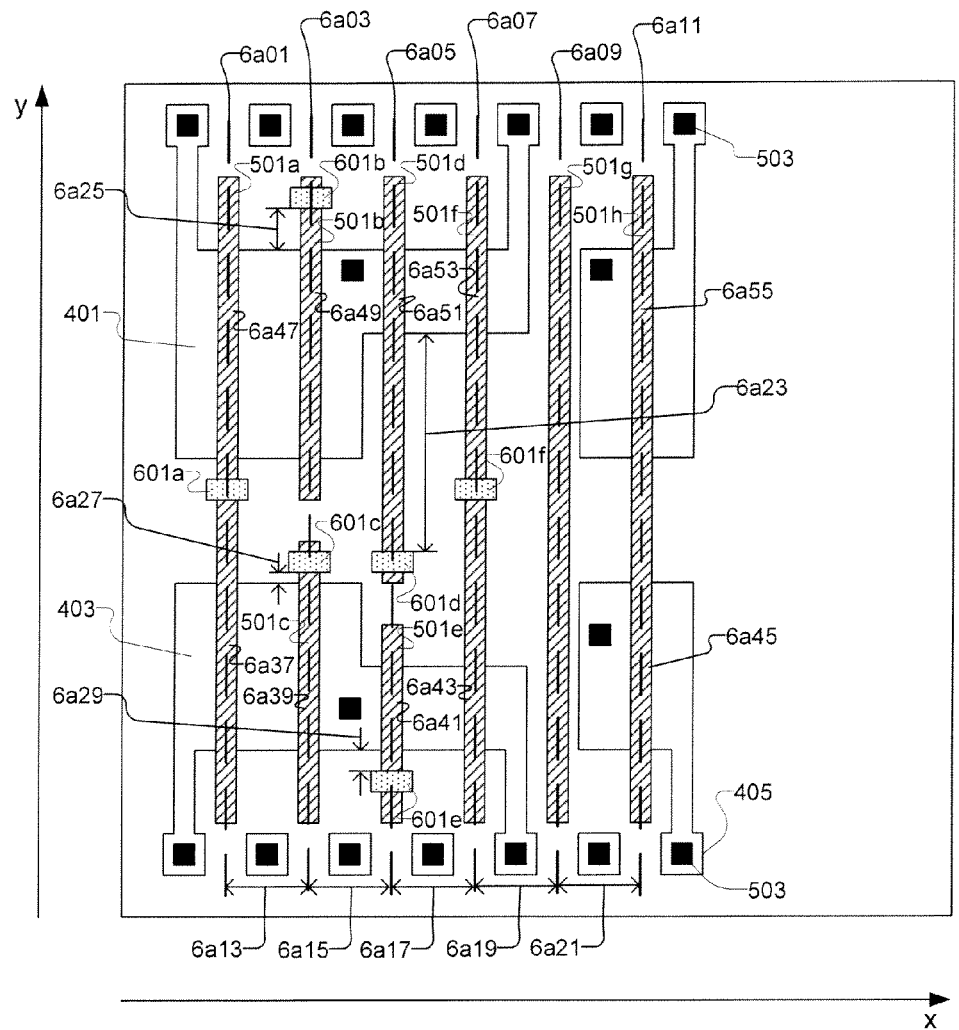
FIGS. 6A-6E show annotated versions of FIG. 6.

FIG. 6A shows an annotated version of FIG. 6. The features depicted in FIG. 6A are exactly the same as the features depicted in FIG. 6. FIG. 6A shows a first conductive gate level structure 501a having a lengthwise centerline 6a01. FIG. 6A shows a second conductive gate level structure 501b and a third conductive gate level structure 501c having a lengthwise centerline 6a03. FIG. 6A shows a fourth conductive gate level structure 501d and a fifth conductive gate level structure 501e having the lengthwise centerline 6a05. FIG. 6A shows a sixth conductive gate level structure 501f having a lengthwise centerline 6a07. FIG. 6A shows a seventh conductive gate level structure 501g having a lengthwise centerline 6a09. FIG. 6A shows an eighth conductive gate level structure 501h having a lengthwise centerline 6a11.

FIG. 6A shows the first conductive gate level structure 501a separated from each of the second conductive gate level structure 501b and third conductive gate level structure 501c by a centerline-to-centerline spacing 6a13 as measured in a direction perpendicular to the parallel direction of the gate level structures. FIG. 6A shows the second conductive gate level structure 501b separated from the fourth conductive gate level structure 501d by a centerline-to-centerline spacing 6a15 as measured in the direction perpendicular to the parallel direction of the gate level structures. FIG. 6A shows the third conductive gate level structure 501c separated from the fifth conductive gate level structure 501e by a centerline-to-centerline spacing 6a15 as measured in the direction perpendicular to the parallel direction of the gate level structures. FIG. 6A shows the sixth conductive gate level structure 501f separated from each of the fourth conductive gate level structure 501d and fifth conductive gate level structure 501e by a centerline-to-centerline spacing 6a17 as measured in the direction perpendicular to the parallel direction of the gate level structures. FIG. 6A shows the sixth conductive gate level structure 501f separated from the seventh conductive gate level structure 501g by a centerline-to-centerline spacing 6a19 as measured in the direction perpendicular to the parallel direction of the gate level structures. FIG. 6A shows the seventh conductive gate level structure 501g separated from the eighth conductive gate level structure 501h by a centerline-to-centerline spacing 6a21 as measured in the direction perpendicular to the parallel direction of the gate level structures.

FIG. 6A shows the first conductive gate level structure 501a forming a gate electrode of a transistor 6a47 of a first transistor type and a gate electrode of a transistor 6a37 of a second transistor type. FIG. 6A shows the second conductive gate level structure 501b forming a gate electrode of a transistor 6a49 of the first transistor type. FIG. 6A shows the third conductive gate level structure 501c forming a gate electrode of a transistor 6a39 of the second transistor type. FIG. 6A shows the fourth conductive gate level structure 501d forming a gate electrode of a transistor 6a51 of the first transistor type. FIG. 6A shows the fifth conductive gate level structure 501e forming a gate electrode of a transistor 6a41 of the second transistor type. FIG. 6A shows the sixth conductive gate level structure 501f forming a gate electrode of a transistor 6a53 of the first transistor type and a gate electrode of a transistor 6a43 of the second transistor type. FIG. 6A shows the seventh conductive gate level structure 501g not forming a gate electrode of a transistor. FIG. 6A shows the eighth conductive gate level structure 501h forming a gate electrode of a transistor 6a55 of the first transistor type and a gate electrode of a transistor 6a45 of the second transistor type.

FIG. 6A shows the contact 601a connected to the first conductive gate level structure 501a. FIG. 6A shows the contact 601b connected to the second conductive gate level structure 501b. FIG. 6A shows the contact 601c connected to the third conductive gate level structure 501c. FIG. 6A shows the contact 601d connected to the fourth conductive gate level structure 501d. FIG. 6A shows the contact 601e connected to the fifth conductive gate level structure 501e. FIG. 6A shows the contact 601f connected to the sixth conductive gate level structure 501f.

FIG. 6A shows the contact 601b positioned to contact the second conductive gate level structure 501b at a contact-to-gate distance 6a25 from a gate electrode of the transistor 6a49. FIG. 6A shows the contact 601c positioned to contact the third conductive gate level structure 501c at a contact-to-gate distance 6a27 from a gate electrode of the transistor 6a39. FIG. 6A shows the contact 601d positioned to contact the fourth conductive gate level structure 501d at a contact-to-gate distance 6a23 from a gate electrode of the transistor 6a51. FIG. 6A shows the contact 601e positioned to contact the fifth conductive gate level structure 501e at a contact-to-gate distance 6a29 from a gate electrode of the transistor 6a41.

Figure 6B:
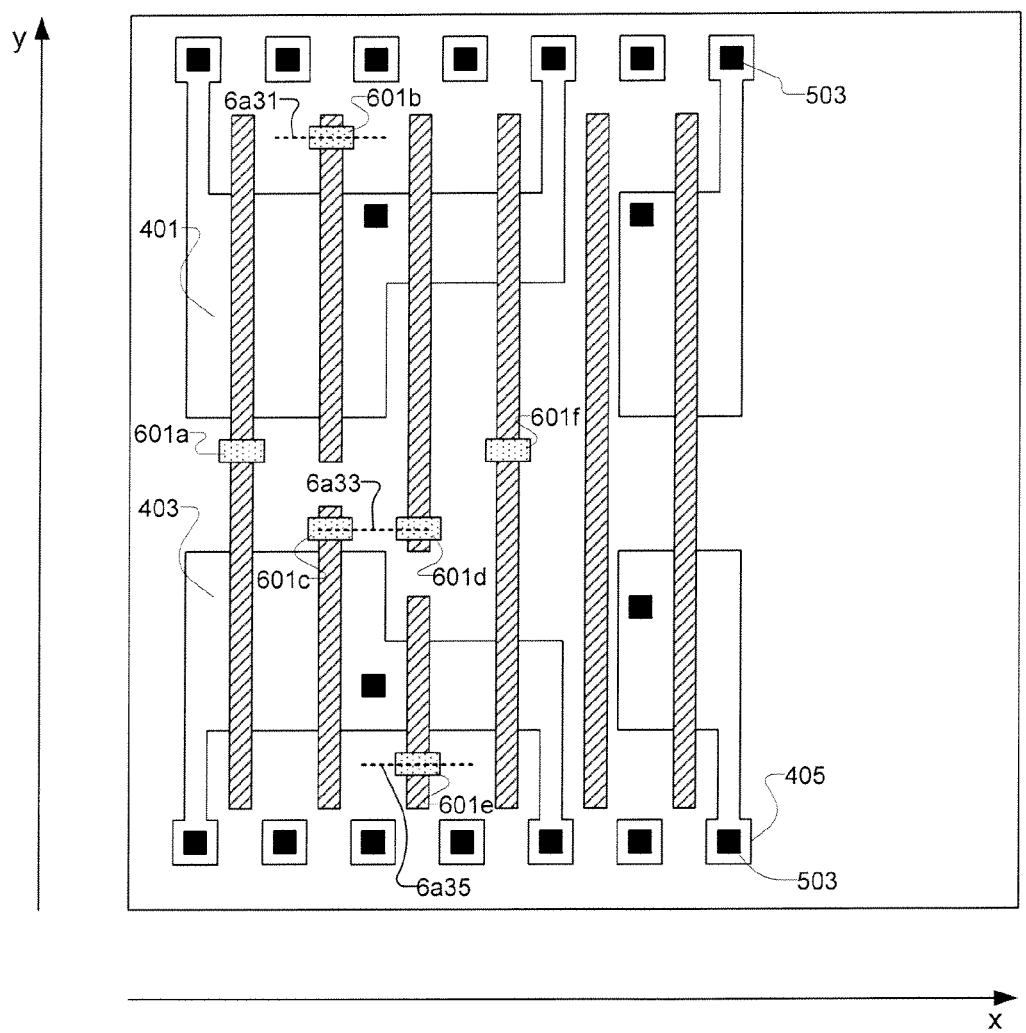

FIG. 6B shows an annotated version of FIG. 6. The features depicted in FIG. 6B are exactly the same as the features depicted in FIG. 6. FIG. 6B shows the contact 601b located at a contact position 6a31 in the parallel direction of the conductive gate level structures, i.e., in the y direction. FIG. 6B shows the contact 601c and the contact 601d located at a contact position 6a33 in the parallel direction of the conductive gate level structures. FIG. 6B shows the contact 601e located at a contact position 6a35 in the parallel direction of the conductive gate level structures. FIG. 6B shows the contacts 601b and 601e positioned outside the diffusion regions 401 and 403 of different diffusion region types. FIG. 6B shows the contacts 601c and 601d positioned between the diffusion regions 401 and 403 of different diffusion region types, i.e., positioned over the inner non-diffusion region between the diffusion regions 401 and 403 of different diffusion region types.

Figure 6C:
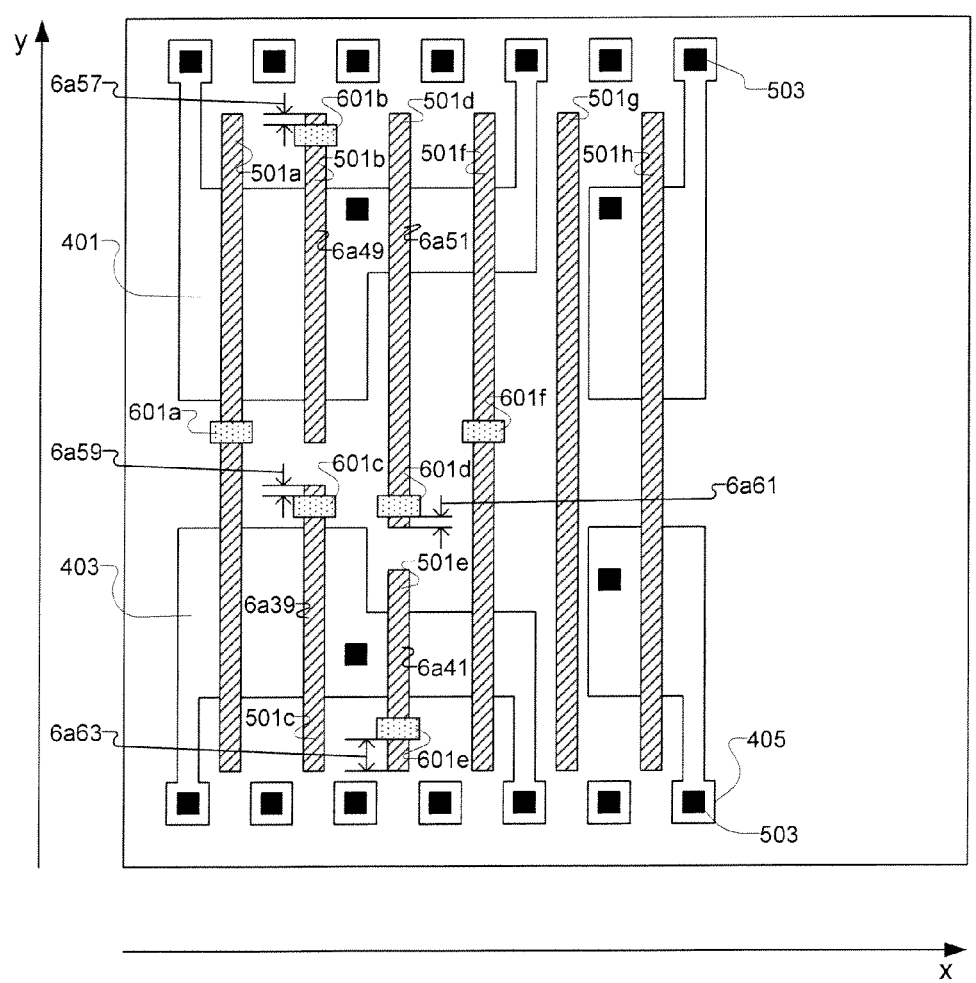

FIG. 6C shows an annotated version of FIG. 6. The features depicted in FIG. 6C are exactly the same as the features depicted in FIG. 6. FIG. 6C shows the second conductive gate level structure 501b extending a distance 6a57 beyond the contact 601b in the parallel direction (y-direction) away from the gate electrode of the transistor 6a49. FIG. 6C shows the third conductive gate level structure 501c extending a distance 6a59 beyond the contact 601c in the parallel direction (y-direction) away from the gate electrode of the transistor 6a39. FIG. 6C shows the fourth conductive gate level structure 501d extending a distance 6a61 beyond the contact 601d in the parallel direction (y-direction) away from the gate electrode of the transistor 6a51. FIG. 6C shows the fifth conductive gate level structure 501e extending a distance 6a63 beyond the contact 601e in the parallel direction (y-direction) away from the gate electrode of the transistor 6a41.

Figure 6D:
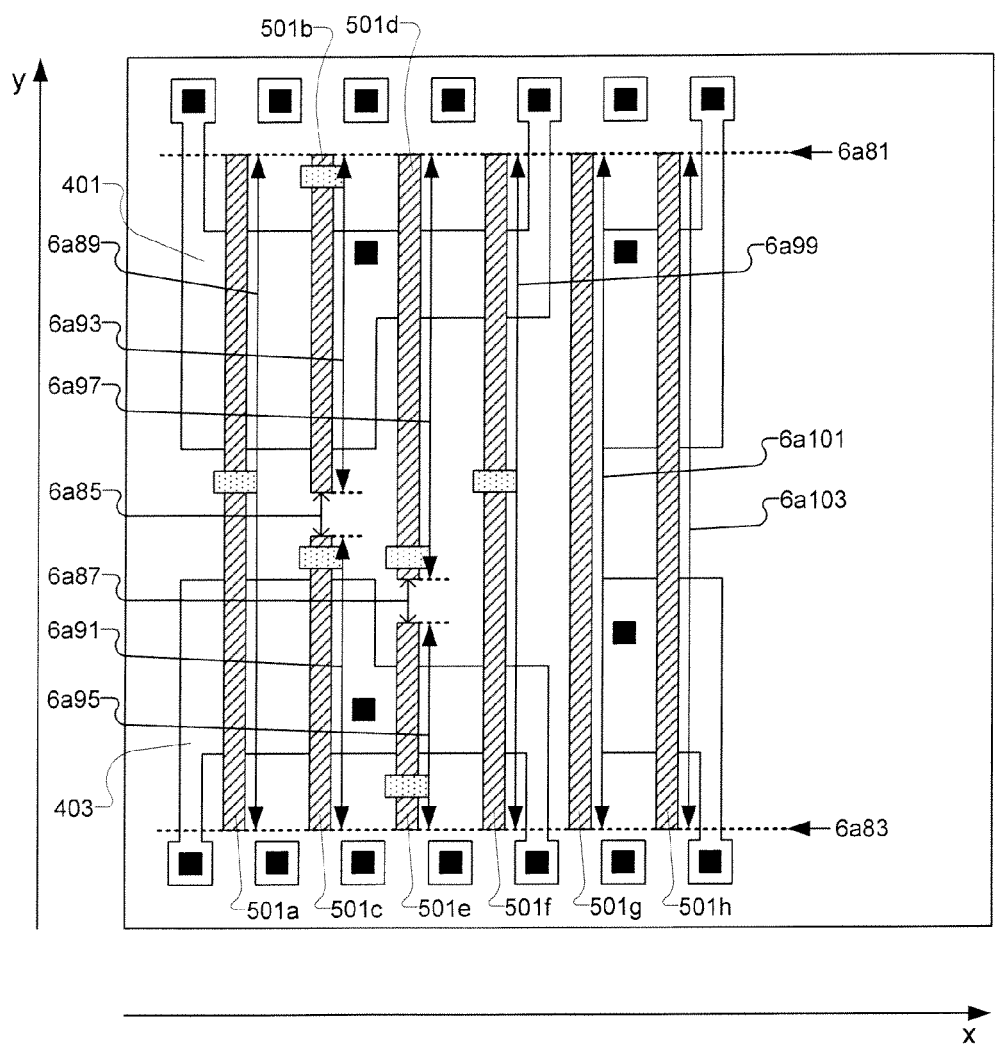

FIG. 6D shows an annotated version of FIG. 6. The features depicted in FIG. 6D are exactly the same as the features depicted in FIG. 6. FIG. 6D shows the first conductive gate level structure 501a defined to have a length 6a89 as measured in the parallel direction (y-direction). FIG. 6D shows the second conductive gate level structure 501b defined to have a length 6a93 as measured in the parallel direction (y-direction). FIG. 6D shows the third conductive gate level structure 501c defined to have a length 6a91 as measured in the parallel direction (y-direction). FIG. 6D shows the fourth conductive gate level structure 501d defined to have a length 6a97 as measured in the parallel direction (y-direction). FIG. 6D shows the fifth conductive gate level structure 501e defined to have a length 6a95 as measured in the parallel direction (y-direction). FIG. 6D shows the sixth conductive gate level structure 501f defined to have a length 6a99 as measured in the parallel direction (y-direction). FIG. 6D shows the seventh conductive gate level structure 501g defined to have a length 6a101 as measured in the parallel direction (y-direction). FIG. 6D shows the eighth conductive gate level structure 501h defined to have a length 6a103 as measured in the parallel direction (y-direction).

FIG. 6D shows the second conductive gate level structure 501b positioned in a spaced apart end-to-end manner with the third conductive gate level structure 501c. FIG. 6D shows the second conductive gate level structure 501b separated from the third conductive gate level structure 501c by a first end-to-end spacing 6a85 as measured in the parallel direction (y-direction). FIG. 6D shows the fourth conductive gate level structure 501d positioned in a spaced apart end-to-end manner with the fifth conductive gate level structure 501e. FIG. 6D shows the fourth conductive gate level structure 501d separated from the fifth conductive gate level structure 501e by a second end-to-end spacing 6a87 as measured in the parallel direction (y-direction). FIG. 6D shows the first end-to-end spacing 6a85 positioned over the inner non-diffusion region between the two diffusion regions 401 and 403 of different diffusion types. FIG. 6D shows the second end-to-end spacing 6a87 positioned over the inner non-diffusion region between the two diffusion regions 401 and 403 of different diffusion types. FIG. 6D shows the first end-to-end spacing 6a85 offset in the parallel direction (y-direction) from the second end-to-end spacing 6a87.

FIG. 6D shows the first, second, fourth, sixth, seventh, and eighth conductive gate level structures 501a, 501b, 501d, 501f, 501g, 501h, respectively, each having an end aligned with a first common position 6a81 in the parallel direction (y-direction). FIG. 6D shows the first, third, fifth, sixth, seventh, and eighth conductive gate level structures 501a, 501c, 501e, 501f, 501g, 501h, respectively, each having an end aligned with a second common position 6a83 in the parallel direction (y-direction).

Figure 6E:
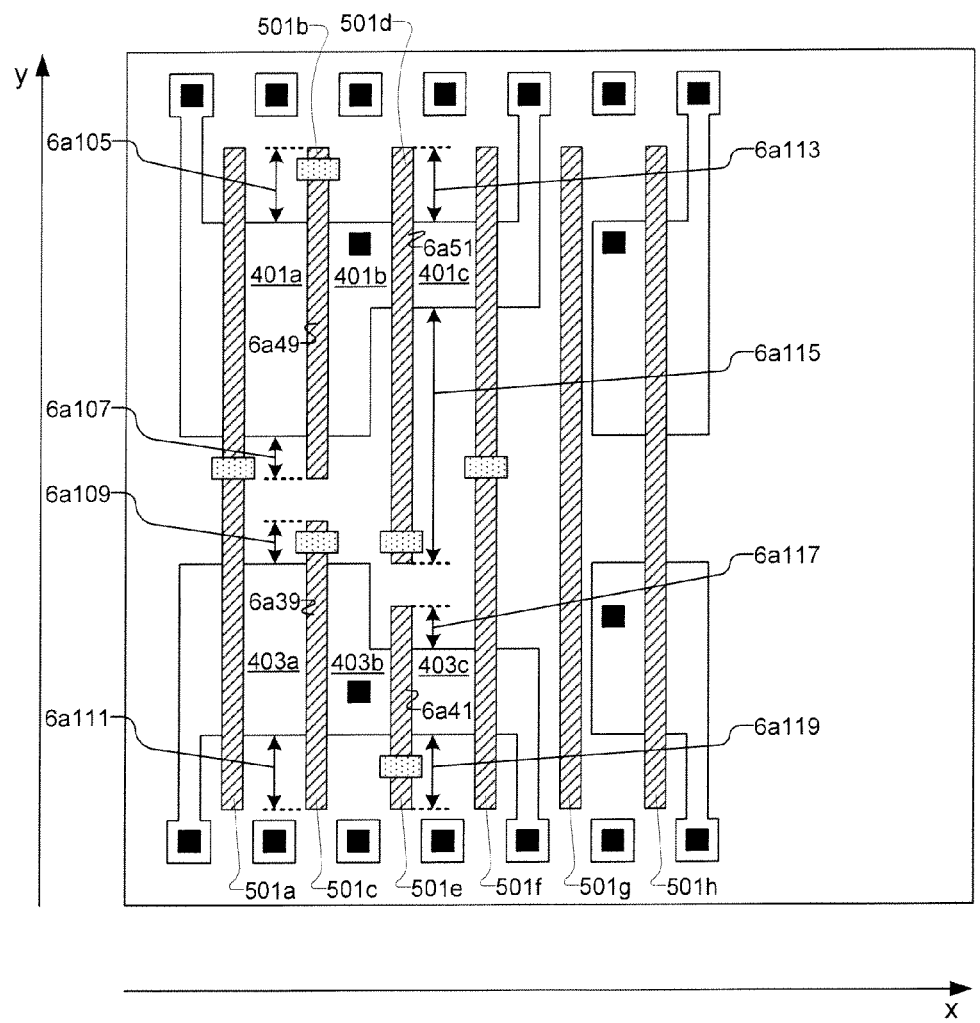

FIG. 6E shows an annotated version of FIG. 6. The features depicted in FIG. 6E are exactly the same as the features depicted in FIG. 6. FIG. 6E shows the second conductive gate level feature 501b having an outer extension distance 6a105 as measured in the parallel direction (y-direction) away from the gate electrode of the transistor 6a49 and away from the transistor 6a39. FIG. 6E shows the second conductive gate level feature 501b having an inner extension distance 6a107 as measured in the parallel direction (y-direction) away from the gate electrode of the transistor 6a49 and toward the transistor 6a39. FIG. 6E shows the third conductive gate level feature 501c having an outer extension distance 6a111 as measured in the parallel direction (y-direction) away from the gate electrode of the transistor 6a39 and away from the transistor 6a49. FIG. 6E shows the third conductive gate level feature 501c having an inner extension distance 6a109 as measured in the parallel direction (y-direction) away from the gate electrode of the transistor 6a39 and toward the transistor 6a49.

Figure 7A:
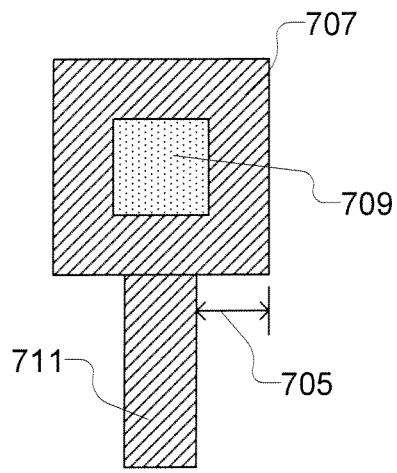
FIG. 7A is an illustration showing a traditional approach for making contact to the gate electrode.

FIG. 6E shows the fourth conductive gate level feature 501d having an outer extension distance 6a113 as measured in the parallel direction (y-direction) away from the gate electrode of the transistor 6a51 and away from the transistor 6a41. FIG. 6E shows the fourth conductive gate level feature 501d having an inner extension distance 6a115 as measured in the parallel direction (y-direction) away from the gate electrode of the transistor 6a51 and toward the transistor 6a41. FIG. 6E shows the fifth conductive gate level feature 501e having an outer extension distance 6a119 as measured in the parallel direction (y-direction) away from the gate electrode of the transistor 6a41 and away from the transistor 6a51. FIG. 6E shows the fifth conductive gate level feature 501e having an inner extension distance 6a117 as measured in the parallel direction (y-direction) away from the gate electrode of the transistor 6a41 and toward the transistor 6a51. FIG. 7A is an illustration showing a traditional approach for making contact to a gate electrode, e.g., polysilicon feature. In the traditional configuration of FIG. 7A, an enlarged rectangular gate electrode region 707 is defined where a gate electrode contact 709 is to be located. The enlarged rectangular gate electrode region 707 introduces a bend of distance 705 in the gate electrode. The bend associated with the enlarged rectangular gate electrode region 707 sets up undesirable light interactions and distorts the gate electrode line 711. Distortion of the gate electrode line 711 is especially problematic when the gate electrode width is about the same as a transistor length.

Figure 7B:
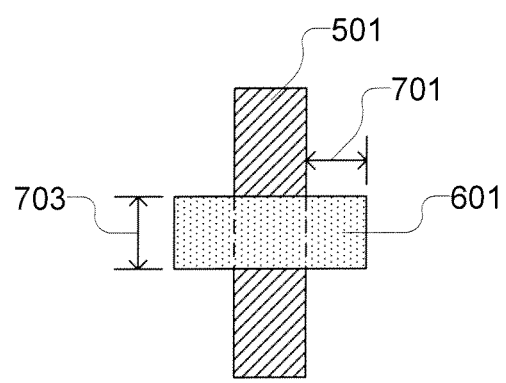
FIG. 7B is an illustration showing a gate electrode contact defined in accordance with one embodiment of the present invention.

FIG. 7B is an illustration showing a gate electrode contact 601, e.g., polysilicon contact, defined in accordance with one embodiment of the present invention. The gate electrode contact 601 is drawn to overlap the edges of the gate electrode feature 501, and extend in a direction substantially perpendicular to the gate electrode feature 501. In one embodiment, the gate electrode contact 601 is drawn such that the vertical dimension 703 is same as the vertical dimension used for the diffusion contacts 503. For example, if the diffusion contact 503 opening is specified to be 0.12 µm square then the vertical dimension of the gate electrode contact 601 is drawn at 0.12 µm. However, in other embodiments, the gate electrode contact 601 can be drawn such that the vertical dimension 703 is different from the vertical dimension used for the diffusion contacts 503.

In one embodiment, the gate electrode contact 601 extension 701 beyond the gate electrode feature 501 is set such that maximum overlap is achieved between the gate electrode contact 601 and the gate electrode feature 501. The extension 701 is defined to accommodate line end shortening of the gate electrode contact 601, and misalignment between the gate electrode contact layer and gate electrode feature layer. The length of the gate electrode contact 601 is defined to ensure maximum surface area contact between the gate electrode contact 601 and the gate electrode feature 501, wherein the maximum surface area contact is defined by the width of the gate electrode feature 501.

Figure 8A:
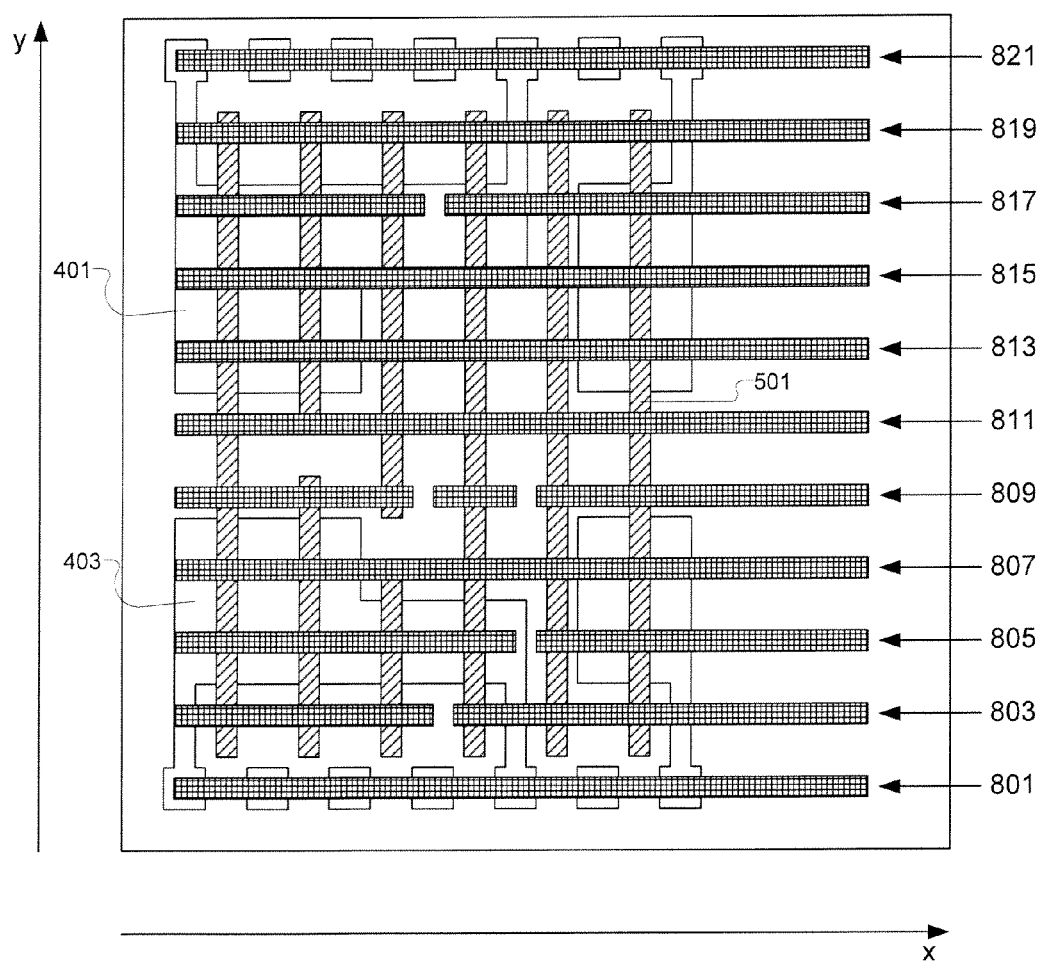
FIG. 8A is an illustration showing a metal 1 layer defined above and adjacent to the gate electrode contact layer of FIG. 6, in accordance with one embodiment of the present invention.

FIG. 8A is an illustration showing a metal 1 layer defined above the gate electrode contact layer of FIG. 6, in accordance with one embodiment of the present invention. The metal 1 layer includes a number of metal 1 tracks 801-821 defined to include linear shaped features extending in a parallel relationship across the dynamic array. The metal 1 tracks 801-821 extend in a direction substantially perpendicular to the gate electrode features 501 in the underlying gate electrode layer of FIG. 5. Thus, in the present example, the metal 1 tracks 801-821 extend linearly across the dynamic array in the first reference direction (x). The pitch (center-to-center spacing) of the metal 1 tracks 801-821 is minimized while ensuring optimization of lithographic reinforcement, i.e., resonant imaging, provided by neighboring metal 1 tracks 801-821. For example, in one embodiment, the metal 1 tracks 801-821 are centered on a vertical grid of about 0.24 µm for a 90 nm process technology.

Each of the metal 1 tracks 801-821 may be interrupted, i.e., broken, any number of times in linearly traversing across the dynamic array in order to provide required electrical connectivity for a particular logic function to be implemented. When a given metal 1 track 801-821 is required to be interrupted, the separation between ends of the metal 1 track segments at the point of interruption is minimized to the extent possible taking into consideration manufacturing capability and electrical effects. Minimizing the separation between ends of the metal 1 track segments at the points of interruption serves to maximize the lithographic reinforcement, and uniformity thereof, provided from neighboring metal 1 tracks. Also, in one embodiment, if adjacent metal 1 tracks need to be interrupted, the interruptions of the adjacent metal 1 tracks are made such that the respective points of interruption are offset from each other so as to avoid, to the extent possible, an occurrence of neighboring points of interruption. More specifically, points of interruption within adjacent metal 1 tracks are respectively positioned such that a line of sight does not exist through the points of interruption, wherein the line of sight is considered to extend perpendicularly to the direction in which the metal 1 tracks extend over the substrate.

Figure 8B:
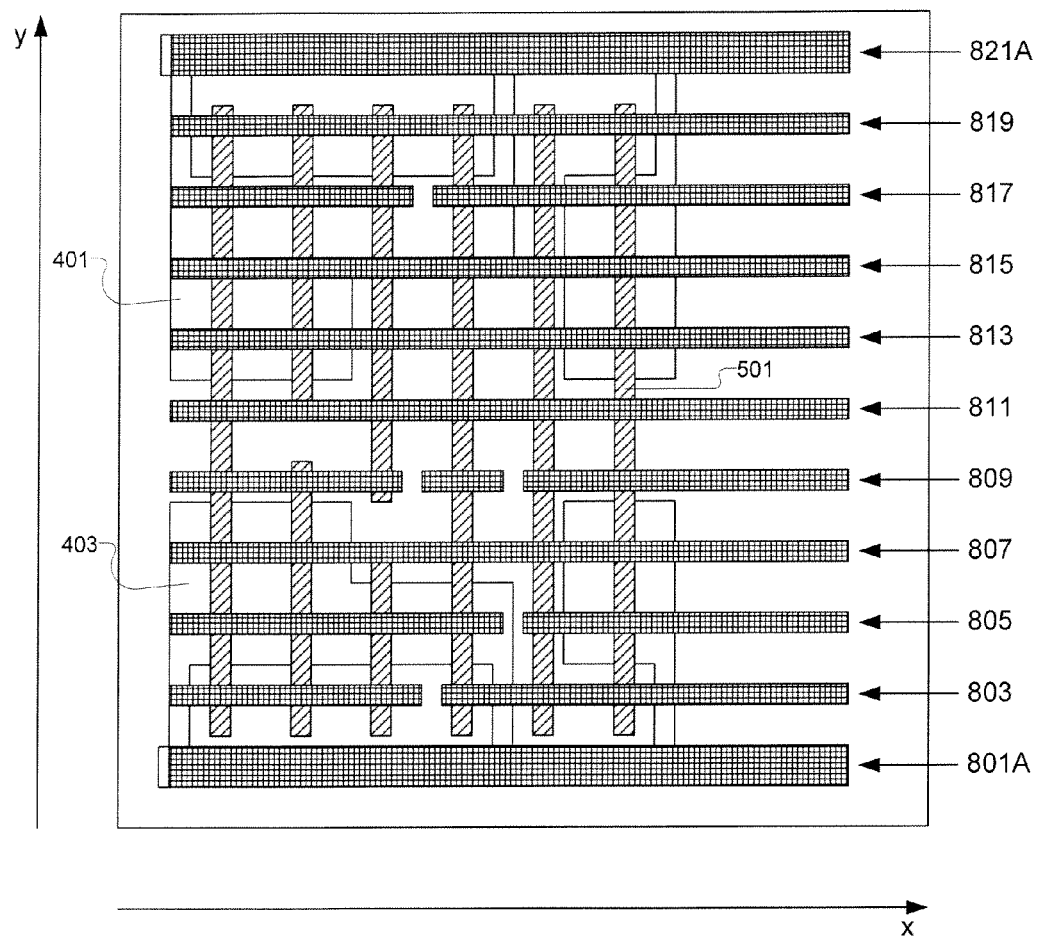
FIG. 8B is an illustration showing the metal 1 layer of FIG. 8A with larger track widths for the metal 1 ground and power tracks, relative to the other metal 1 tracks.

In the example of FIG. 8A, the metal 1 track 801 is connected to the ground supply, and the metal 1 track 821 is connected to the power supply voltage. In the embodiment of FIG. 8A, the widths of the metal 1 tracks 801 and 821 are the same as the other metal 1 tracks 803-819. However, in another embodiment, the widths of metal 1 tracks 801 and 821 are larger than the widths of the other metal 1 tracks 803-819. FIG. 8B is an illustration showing the metal 1 layer of FIG. 8A with larger track widths for the metal 1 ground and power tracks (801A and 821A), relative to the other metal 1 tracks 803-819.

The metal 1 track pattern is optimally configured to optimize the use of "white space" (space not occupied by transistors). The example of FIG. 8A includes the two shared metal 1 power tracks 801 and 821, and nine metal 1 signal tracks 803-819. Metal 1 tracks 803, 809, 811, and 819 are defined as gate electrode contact tracks in order to minimize white space. Metal 1 tracks 805 and 807 are defined to connect to n-channel transistor source and drains. Metal 1 tracks 813, 815, and 817 are defined to connect to p-channel source and drains. Also, any of the nine metal 1 signal tracks 803-819 can be used as a feed through if no connection is required. For example, metal 1 tracks 813 and 815 are configured as feed through connections.

Figure 9:
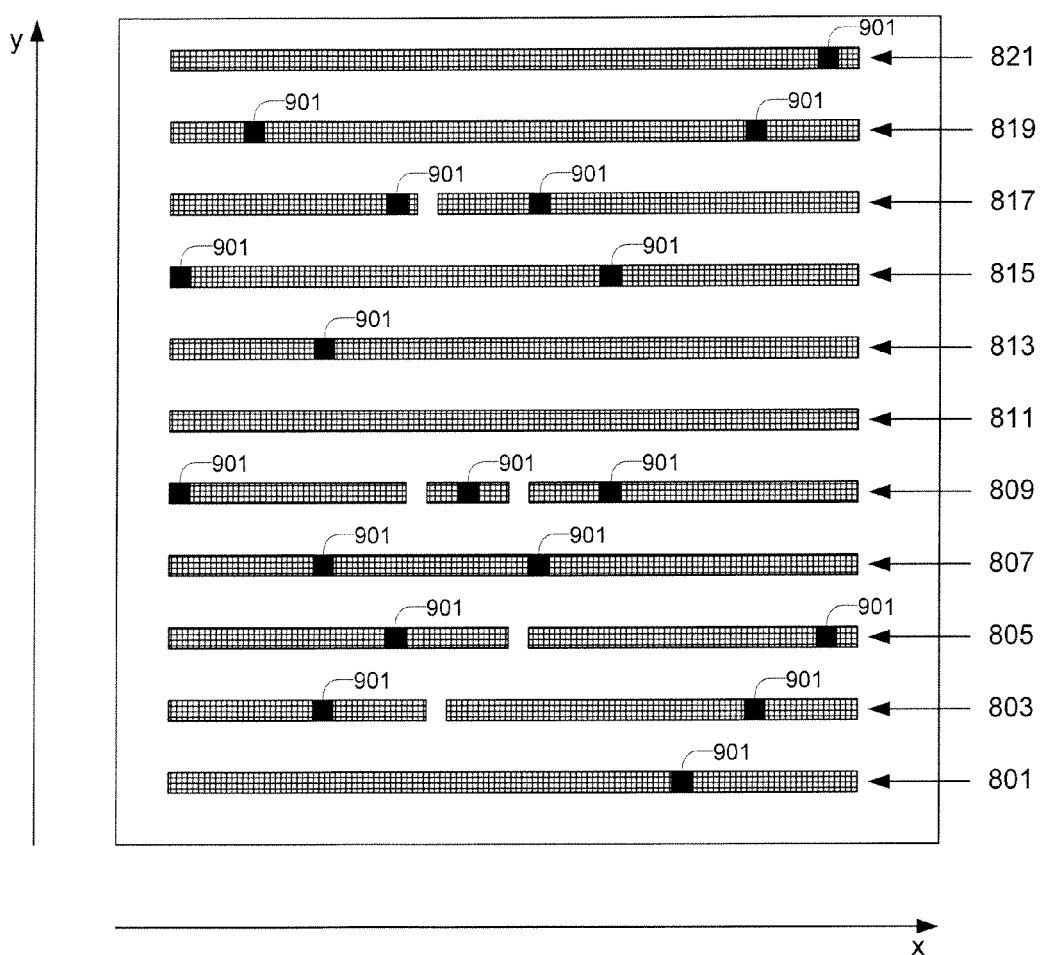
FIG. 9 is an illustration showing a via 1 layer defined above and adjacent to the metal 1 layer of FIG. 8A, in accordance with one embodiment of the present invention.

FIG. 9 is an illustration showing a via 1 layer defined above and adjacent to the metal 1 layer of FIG. 8A, in accordance with one embodiment of the present invention. Vias 901 are defined in the via 1 layer to enable connection of the metal 1 tracks 801-821 to higher level conduction lines.

Figure 10:
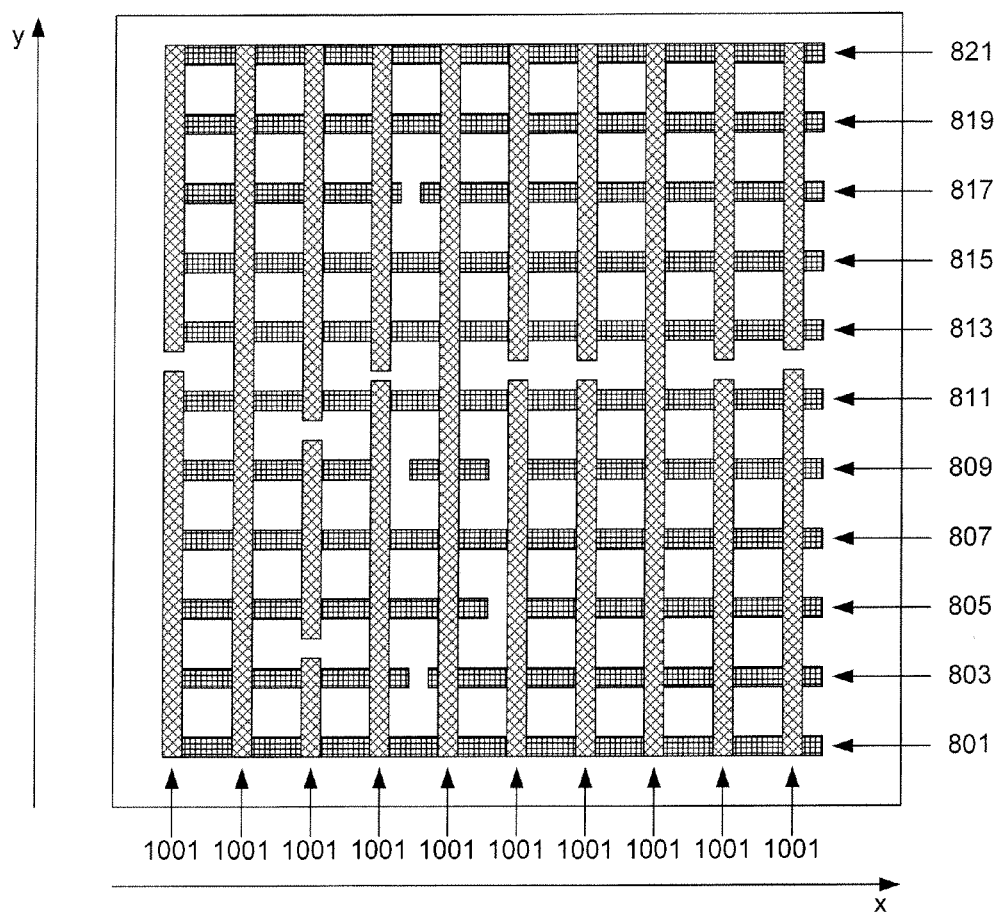
FIG. 10 is an illustration showing a metal 2 layer defined above and adjacent to the via 1 layer of FIG. 9, in accordance with one embodiment of the present invention.

FIG. 10 is an illustration showing a metal 2 layer defined above and adjacent to the via 1 layer of FIG. 9, in accordance with one embodiment of the present invention. The metal 2 layer includes a number of metal 2 tracks 1001 defined as linear shaped features extending in a parallel relationship across the dynamic array. The metal 2 tracks 1001 extend in a direction substantially perpendicular to the metal 1 tracks 801-821 in the underlying metal 1 layer of FIG. 8A, and in a direction substantially parallel to the gate electrode tracks 501 in the underlying gate electrode layer of FIG. 5. Thus, in the present example, the metal 2 tracks 1001 extend linearly across the dynamic array in the second reference direction (y).

The pitch (center-to-center spacing) of the metal 2 tracks 1001 is minimized while ensuring optimization of lithographic reinforcement, i.e., resonant imaging, provided by neighboring metal 2 tracks. It should be appreciated that regularity can be maintained on higher level interconnect layers in the same manner as implemented in the gate electrode and metal 1 layers. In one embodiment, the gate electrode feature 501 pitch and the metal 2 track pitch is the same. In another embodiment, the contacted gate electrode pitch (e.g., polysilicon-to-polysilicon space with a diffusion contact in between) is greater than the metal 2 track pitch. In this embodiment, the metal 2 track pitch is optimally set to be ⅔ or ¾ of the contacted gate electrode pitch. Thus, in this embodiment, the gate electrode track and metal 2 track align at every two gate electrode track pitches and every three metal 2 track pitches. For example, in a 90 nm process technology, the optimum contacted gate electrode track pitch is 0.36 μm, and the optimum metal 2 track pitch is 0.24 μm. In another embodiment, the gate electrode track and the metal 2 track align at every three gate electrode pitches and every four metal 2 pitches. For example, in a 90 nm process technology, the optimum contacted gate electrode track pitch is 0.36 μm, and the optimum metal 2 track pitch is 0.27 μm.

Each of the metal 2 tracks 1001 may be interrupted, i.e., broken, any number of times in linearly traversing across the dynamic array in order to provide required electrical connectivity for a particular logic function to be implemented. When a given metal 2 track 1001 is required to be interrupted, the separation between ends of the metal 2 track segments at the point of interruption is minimized to the extent possible taking into consideration manufacturing and electrical effects. Minimizing the separation between ends of the metal 2 track segments at the points of interruption serves to maximize the lithographic reinforcement, and uniformity thereof, provided from neighboring metal 2 tracks. Also, in one embodiment, if adjacent metal 2 tracks need to be interrupted, the interruptions of the adjacent metal 2 tracks are made such that the respective points of interruption are offset from each other so as to avoid, to the extent possible, an occurrence of neighboring points of interruption. More specifically, points of interruption within adjacent metal 2 tracks are respectively positioned such that a line of sight does not exist through the points of interruption, wherein the line of sight is considered to extend perpendicularly to the direction in which the metal 2 tracks extend over the substrate.

Figure 11:
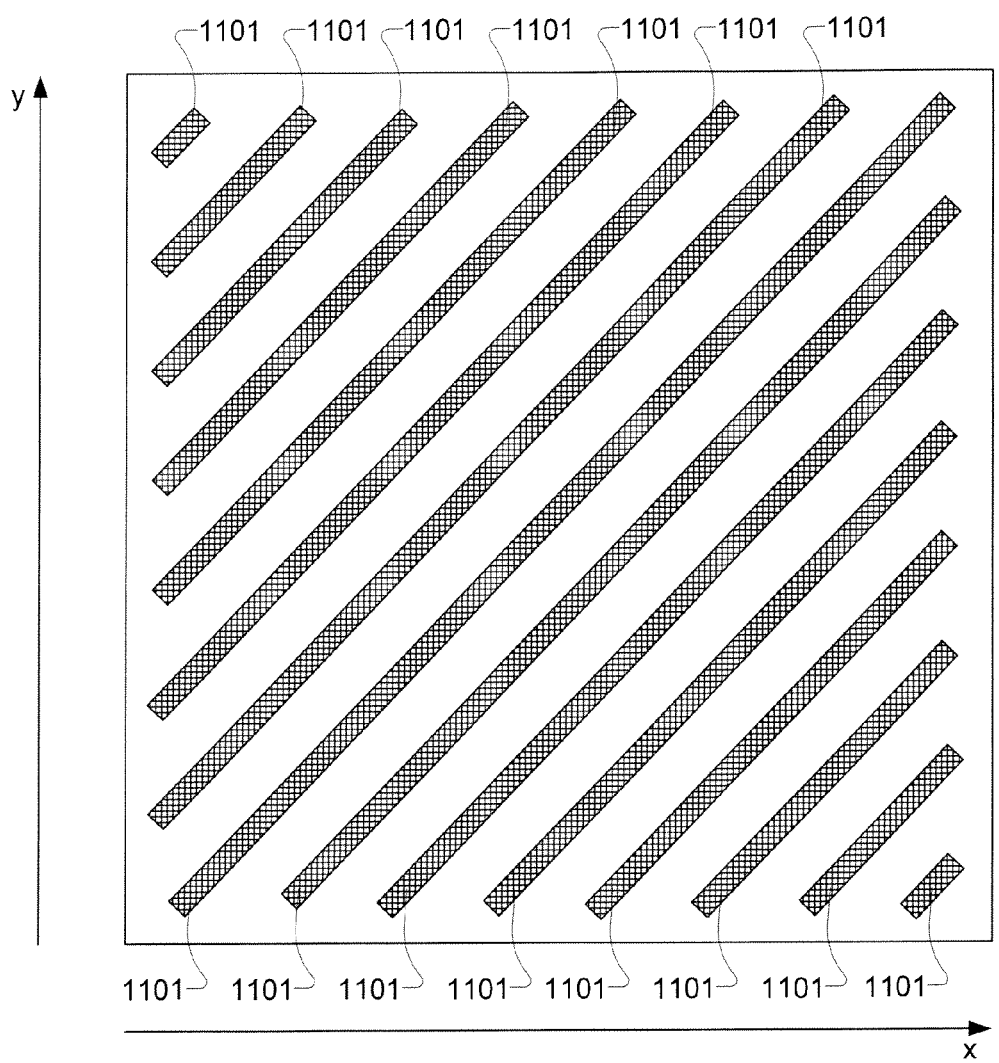
FIG. 11 is an illustration showing conductor tracks traversing the dynamic array in a first diagonal direction relative to the first and second reference directions (x) and (y), in accordance with one embodiment of the present invention.
Figure 12:
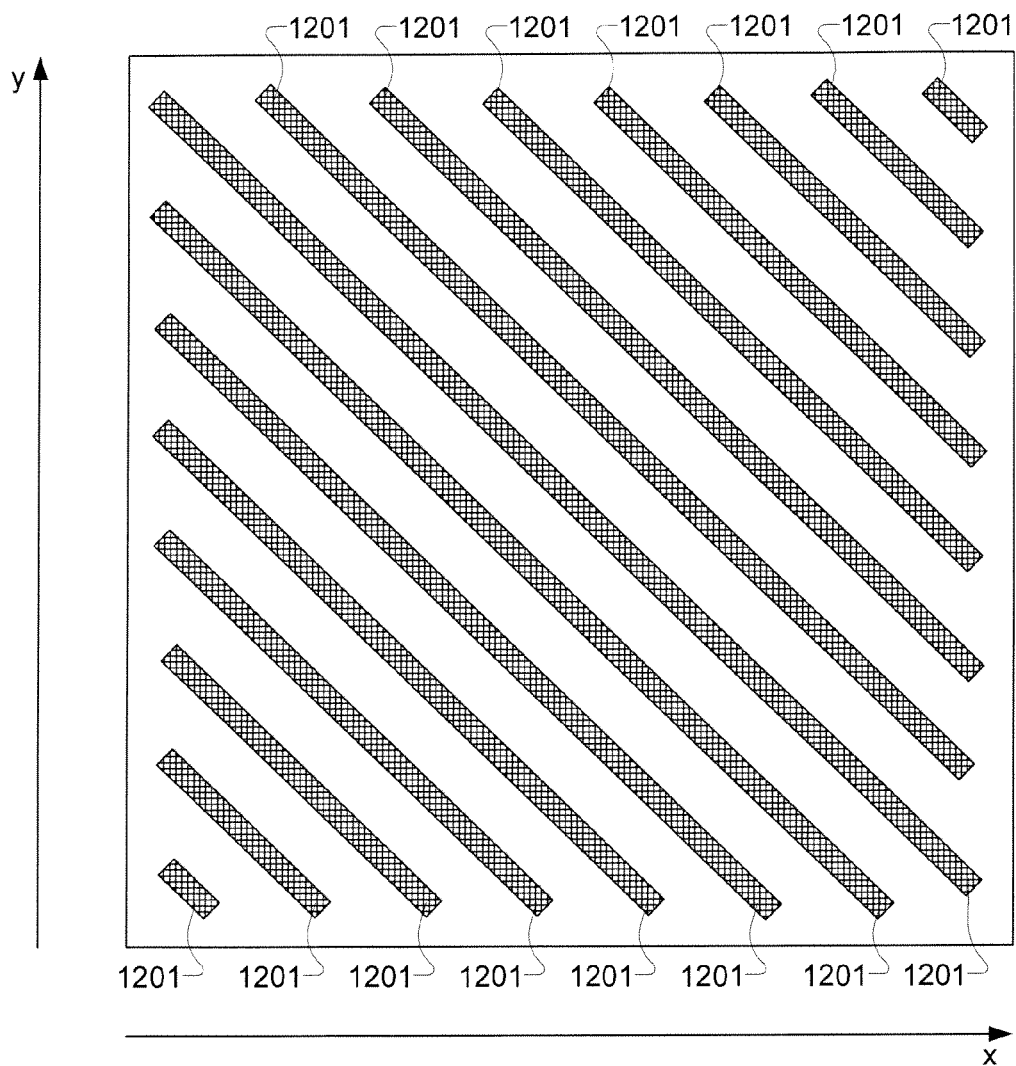
FIG. 12 is an illustration showing conductor tracks traversing the dynamic array in a second diagonal direction relative to the first and second reference directions (x) and (y), in accordance with one embodiment of the present invention.

As discussed above, the conduction lines in a given metal layer above the gate electrode layer may traverse the dynamic array in a direction coincident with either the first reference direction (x) or the second reference direction (y). It should be further appreciated that the conduction lines in a given metal layer above the gate electrode layer may traverse the dynamic array in a diagonal direction relative to the first and second reference directions (x) and (y). FIG. 11 is an illustration showing conductor tracks 1101 traversing the dynamic array in a first diagonal direction relative to the first and second reference directions (x) and (y), in accordance with one embodiment of the present invention. FIG. 12 is an illustration showing conductor tracks 1201 traversing the dynamic array in a second diagonal direction relative to the first and second reference directions (x) and (y), in accordance with one embodiment of the present invention.

As with the metal 1 and metal 2 tracks discussed above, the diagonal traversing conductor tracks 1101 and 1201 of FIGS. 11 and 12 may be interrupted, i.e., broken, any number of times in linearly traversing across the dynamic array in order to provide required electrical connectivity for a particular logic function to be implemented. When a given diagonal traversing conductor track is required to be interrupted, the separation between ends of the diagonal conductor track at the point of interruption is minimized to the extent possible taking into consideration manufacturing and electrical effects. Minimizing the separation between ends of the diagonal conductor track at the points of interruption serves to maximize the lithographic reinforcement, and uniformity thereof, provided from neighboring diagonal conductor tracks.

An optimal layout density within the dynamic array is achieved by implementing the following design rules:

at least two metal 1 tracks be provided across the n-channel device area;

at least two metal 1 tracks be provided across the p-channel device area;

at least two gate electrode tracks be provided for the n-channel device; and at least two gate electrode tracks be provided for the p-channel device.

Contacts and vias are becoming the most difficult mask from a lithographic point of view. This is because the contacts and vias are getting smaller, more closely spaced, and are randomly distributed. The spacing and density of the cuts (contact or vias) makes it extremely difficult to reliably print the shapes. For example, cut shapes may be printed improperly due to destructive interference patterns from neighboring shapes or lack of energy on lone shapes. If a cut is properly printed, the manufacturing yield of the associated contact or via is extremely high. Sub-resolution contacts can be provided to reinforce the exposure of the actual contacts, so long as the sub-resolution contacts do not resolve. Also, the sub-resolution contacts can be of any shape so long as they are smaller than the resolution capability of the lithographic process.

Figure 13A:
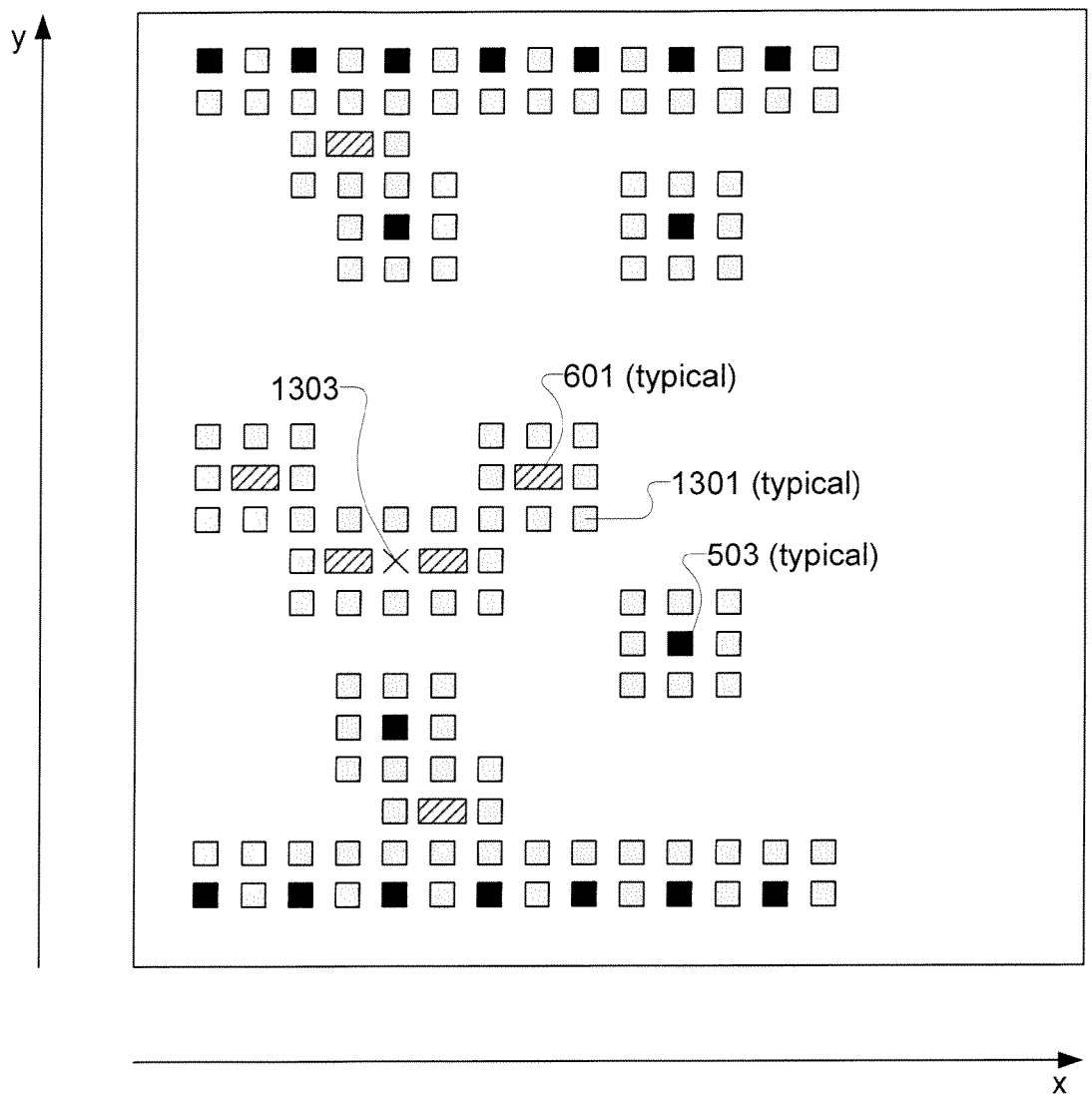
FIG. 13A is an illustration showing an example of a sub-resolution contact layout used to lithographically reinforce diffusion contacts and gate electrode contacts, in accordance with one embodiment of the present invention.

FIG. 13A is an illustration showing an example of a sub-resolution contact layout used to lithographically reinforce diffusion contacts and gate electrode contacts, in accordance with one embodiment of the present invention. Sub-resolution contacts 1301 are drawn such that they are below the resolution of the lithographic system and will not be printed. The function of the sub-resolution contacts 1301 is to increase the light energy at the desired contact locations, e.g., 503, 601, through resonant imaging. In one embodiment, sub-resolution contacts 1301 are placed on a grid such that both gate electrode contacts 601 and diffusion contacts 503 are lithographically reinforced. For example, sub-resolution contacts 1301 are placed on a grid that is equal to one-half the diffusion contact 503 grid spacing to positively impact both gate electrode contacts 601 and diffusion contacts 503. In one embodiment, a vertical spacing of the sub-resolution contacts 1301 follows the vertical spacing of the gate electrode contacts 601 and diffusion contacts 503.

Grid location 1303 in FIG. 13A denotes a location between adjacent gate electrode contacts 601. Depending upon the lithographic parameters in the manufacturing process, it is possible that a sub-resolution contact 1301 at this grid location would create an undesirable bridge between the two adjacent gate electrode contacts 601. If bridging is likely to occur, a sub-resolution contact 1301 at location 1303 can be omitted. Although FIG. 13A shows an embodiment where sub-resolution contacts are placed adjacent to actual features to be resolved and not elsewhere, it should be understood that another embodiment may place a sub-resolution contact at each available grid location so as to fill the grid.

Figure 13B:
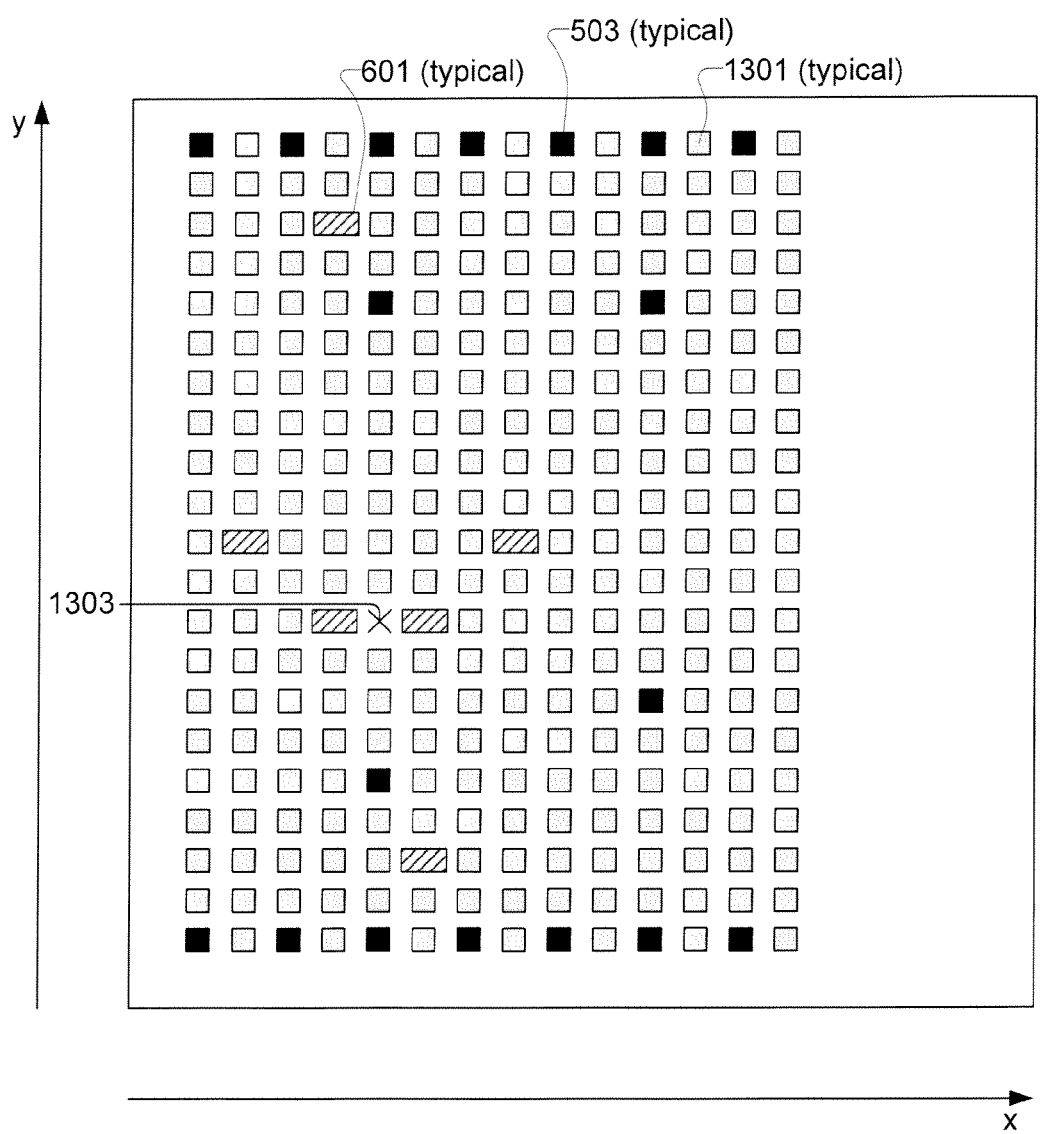
FIG. 13B is an illustration showing the sub-resolution contact layout of FIG. 13A with sub-resolution contacts defined to fill the grid to the extent possible, in accordance with one embodiment of the present invention.

FIG. 13B is an illustration showing the sub-resolution contact layout of FIG. 13A with sub-resolution contacts defined to fill the grid to the extent possible, in accordance with one embodiment of the present invention. It should be appreciated that while the embodiment of FIG. 13B fills the grid to the extent possible with sub-resolution contacts, placement of sub-resolution contacts is avoided at locations that would potentially cause undesirable bridging between adjacent fully resolved features.

Figure 13C:
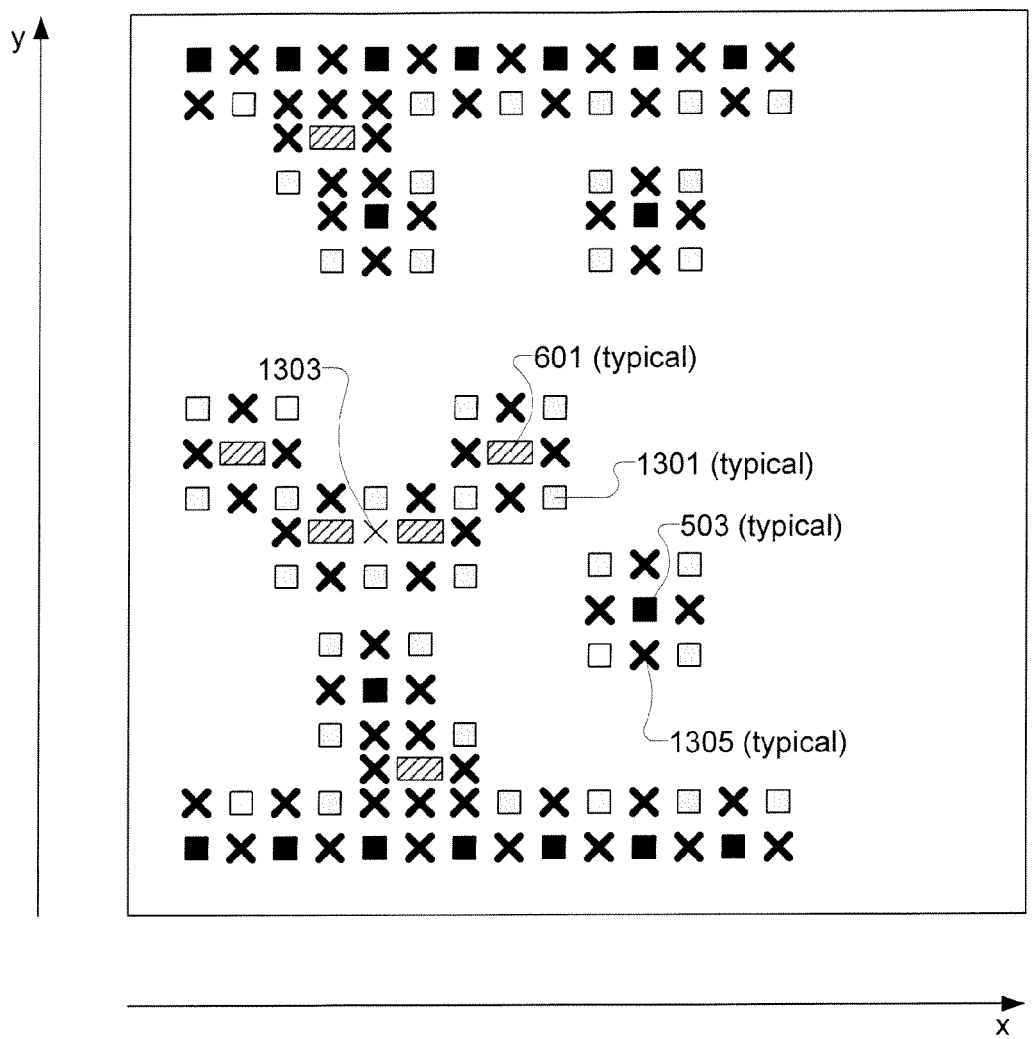
FIG. 13C is an illustration showing an example of a sub-resolution contact layout utilizing various shaped sub-resolution contacts, in accordance with one embodiment of the present invention.

FIG. 13C is an illustration showing an example of a sub-resolution contact layout utilizing various shaped sub-resolution contacts, in accordance with one embodiment of the present invention. Alternative sub-resolution contact shapes can be utilized so long as the sub-resolution contacts are below the resolution capability of the manufacturing process. FIG. 13C shows the use of "X-shaped" sub-resolution contacts 1305 to focus light energy at the corners of the adjacent contacts. In one embodiment, the ends of the X-shaped sub-resolution contact 1305 are extended to further enhance the deposition of light energy at the corners of the adjacent contacts.

Figure 13D:
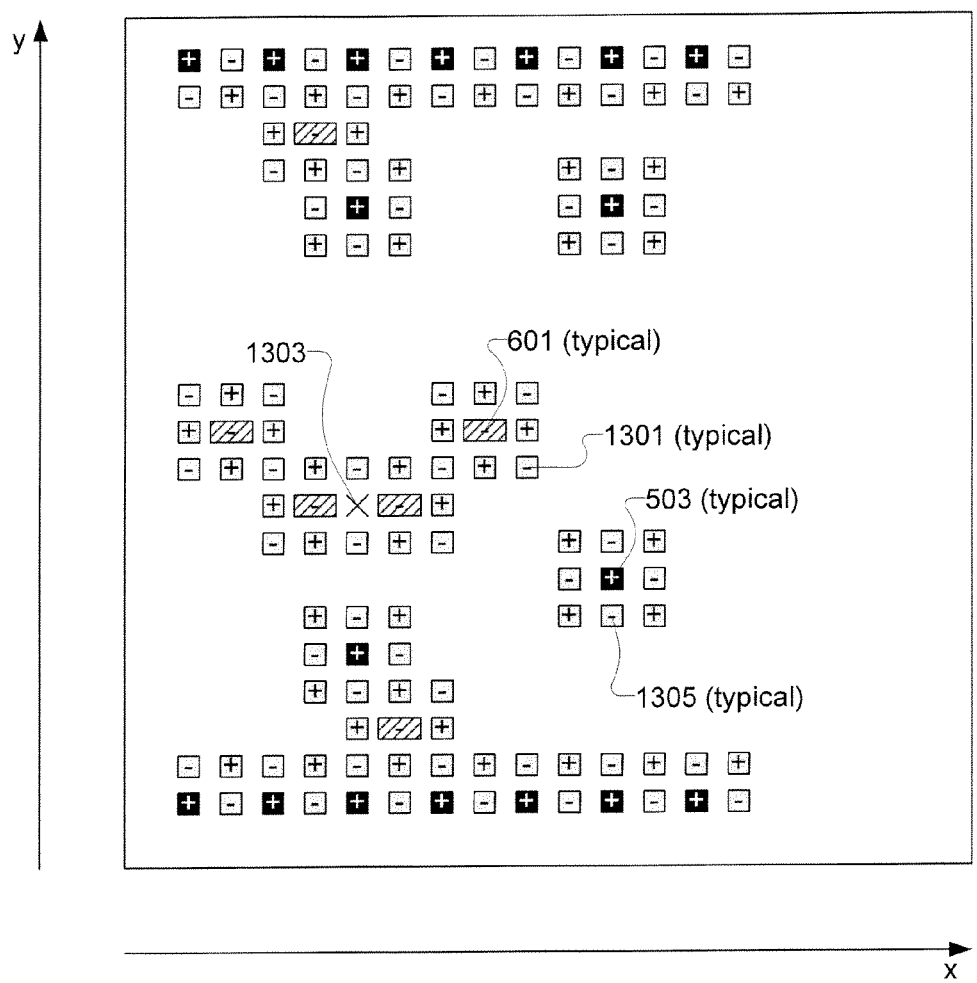
FIG. 13D is an illustration showing an exemplary implementation of alternate phase shift masking (APSM) with sub-resolution contacts, in accordance with one embodiment of the present invention.

FIG. 13D is an illustration showing an exemplary implementation of alternate phase shift masking (APSM) with sub-resolution contacts, in accordance with one embodiment of the present invention. As in FIG. 13A, sub-resolution contacts are utilized to lithographically reinforce diffusion contacts 503 and gate electrode contacts 601. APSM is used to improve resolution when neighboring shapes create destructive interference patterns. The APSM technique modifies the mask so that the phase of light traveling through the mask on neighboring shapes is 180 degrees out of phase. This phase shift serves to remove destructive interference and allowing for greater contact density. By way of example, contacts in FIG. 13D marked with a plus "+" sign represent contacts exposed with light waves of a first phase while contacts marked with a minus sign "−" represent contacts exposed with light waves that are shifted in phase by 180 degrees relative to the first phase used for the "+" sign contacts. It should be appreciated that the APSM technique is utilized to ensure that adjacent contacts are separated from each other.

As feature sizes decrease, semiconductor dies are capable of including more gates. As more gates are included, however, the density of the interconnect layers begins to dictate the die size. This increasing demand on the interconnect layers drives higher levels of interconnect layers. However, the stacking of interconnect layers is limited in part by the topology of the underlying layers. For example, as interconnect layers are built up, islands, ridges, and troughs can occur. These islands, ridges, and troughs can cause breaks in the interconnect lines that cross them.

To mitigate these islands and troughs, the semiconductor manufacturing process utilizes a chemical mechanical polishing (CMP) procedure to mechanically and chemically polish the surface of the semiconductor wafer such that each subsequent interconnect layer is deposited on a substantially flat surface. Like the photolithography process the quality of the CMP process is layout pattern dependent. Specifically, an uneven distribution of a layout features across a die or a wafer can cause too much material to be removed in some places and not enough material to be removed in other places, thus causing variations in the interconnect thickness and unacceptable variations in the capacitance and resistance of the interconnect layer. The capacitance and resistance variation within the interconnect layer may alter the timing of a critical net causing design failure.

The CMP process requires that dummy fill be added in the areas without interconnect shapes so that a substantially uniform wafer topology is provided to avoid dishing and improve center-to-edge uniformity. Traditionally, dummy fill is placed post-design. Thus, in the traditional approach the designer is not aware of the dummy fill characteristics. Consequently, the dummy fill placed post-design may adversely influence the design performance in a manner that has not been evaluated by the designer. Also, because the conventional topology prior to the dummy fill is unconstrained, i.e., non-uniform, the post-design dummy fill will not be uniform and predictable. Therefore, in the conventional process, the capacitive coupling between the dummy fill regions and the neighboring active nets cannot be predicted by the designer.

As previously discussed, the dynamic array disclosed herein provides optimal regularity by maximally filling all interconnect tracks from gate electrode layer upward. If multiple nets are required in a single interconnect track, the interconnect track is split with a minimally spaced gap. For example, track 809 representing the metal 1 conduction line in FIG. 8A represents three separate nets in the same track, where each net corresponds to a particular track segment. More specifically, there are two poly contact nets and a floating net to fill the track with minimal spacing between the track segments. The substantially complete filling of tracks maintains the regular pattern that creates resonant images across the dynamic array. Also, the regular architecture of the dynamic array with maximally filled interconnect tracks ensures that the dummy fill is placed in a uniform manner across the die. Therefore, the regular architecture of the dynamic array assists the CMP process to produce substantially uniform results across the die/wafer. Also, the regular gate pattern of the dynamic array assists with gate etching uniformity (microloading). Additionally, the regular architecture of the dynamic array combined with the maximally filled interconnect tracks allows the designer to analyze the capacitive coupling effects associated with the maximally filled tracks during the design phase and prior to fabrication.

Because the dynamic array sets the size and spacing of the linearly shaped features, i.e., tracks and contacts, in each mask layer, the design of the dynamic array can be optimized for the maximum capability of the manufacturing equipment and processes. That is to say, because the dynamic array is restricted to the regular architecture for each layer above diffusion, the manufacturer is capable of optimizing the manufacturing process for the specific characteristics of the regular architecture. It should be appreciated that with the dynamic array, the manufacturer does not have to be concerned with accommodating the manufacture of a widely varying set of arbitrarily-shaped layout features as is present in conventional unconstrained layouts.

An example of how the capability of manufacturing equipment can be optimized is provided as follows. Consider that a 90 nm process has a metal 2 pitch of 280 nm. This metal 2 pitch of 280 nm is not set by the maximum capability of equipment. Rather, this metal 2 pitch of 280 nm is set by the lithography of the vias. With the via lithography issues removed, the maximum capability of the equipment allows for a metal 2 pitch of about 220 nm. Thus, the design rules for metal 2 pitch include about 25% margin to account for the light interaction unpredictability in the via lithography.

The regular architecture implemented within the dynamic array allows the light interaction unpredictability in the via lithography to be removed, thus allowing for a reduction in the metal 2 pitch margin. Such a reduction in the metal 2 pitch margin allows for a more dense design, i.e., allows for optimization of chip area utilization. Additionally, with the restricted, i.e., regular, topology afforded by the dynamic array, the margin in the design rules can be reduced. Moreover, not only can the excess margin beyond the capability of the process be reduced, the restricted topology afforded by the dynamic array also allows the number of required design rules to be substantially reduced. For example, a typical design rule set for an unconstrained topology could have more than 600 design rules. A design rule set for use with the dynamic array may have about 45 design rules. Therefore, the effort required to analyze and verify the design against the design rules is decreased by more than a factor of ten with the restricted topology of the dynamic array.

When dealing with line end-to-line end gaps (i.e., track segment-to-track segment gaps) in a given track of a mask layer in the dynamic array, a limited number of light interactions exist. This limited number of light interactions can be identified, predicted, and accurately compensated for ahead of time, dramatically reducing or completely eliminating the requirement for OPC/RET. The compensation for light interactions at line end-to-line end gaps represents a lithographic modification of the as-drawn feature, as opposed to a correction based on modeling of interactions, e.g., OPC/RET, associated with the as-drawn feature.

Also, with the dynamic array, changes to the as-drawn layout are only made where needed. In contrast, OPC is performed over an entire layout in a conventional design flow. In one embodiment, a correction model can be implemented as part of the layout generation for the dynamic array. For example, due to the limited number of possible line end gap interactions, a router can be programmed to insert a line break having characteristics defined as a function of its surroundings, i.e., as a function of its particular line end gap light interactions. It should be further appreciated that the regular architecture of the dynamic array allows the line ends to be adjusted by changing vertices rather than by adding vertices. Thus, in contrast with unconstrained topologies that rely on the OPC process, the dynamic array significantly reduces the cost and risk of mask production. Also, because the line end gap interactions in the dynamic array can be accurately predicted in the design phase, compensation for the predicted line end gap interactions during the design phase does not increase risk of design failure.

In conventional unconstrained topologies, designers are required to have knowledge of the physics associated with the manufacturing process due to the presence of design dependent failures. With the grid-based system of the dynamic array as disclosed herein, the logical design can be separated from the physical design. More specifically, with the regular architecture of the dynamic array, the limited number of light interactions to be evaluated within the dynamic array, and the design independent nature of the dynamic array, designs can be represented using a grid point based netlist, as opposed to a physical netlist.

With the dynamic array, the design is not required to be represented in terms of physical information. Rather, the design can be represented as a symbolic layout. Thus, the designer can represent the design from a pure logic perspective without having to represent physical characteristics, e.g., sizes, of the design. It should be understood that the grid-based netlist, when translated to physical, matches the optimum design rules exactly for the dynamic array platform. When the grid-based dynamic array moves to a new technology, e.g., smaller technology, a grid-based netlist can be moved directly to the new technology because there is no physical data in the design representation. In one embodiment, the grid-based dynamic array system includes a rules database, a grid-based (symbolic) netlist, and the dynamic array architecture.

It should be appreciated that the grid-based dynamic array eliminates topology related failures associated with conventional unconstrained architectures. Also, because the manufacturability of the grid-based dynamic array is design independent, the yield of the design implemented on the dynamic array is independent of the design. Therefore, because the validity and yield of the dynamic array is preverified, the grid-based netlist can be implemented on the dynamic array with preverified yield performance.

Figure 14:
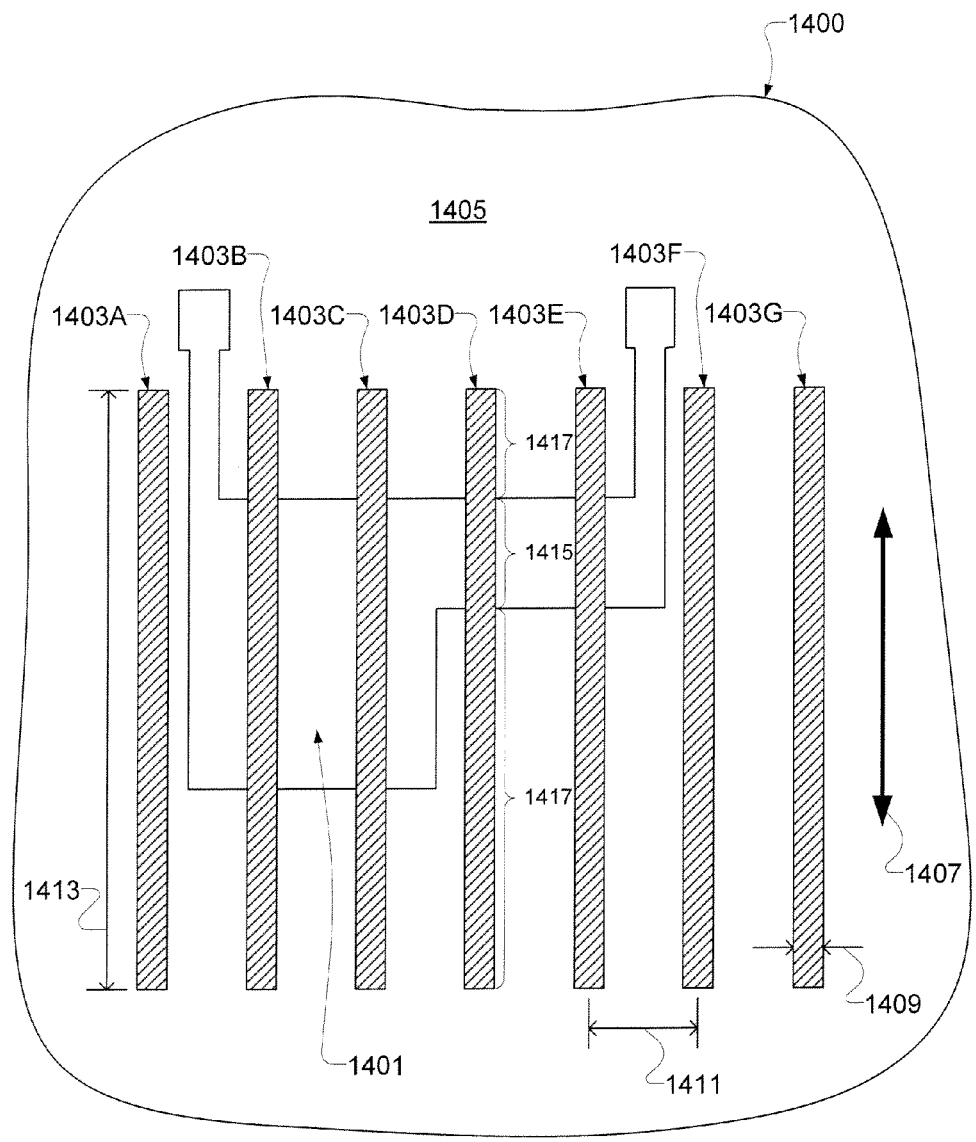
FIG. 14 is an illustration showing a semiconductor chip structure, in accordance with one embodiment of the present invention.

FIG. 14 is an illustration showing a semiconductor chip structure 1400, in accordance with one embodiment of the present invention. The semiconductor chip structure 1400 represents an exemplary portion of a semiconductor chip, including a diffusion region 1401 having a number of conductive lines 1403A-1403G defined thereover. The diffusion region 1401 is defined in a substrate 1405, to define an active region for at least one transistor device. The diffusion region 1401 can be defined to cover an area of arbitrary shape relative to the substrate 1405 surface.

The conductive lines 1403A-1403G are arranged to extend over the substrate 1405 in a common direction 1407. It should also be appreciated that each of the number of conductive lines 1403A-1403G are restricted to extending over the diffusion region 1401 in the common direction 1407. In one embodiment, the conductive lines 1403A-1403G defined immediately over the substrate 1405 are polysilicon lines. In one embodiment, each of the conductive lines 1403A-1403G is defined to have essentially the same width 1409 in a direction perpendicular to the common direction 1407 of extension. In another embodiment, some of the conductive lines 1403A-1403G are defined to have different widths relative to the other conductive lines. However, regardless of the width of the conductive lines 1403A-1403G, each of the conductive lines 1403A-1403G is spaced apart from adjacent conductive lines according to essentially the same center-to-center pitch 1411.

As shown in FIG. 14, some of the conductive lines (1403B-1403E) extend over the diffusion region 1401, and other conductive lines (1403A, 1403F, 1403G) extend over non-diffusion portions the substrate 1405. It should be appreciated that the conductive lines 1403A-1403G maintain their width 1409 and pitch 1411 regardless of whether they are defined over diffusion region 1401 or not. Also, it should be appreciated that the conductive lines 1403A-1403G maintain essentially the same length 1413 regardless of whether they are defined over diffusion region 1401 or not, thereby maximizing lithographic reinforcement between the conductive lines 1403A-1403G across the substrate. In this manner, some of the conductive lines, e.g., 1403D, defined over the diffusion region 1401 include a necessary active portion 1415, and one or more uniformity extending portions 1417.

It should be appreciated that the semiconductor chip structure 1400 represents a portion of the dynamic array described above with respect to FIGS. 2-13D. Therefore, it should be understood that the uniformity extending portions 1417 of the conductive lines (1403B-1403E) are present to provide lithographic reinforcement of neighboring conductive lines 1403A-1403G. Also, although they may not be required for circuit operation, each of conductive lines 1403A, 1403F, and 1403G are present to provide lithographic reinforcement of neighboring conductive lines 1403A-1403G.

The concept of the necessary active portion 1415 and the uniformity extending portions 1417 also applies to higher level interconnect layers. As previously described with regard to the dynamic array architecture, adjacent interconnect layers traverse over the substrate in transverse directions, e.g., perpendicular or diagonal directions, to enable routing/connectivity required by the logic device implemented within the dynamic array. As with the conductive lines 1403A-1403G, each of the conductive lines within an interconnect layer may include a required portion (necessary active portion) to enable required routing/connectivity, and a non-required portion (uniformity extending portion) to provide lithographic reinforcement to neighboring conductive lines. Also, as with the conductive lines 1403A-1403G, the conductive lines within an interconnect layer extend in a common direction over the substrate, have essentially the same width, and are spaced apart from each other according to an essentially constant pitch.

In one embodiment, conductive lines within an interconnect layer follow essentially the same ratio between line width and line spacing. For example, at 90 nm the metal 4 pitch is 280 nm with a line width and line spacing equal to 140 nm. Larger conductive lines can be printed on a larger line pitch if the line width is equal to the line spacing.

Figure 14A:
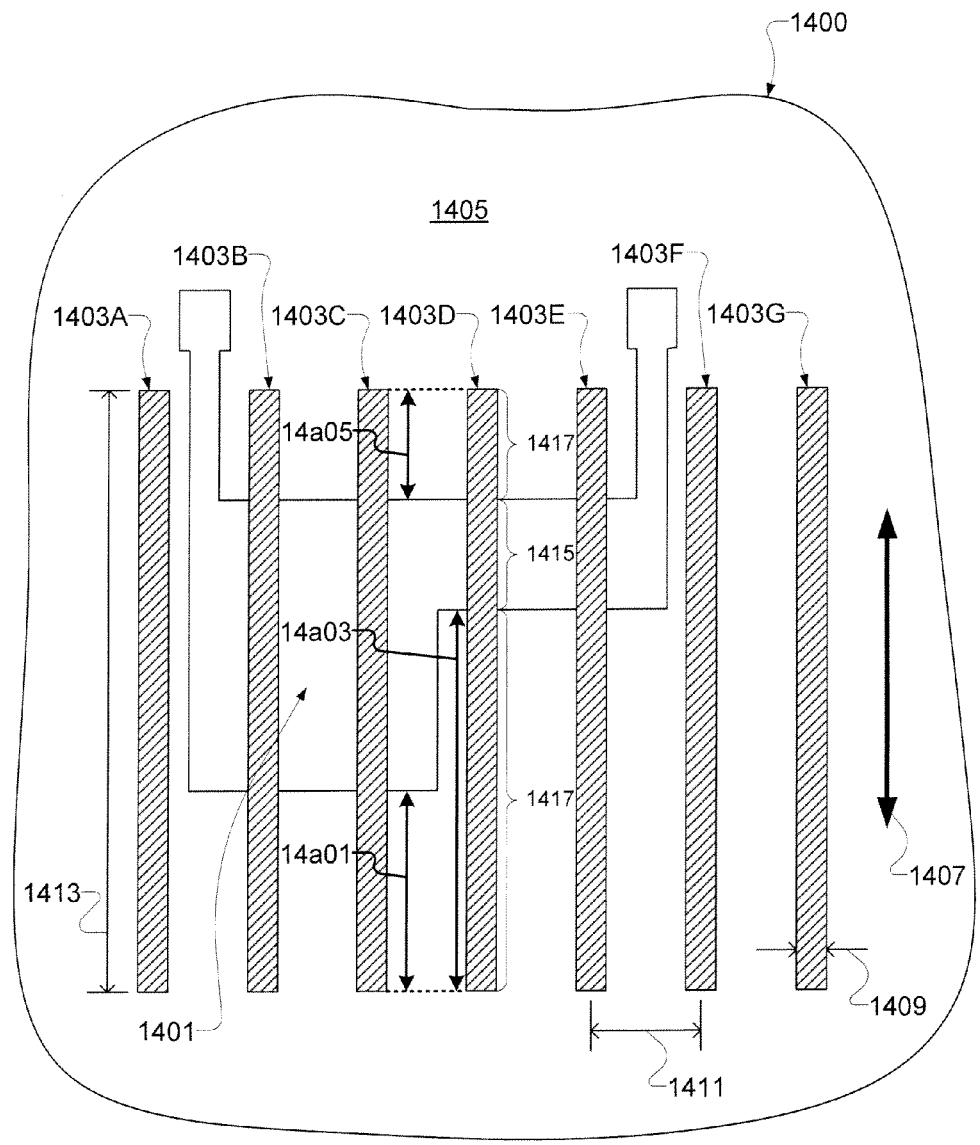
FIG. 14A shows an annotated version of FIG. 14.
Figure 15:
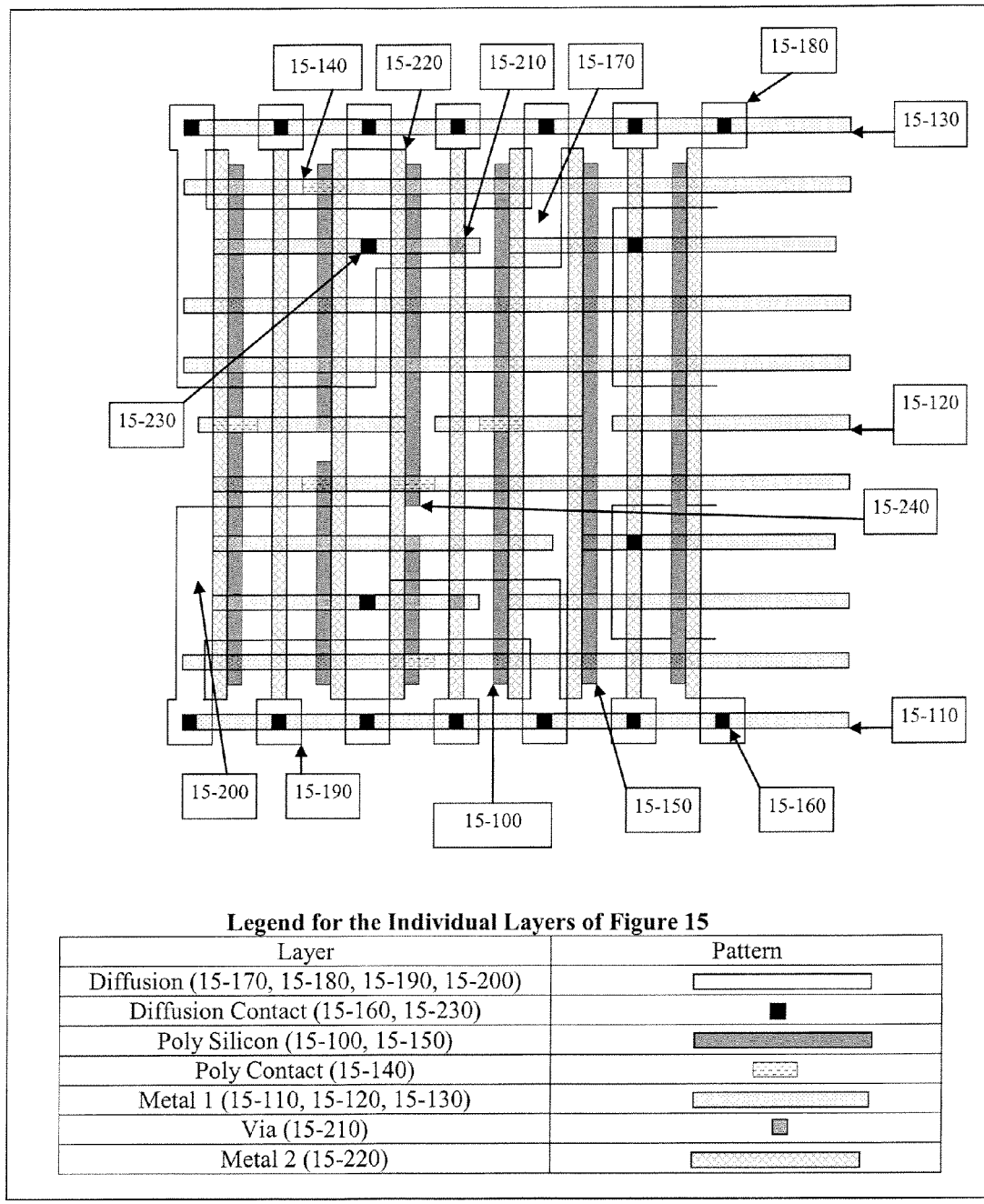
FIG. 15 shows an example layout architecture defined in accordance with one embodiment of the present invention.

FIG. 14A shows an annotated version of FIG. 14. The features depicted in FIG. 14A are exactly the same as the features depicted in FIG. 14. FIG. 14A shows each of the conductive lines 1403B and 1403C to have a uniformity extending portion 14a01 as measured in the common direction 1407. FIG. 14A shows each of the conductive lines 1403D and 1403E to have a uniformity extending portion 14a03 as measured in the common direction 1407. FIG. 14A shows each of the conductive lines 1403B, 1403C, 1403D, and 1403E to have a uniformity extending portion 14a05 as measured in the common direction 1407. FIG. 15 shows an example layout architecture defined in accordance with one embodiment of the present invention. The layout architecture follows a grid pattern and is based upon a horizontal grid and a vertical grid. The horizontal grid is set by the poly gate pitch. The vertical pitch is set by the metal 1/metal 3 pitch. All of the rectangular shapes should be centered on a grid point. The layout architecture minimizes the use of bends to eliminate unpredictable lithographic interactions. Bends are allowed on the diffusion layer to control transistor device sizes. Other layers should be rectangular in shape and fixed in one dimension.

Figure 15A:
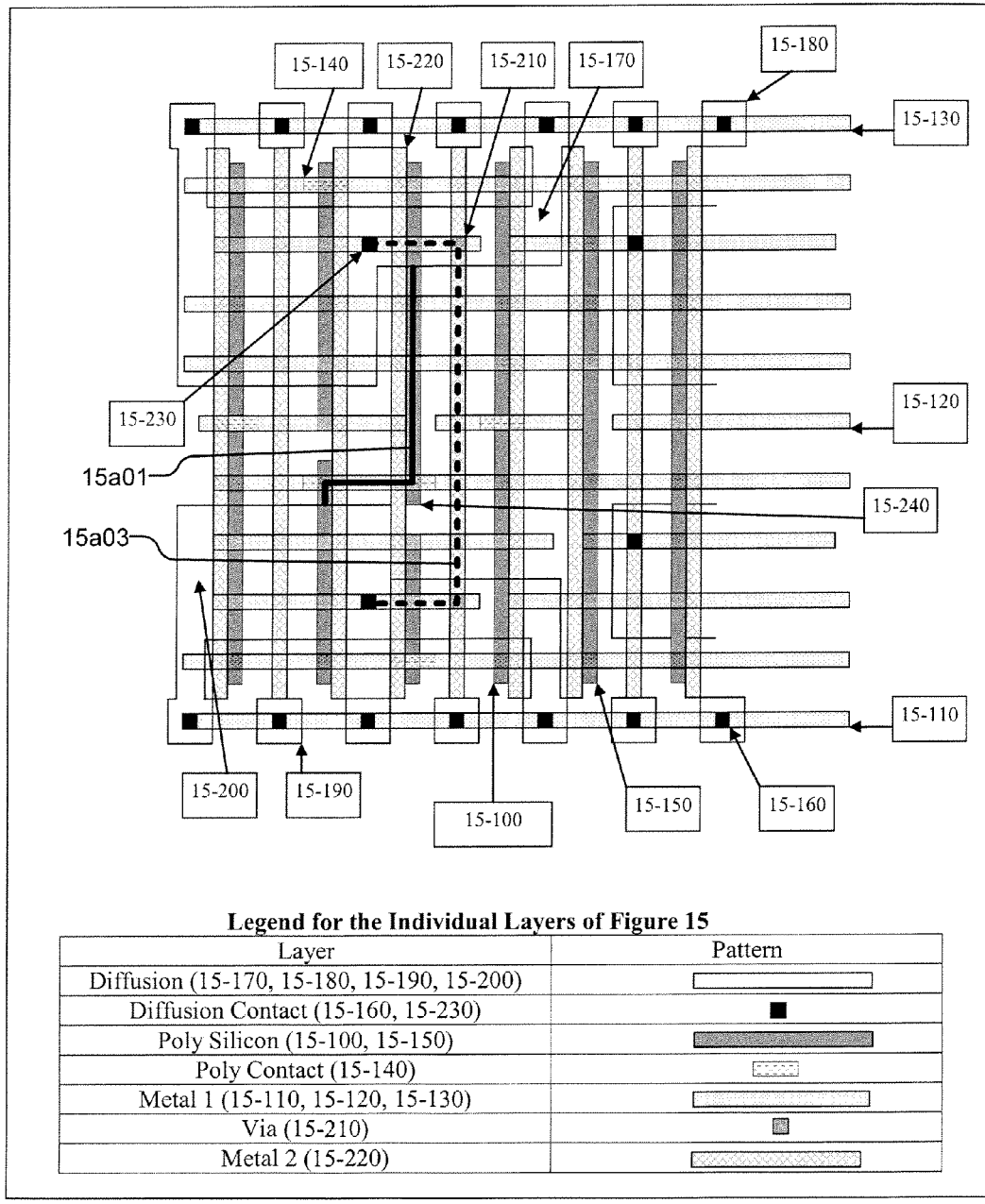
FIG. 15A shows an annotated version of FIG. 15.

FIG. 15A shows an annotated version of FIG. 15. The features depicted in FIG. 15A are exactly the same as the features depicted in FIG. 15. FIG. 15A shows a first electrical connection 15a01 (as denoted by the heavy solid black line). FIG. 15A shows a second electrical connection 15a03 (as denoted by the heavy dashed black line).

The invention described herein can be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion. Additionally, a graphical user interface (GUI) implemented as computer readable code on a computer readable medium can be developed to provide a user interface for performing any embodiment of the present invention.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A semiconductor chip, comprising:
a region including a plurality of transistors, each of the plurality of transistors in the region forming part of circuitry associated with execution of one or more logic functions, the region including at least eight conductive structures formed within the semiconductor chip, some of the at least eight conductive structures forming at least one transistor gate electrode,
each of the at least eight conductive structures respectively having a corresponding top surface, wherein an entirety of a periphery of the corresponding top surface is defined by a corresponding first end, a corresponding second end, a corresponding first edge, and a corresponding second edge, such that a total distance along the entirety of the periphery of the corresponding top surface is equal to a sum of a total distance along the corresponding first edge and a total distance along the corresponding second edge and a total distance along the corresponding first end and a total distance along the corresponding second end,
wherein the total distance along the corresponding first edge is greater than two times the total distance along the corresponding first end,
wherein the total distance along the corresponding first edge is greater than two times the total distance along the corresponding second end,
wherein the total distance along the corresponding second edge is greater than two times the total distance along the corresponding first end,
wherein the total distance along the corresponding second edge is greater than two times the total distance along the corresponding second end,
wherein the corresponding first end extends from the corresponding first edge to the corresponding second edge and is located principally within a space between the corresponding first and second edges,
wherein the corresponding second end extends from the corresponding first edge to the corresponding second edge and is located principally within the space between the corresponding first and second edges, the top surfaces of the at least eight conductive structures co-planar with each other, each of the at least eight conductive structures having a corresponding lengthwise centerline oriented in a first direction along its top surface and extending from its first end to its second end, each of the at least eight conductive structures having a length as measured along its lengthwise centerline from its first end to its second end, wherein the first edge of each of the at least eight conductive structures is substantially straight, wherein the second edge of each of the at least eight conductive structures is substantially straight, each of the at least eight conductive structures having both its first edge and its second edge oriented substantially parallel to its lengthwise centerline, each of the at least eight conductive structures having a width measured in a second direction perpendicular to the first direction at a midpoint of its lengthwise centerline, each of the first direction and the second direction oriented substantially parallel to the co-planar top surfaces of the at least eight conductive structures, wherein the at least eight conductive structures are positioned in a side-by-side manner such that each of the at least eight conductive structures is positioned to have at least a portion of its length beside at least a portion of the length of another of the at least eight conductive structures, wherein the width of each of the at least eight conductive structures is less than 45 nanometers, the region having a size of about 965 nanometers as measured in the second direction, each of the at least eight conductive structures positioned such that a distance as measured in the second direction between its lengthwise centerline and the lengthwise centerline of at least one other of the at least eight conductive structures is substantially equal to a first pitch that is less than or equal to about 193 nanometers, wherein the at least eight conductive structures includes a first conductive structure, the first conductive structure including a portion that forms a gate electrode of first transistor of a first transistor type, the first conductive structure including a portion that forms a gate electrode of a first transistor of a second transistor type, wherein the at least eight conductive structures includes a second conductive structure, the second conductive structure including a portion that forms a gate electrode of a second transistor of the first transistor type, wherein any transistor having its gate electrode formed by the second conductive structure is of the first transistor type, wherein the at least eight conductive structures includes a third conductive structure, the third conductive structure including a portion that forms a gate electrode of a second transistor of the second transistor type, wherein any transistor having its gate electrode formed by the third conductive structure is of the second transistor type, wherein the at least eight conductive structures includes a fourth conductive structure, the fourth conductive structure including a portion that forms a gate electrode of a third transistor of the first transistor type, wherein any transistor having its gate electrode formed by the fourth conductive structure is of the first transistor type, wherein the at least eight conductive structures includes a fifth conductive structure, the fifth conductive structure including a portion that forms a gate electrode of a third transistor of the second transistor type, wherein any transistor having its gate electrode formed by the fifth conductive structure is of the second transistor type, wherein the first transistor of the first transistor type includes a first diffusion terminal and the second transistor of the first transistor type includes a first diffusion terminal, the first diffusion terminal of the first transistor of the first transistor type electrically connected to the first diffusion terminal of the second transistor of the first transistor type through a first electrical connection, wherein the first transistor of the second transistor type includes a first diffusion terminal, and the second transistor of the second transistor type includes a first diffusion terminal, the first diffusion terminal of the first transistor of the second transistor type electrically connected to the first diffusion terminal of the second transistor of the second transistor type through a second electrical connection, wherein the second transistor of the first transistor type includes a second diffusion terminal, and the third transistor of the first transistor type includes a first diffusion terminal, the second diffusion terminal of the second transistor of the first transistor type electrically connected to the first diffusion terminal of the third transistor of the first transistor type through a third electrical connection, wherein the second transistor of the second transistor type includes a second diffusion terminal, and the third transistor of the second transistor type includes a first diffusion terminal, the second diffusion terminal of the second transistor of the second transistor type electrically connected to the first diffusion terminal of the third transistor of the second transistor type through a fourth electrical connection, wherein the third transistor of the first transistor type includes a second diffusion terminal electrically connected to a first diffusion terminal of a fourth transistor of the first transistor type through a fifth electrical connection, wherein the third transistor of the second transistor type includes a second diffusion terminal electrically connected to a first diffusion terminal of a fourth transistor of the second transistor type through a sixth electrical connection, wherein the third electrical connection is electrically connected to the fourth electrical connection through a seventh electrical connection, wherein the seventh electrical connection includes one or more overlying interconnect conductive structures formed at a respective vertical position within the semiconductor chip overlying some of the at least eight conductive structures so as to be separated from the co-planar top surfaces of the at least eight conductive structures by at least one dielectric material, wherein each overlying interconnect conductive structure that is part of the seventh electrical connection has a respective top surface with an entirety of a periphery of the respective top surface defined by a corresponding first end, a corresponding second end, a corresponding first edge, and a corresponding second edge, such that a total distance along the entirety of the periphery of the respective top surface is equal to a sum of a total distance along the corresponding first edge and a total distance along the corresponding second edge and a total distance along the corresponding first end and a total distance along the corresponding second end, wherein the total distance along the corresponding first edge is greater than two times the total distance along the corresponding first end and is greater than two times the total distance along the corresponding second end, wherein the total distance along the corresponding second edge is greater than two times the total distance along the corresponding first end and is greater than two times the total distance along the corresponding second end, wherein the corresponding first end extends from the corresponding first edge to the corresponding second edge and is located principally within a space between the corresponding first edge and the corresponding second edge, wherein the corresponding second end extends from the corresponding first edge to the corresponding second edge and is located principally within a space between the corresponding first edge and the corresponding second edge, wherein each overlying interconnect conductive structure that is part of the seventh electrical connection has a respective lengthwise centerline oriented along its respective top surface to extend from its corresponding first end to its corresponding second end, with each of the corresponding first edge and the corresponding second edge being substantially straight and oriented substantially parallel to its respective lengthwise centerline, wherein the gate electrode of the second transistor of the first transistor type is electrically connected to the gate electrode of the third transistor of the second transistor type through an eighth electrical connection, wherein each transistor of the first transistor type having its gate electrode formed by any of the at least eight conductive structures is included in a first collection of transistors, and wherein each transistor of the second transistor type having its gate electrode formed by any of the at least eight conductive structures is included in a second collection of transistors, wherein the first collection of transistors is separated from the second collection of transistors by an inner sub-region of the region, wherein the inner sub-region does not include a source or a drain of any transistor.

2. The semiconductor chip as recited in claim 1, wherein the region includes a first interconnect conductive structure positioned within either of a first interconnect level, a second interconnect level, a third interconnect level, or a fourth interconnect level, the first interconnect conductive structure having a top surface, an entirety of a periphery of the top surface of the first interconnect conductive structure defined by a first end of the first interconnect conductive structure, a second end of the first interconnect conductive structure, a first edge of the first interconnect conductive structure, and a second edge of the first interconnect conductive structure, such that a total distance along the entirety of the periphery of the top surface of the first interconnect conductive structure is equal to a sum of a total distance along the first edge of the first interconnect conductive structure and a total distance along the second edge of the first interconnect conductive structure and a total distance along the first end of the first interconnect conductive structure and a total distance along the second end of the first interconnect conductive structure, wherein the total distance along the first edge of the first interconnect conductive structure is greater than two times the total distance along the first end of the first interconnect conductive structure, wherein the total distance along the first edge of the first interconnect conductive structure is greater than two times the total distance along the second end of the first interconnect conductive structure, wherein the total distance along the second edge of the first interconnect conductive structure is greater than two times the total distance along the first end of the first interconnect conductive structure, wherein the total distance along the second edge of the first interconnect conductive structure is greater than two times the total distance along the second end of the first interconnect conductive structure, wherein the first end of the first interconnect conductive structure extends from the first edge of the first interconnect conductive structure to the second edge of the first interconnect conductive structure and is located principally within a space between the first and second edges of the first interconnect conductive structure, wherein the second end of the first interconnect conductive structure extends from the first edge of the first interconnect conductive structure to the second edge of the first interconnect conductive structure and is located principally within the space between the first and second edges of the first interconnect conductive structure, the first interconnect conductive structure having a lengthwise centerline oriented in the first direction along its top surface and extending from its first end to its second end, wherein the first edge of the first interconnect conductive structure is substantially straight and is oriented substantially parallel to the lengthwise centerline of the first interconnect conductive structure, wherein the second edge of the first interconnect conductive structure is substantially straight and is oriented substantially parallel to the lengthwise centerline of the first interconnect conductive structure, wherein the first interconnect conductive structure has a length measured along its lengthwise centerline from its first end to its second end, wherein the first interconnect conductive structure has a width measured in the second direction perpendicular to the first direction at a midpoint of the lengthwise centerline of the first interconnect conductive structure, wherein the first interconnect level is formed at a vertical position within the semiconductor chip above the at least eight conductive structures, wherein the first interconnect level is separated from the co-planar top surfaces of the at least eight conductive structures by at least one dielectric material, wherein the second interconnect level is formed at a vertical position within the semiconductor chip above the first interconnect level, wherein the third interconnect level is formed at a vertical position within the semiconductor chip above the second interconnect level, and wherein the fourth interconnect level is formed at a vertical position within the semiconductor chip above the third interconnect level.

3. The semiconductor chip as recited in claim 2, wherein the region includes a second interconnect conductive structure positioned next to and spaced apart from the first interconnect conductive structure in a same interconnect level as the first interconnect conductive structure, the second interconnect conductive structure having a top surface, an entirety of a periphery of the top surface of the second interconnect conductive structure defined by a first end of the second interconnect conductive structure, a second end of the second interconnect conductive structure, a first edge of the second interconnect conductive structure, and a second edge of the second interconnect conductive structure, such that a total distance along the entirety of the periphery of the top surface of the second interconnect conductive structure is equal to a sum of a total distance along the first edge of the second interconnect conductive structure and a total distance along the second edge of the second interconnect conductive structure and a total distance along the first end of the second interconnect conductive structure and a total distance along the second end of the second interconnect conductive structure, wherein the total distance along the first edge of the second interconnect conductive structure is greater than two times the total distance along the first end of the second interconnect conductive structure, wherein the total distance along the first edge of the second interconnect conductive structure is greater than two times the total distance along the second end of the second interconnect conductive structure, wherein the total distance along the second edge of the second interconnect conductive structure is greater than two times the total distance along the first end of the second interconnect conductive structure, wherein the total distance along the second edge of the second interconnect conductive structure is greater than two times the total distance along the second end of the second interconnect conductive structure, wherein the first end of the second interconnect conductive structure extends from the first edge of the second interconnect conductive structure to the second edge of the second interconnect conductive structure and is located principally within a space between the first and second edges of the second interconnect conductive structure, wherein the second end of the second interconnect conductive structure extends from the first edge of the second interconnect conductive structure to the second edge of the second interconnect conductive structure and is located principally within the space between the first and second edges of the second interconnect conductive structure, the second interconnect conductive structure having a lengthwise centerline oriented in the first direction along its top surface and extending from its first end to its second end, wherein the first edge of the second interconnect conductive structure is substantially straight and is oriented substantially parallel to the lengthwise centerline of the second interconnect conductive structure, wherein the second edge of the second interconnect conductive structure is substantially straight and is oriented substantially parallel to the lengthwise centerline of the second interconnect conductive structure, wherein the second interconnect conductive structure has a length measured along its lengthwise centerline from its first end to its second end, wherein the second interconnect conductive structure has a width measured in the second direction perpendicular to the first direction at a midpoint of the lengthwise centerline of the second interconnect conductive structure.

4. The semiconductor chip as recited in claim 3, wherein the first and second interconnect conductive structures are positioned such that a distance as measured in the second direction between their lengthwise centerlines is substantially equal to a second pitch, wherein the second pitch is a fractional multiple of the first pitch.

5. The semiconductor chip as recited in claim 4, wherein the second pitch is less than or equal to the first pitch.

6. The semiconductor chip as recited in claim 5, wherein at least one of the at least eight conductive structures within the region does not form a gate electrode of any transistor and has a width as measured in the second direction that is substantially equal to a width as measured in the second direction of another of the at least eight conductive structures.

7. The semiconductor chip as recited in claim 6, wherein the first and second interconnect conductive structures are positioned within either of the first interconnect level, the second interconnect level, or the third interconnect level.

8. The semiconductor chip as recited in claim 1, wherein the region includes a first interconnect conductive structure positioned within either of a first interconnect level, a second interconnect level, a third interconnect level, or a fourth interconnect level, the first interconnect conductive structure having a top surface, an entirety of a periphery of the top surface of the first interconnect conductive structure defined by a first end of the first interconnect conductive structure, a second end of the first interconnect conductive structure, a first edge of the first interconnect conductive structure, and a second edge of the first interconnect conductive structure, such that a total distance along the entirety of the periphery of the top surface of the first interconnect conductive structure is equal to a sum of a total distance along the first edge of the first interconnect conductive structure and a total distance along the second edge of the first interconnect conductive structure and a total distance along the first end of the first interconnect conductive structure and a total distance along the second end of the first interconnect conductive structure, wherein the total distance along the first edge of the first interconnect conductive structure is greater than two times the total distance along the first end of the first interconnect conductive structure, wherein the total distance along the first edge of the first interconnect conductive structure is greater than two times the total distance along the second end of the first interconnect conductive structure, wherein the total distance along the second edge of the first interconnect conductive structure is greater than two times the total distance along the first end of the first interconnect conductive structure, wherein the total distance along the second edge of the first interconnect conductive structure is greater than two times the total distance along the second end of the first interconnect conductive structure, wherein the first end of the first interconnect conductive structure extends from the first edge of the first interconnect conductive structure to the second edge of the first interconnect conductive structure and is located principally within a space between the first and second edges of the first interconnect conductive structure, wherein the second end of the first interconnect conductive structure extends from the first edge of the first interconnect conductive structure to the second edge of the first interconnect conductive structure and is located principally within the space between the first and second edges of the first interconnect conductive structure, the first interconnect conductive structure having a lengthwise centerline oriented in the second direction along its top surface and extending from its first end to its second end, wherein the first edge of the first interconnect conductive structure is substantially straight and is oriented substantially parallel to the lengthwise centerline of the first interconnect conductive structure, wherein the second edge of the first interconnect conductive structure is substantially straight and is oriented substantially parallel to the lengthwise centerline of the first interconnect conductive structure, wherein the first interconnect conductive structure has a length measured along its lengthwise centerline from its first end to its second end, wherein the first interconnect conductive structure has a width measured in the first direction perpendicular to the second direction at a midpoint of the lengthwise centerline of the first interconnect conductive structure, wherein the first interconnect level is formed at a vertical position within the semiconductor chip above the at least eight conductive structures, wherein the first interconnect level is separated from the co-planar top surfaces of the at least eight conductive structures by at least one dielectric material, wherein the second interconnect level is formed at a vertical position within the semiconductor chip above the first interconnect level, wherein the third interconnect level is formed at a vertical position within the semiconductor chip above the second interconnect level, and wherein the fourth interconnect level is formed at a vertical position within the semiconductor chip above the third interconnect level.

9. The semiconductor chip as recited in claim 8, wherein the region includes a second interconnect conductive structure positioned in a same interconnect level as the first interconnect conductive structure, the second interconnect conductive structure having a top surface, an entirety of a periphery of the top surface of the second interconnect conductive structure defined by a first end of the second interconnect conductive structure, a second end of the second interconnect conductive structure, a first edge of the second interconnect conductive structure, and a second edge of the second interconnect conductive structure, such that a total distance along the entirety of the periphery of the top surface of the second interconnect conductive structure is equal to a sum of a total distance along the first edge of the second interconnect conductive structure and a total distance along the second edge of the second interconnect conductive structure and a total distance along the first end of the second interconnect conductive structure and a total distance along the second end of the second interconnect conductive structure, wherein the total distance along the first edge of the second interconnect conductive structure is greater than two times the total distance along the first end of the second interconnect conductive structure, wherein the total distance along the first edge of the second interconnect conductive structure is greater than two times the total distance along the second end of the second interconnect conductive structure, wherein the total distance along the second edge of the second interconnect conductive structure is greater than two times the total distance along the first end of the second interconnect conductive structure, wherein the total distance along the second edge of the second interconnect conductive structure is greater than two times the total distance along the second end of the second interconnect conductive structure, wherein the first end of the second interconnect conductive structure extends from the first edge of the second interconnect conductive structure to the second edge of the second interconnect conductive structure and is located principally within a space between the first and second edges of the second interconnect conductive structure, wherein the second end of the second interconnect conductive structure extends from the first edge of the second interconnect conductive structure to the second edge of the second interconnect conductive structure and is located principally within the space between the first and second edges of the second interconnect conductive structure, the second interconnect conductive structure having a lengthwise centerline oriented in the second direction along its top surface and extending from its first end to its second end, wherein the first edge of the second interconnect conductive structure is substantially straight and is oriented substantially parallel to the lengthwise centerline of the second interconnect conductive structure, wherein the second edge of the second interconnect conductive structure is substantially straight and is oriented substantially parallel to the lengthwise centerline of the second interconnect conductive structure, wherein the second interconnect conductive structure has a length measured along its lengthwise centerline from its first end to its second end, wherein the second interconnect conductive structure has a width measured in the first direction perpendicular to the second direction at a midpoint of the lengthwise centerline of the second interconnect conductive structure, wherein the first and second interconnect conductive structures are positioned next to and spaced apart from each other such that a distance as measured in the first direction between their lengthwise centerlines is substantially equal to a second pitch.

10. The semiconductor chip as recited in claim 9, wherein the region includes a third interconnect conductive structure positioned in the same interconnect level as the first and second interconnect conductive structures, the third interconnect conductive structure having a top surface, an entirety of a periphery of the top surface of the third interconnect conductive structure defined by a first end of the third interconnect conductive structure, a second end of the third interconnect conductive structure, a first edge of the third interconnect conductive structure, and a second edge of the third interconnect conductive structure, such that a total distance along the entirety of the periphery of the top surface of the third interconnect conductive structure is equal to a sum of a total distance along the first edge of the third interconnect conductive structure and a total distance along the second edge of the third interconnect conductive structure and a total distance along the first end of the third interconnect conductive structure and a total distance along the second end of the third interconnect conductive structure, wherein the total distance along the first edge of the third interconnect conductive structure is greater than two times the total distance along the first end of the third interconnect conductive structure, wherein the total distance along the first edge of the third interconnect conductive structure is greater than two times the total distance along the second end of the third interconnect conductive structure, wherein the total distance along the second edge of the third interconnect conductive structure is greater than two times the total distance along the first end of the third interconnect conductive structure, wherein the total distance along the second edge of the third interconnect conductive structure is greater than two times the total distance along the second end of the third interconnect conductive structure, wherein the first end of the third interconnect conductive structure extends from the first edge of the third interconnect conductive structure to the second edge of the third interconnect conductive structure and is located principally within a space between the first and second edges of the third interconnect conductive structure, wherein the second end of the third interconnect conductive structure extends from the first edge of the third interconnect conductive structure to the second edge of the third interconnect conductive structure and is located principally within the space between the first and second edges of the third interconnect conductive structure, the third interconnect conductive structure having a lengthwise centerline oriented in the second direction along its top surface and extending from its first end to its second end, wherein the first edge of the third interconnect conductive structure is substantially straight and is oriented substantially parallel to the lengthwise centerline of the third interconnect conductive structure, wherein the second edge of the third interconnect conductive structure is substantially straight and is oriented substantially parallel to the lengthwise centerline of the third interconnect conductive structure, wherein the third interconnect conductive structure has a length measured along its lengthwise centerline from its first end to its second end, wherein the third interconnect conductive structure has a width measured in the first direction perpendicular to the second direction at a midpoint of the lengthwise centerline of the third interconnect conductive structure, wherein the region includes a fourth interconnect conductive structure positioned in the same interconnect level as the first, second, and third interconnect conductive structures, the fourth interconnect conductive structure having a top surface, an entirety of a periphery of the top surface of the fourth interconnect conductive structure defined by a first end of the fourth interconnect conductive structure, a second end of the fourth interconnect conductive structure, a first edge of the fourth interconnect conductive structure, and a second edge of the fourth interconnect conductive structure, such that a total distance along the entirety of the periphery of the top surface of the fourth interconnect conductive structure is equal to a sum of a total distance along the first edge of the fourth interconnect conductive structure and a total distance along the second edge of the fourth interconnect conductive structure and a total distance along the first end of the fourth interconnect conductive structure and a total distance along the second end of the fourth interconnect conductive structure, wherein the total distance along the first edge of the fourth interconnect conductive structure is greater than two times the total distance along the first end of the fourth interconnect conductive structure, wherein the total distance along the first edge of the fourth interconnect conductive structure is greater than two times the total distance along the second end of the fourth interconnect conductive structure, wherein the total distance along the second edge of the fourth interconnect conductive structure is greater than two times the total distance along the first end of the fourth interconnect conductive structure, wherein the total distance along the second edge of the fourth interconnect conductive structure is greater than two times the total distance along the second end of the fourth interconnect conductive structure, wherein the first end of the fourth interconnect conductive structure extends from the first edge of the fourth interconnect conductive structure to the second edge of the fourth interconnect conductive structure and is located principally within a space between the first and second edges of the fourth interconnect conductive structure, wherein the second end of the fourth interconnect conductive structure extends from the first edge of the fourth interconnect conductive structure to the second edge of the fourth interconnect conductive structure and is located principally within the space between the first and second edges of the fourth interconnect conductive structure, the fourth interconnect conductive structure having a lengthwise centerline oriented in the second direction along its top surface and extending from its first end to its second end, wherein the first edge of the fourth interconnect conductive structure is substantially straight and is oriented substantially parallel to the lengthwise centerline of the fourth interconnect conductive structure, wherein the second edge of the fourth interconnect conductive structure is substantially straight and is oriented substantially parallel to the lengthwise centerline of the fourth interconnect conductive structure, wherein the fourth interconnect conductive structure has a length measured along its lengthwise centerline from its first end to its second end, wherein the fourth interconnect conductive structure has a width measured in the first direction perpendicular to the second direction at a midpoint of the lengthwise centerline of the fourth interconnect conductive structure, wherein the third and fourth interconnect conductive structures are positioned next to and spaced apart from each other such that a distance as measured in the first direction between their lengthwise centerlines is substantially equal to the second pitch.

11. The semiconductor chip as recited in claim 10, wherein at least one of the at least eight conductive structures within the region does not form a gate electrode of any transistor and has a width as measured in the second direction that is substantially equal to a width as measured in the second direction of another of the at least eight conductive structures.

12. The semiconductor chip as recited in claim 11, wherein the first, second, third, and fourth interconnect conductive structures are positioned within either of the first interconnect level, the second interconnect level, or the third interconnect level.

13. The semiconductor chip as recited in claim 1, wherein the eighth electrical connection includes one or more overlying interconnect conductive structures, or the ninth electrical connection includes one or more overlying interconnect conductive structures, or both the eighth and the ninth electrical connections include one or more overlying electrical connections, wherein each overlying interconnect conductive structure is formed at a respective vertical position within the semiconductor chip overlying some of the at least eight conductive structures so as to be separated from the co-planar top surfaces of the at least eight conductive structures by at least one dielectric material, wherein each overlying interconnect conductive structure that is part of the eighth or ninth electrical connection has a respective top surface with an entirety of a periphery of the respective top surface defined by a corresponding first end, a corresponding second end, a corresponding first edge, and a corresponding second edge, such that a total distance along the entirety of the periphery of the respective top surface is equal to a sum of a total distance along the corresponding first edge and a total distance along the corresponding second edge and a total distance along the corresponding first end and a total distance along the corresponding second end, wherein the total distance along the corresponding first edge is greater than two times the total distance along the corresponding first end and is greater than two times the total distance along the corresponding second end, wherein the total distance along the corresponding second edge is greater than two times the total distance along the corresponding first end and is greater than two times the total distance along the corresponding second end, wherein the corresponding first end extends from the corresponding first edge to the corresponding second edge and is located principally within a space between the corresponding first edge and the corresponding second edge, wherein the corresponding second end extends from the corresponding first edge to the corresponding second edge and is located principally within a space between the corresponding first edge and the corresponding second edge, wherein each overlying interconnect conductive structure that is part of the eighth or ninth electrical connection has a respective lengthwise centerline oriented along its respective top surface to extend from its corresponding first end to its corresponding second end, with each of the corresponding first edge and the corresponding second edge being substantially straight and oriented substantially parallel to its respective lengthwise centerline.

14. The semiconductor chip as recited in claim 1, wherein the lengthwise centerline of the second conductive structure is substantially aligned with the lengthwise centerline of the third conductive structure, and wherein the lengthwise centerline of the fourth conductive structure is substantially aligned with the lengthwise centerline of the fifth conductive structure.

15. The semiconductor chip as recited in claim 14, wherein a gate electrode of the fourth transistor of the first transistor type and a gate electrode of the fourth transistor of the second transistor type are formed by respective portions of a single one of the at least eight conductive structures.

16. The semiconductor chip as recited in claim 15, wherein at least one of the at least eight conductive structures within the region is a non-gate forming conductive structure that does not form a gate electrode of any transistor, the non-gate forming conductive structure positioned between at least two neighboring conductive structures of the at least eight conductive structures, with at least one of the at least two neighboring conductive structures forming at least one gate electrode of at least one transistor, the non-gate forming conductive structure positioned such that its lengthwise centerline is separated from the lengthwise centerlines of each of the at least two neighboring conductive structures by the first pitch as measured in the second direction, the non-gate forming conductive structure having a width as measured in the second direction that is substantially equal to a width as measured in the second direction of at least one of the at least two neighboring conductive structures, the non-gate forming conductive structure having an overall length as measured in the first direction that is substantially equal to an overall length as measured in the first direction of at least one of the at least two neighboring conductive structures.

17. The semiconductor chip as recited in claim 16, wherein the region includes a first connection forming conductive structure positioned to physically join to the top surface of the second conductive structure, wherein the first connection forming conductive structure is positioned a first connection distance away from a nearest gate electrode forming portion of the second conductive structure, the first connection distance measured in the first direction between closest located portions of the first connection forming conductive structure and the nearest gate electrode forming portion of the second conductive structure, wherein the region includes a second connection forming conductive structure positioned to physically join to the top surface of the third conductive structure, wherein the second connection forming conductive structure is positioned a second connection distance away from a nearest gate electrode forming portion of the third conductive structure, the second connection distance measured in the first direction between closest located portions of the second connection forming conductive structure and the nearest gate electrode forming portion of the third conductive structure, wherein the region includes a third connection forming conductive structure positioned to physically join to the top surface of the fourth conductive structure, wherein the third connection forming conductive structure is positioned a third connection distance away from a nearest gate electrode forming portion of the fourth conductive structure, the third connection distance measured in the first direction between closest located portions of the third connection forming conductive structure and the nearest gate electrode forming portion of the fourth conductive structure, wherein the region includes a fourth connection foil ng conductive structure positioned to physically join to the top surface of the fifth conductive structure, wherein the fourth connection forming conductive structure is positioned a fourth connection distance away from a nearest gate electrode forming portion of the fifth conductive structure, the fourth connection distance measured in the first direction between closest located portions of the fourth connection forming conductive structure and the nearest gate electrode forming portion of the fifth conductive structure, wherein at least two of the first, second, third, and fourth connection distances are different.

18. The semiconductor chip as recited in claim 17, wherein the eighth electrical connection includes one or more overlying interconnect conductive structures formed at a respective vertical position within the semiconductor chip overlying some of the at least eight conductive structures so as to be separated from the co-planar top surfaces of the at least eight conductive structures by at least one dielectric material, wherein each overlying interconnect conductive structure that is part of the eighth electrical connection has a respective top surface with an entirety of a periphery of the respective top surface defined by a corresponding first end, a corresponding second end, a corresponding first edge, and a corresponding second edge, such that a total distance along the entirety of the periphery of the respective top surface is equal to a sum of a total distance along the corresponding first edge and a total distance along the corresponding second edge and a total distance along the corresponding first end and a total distance along the corresponding second end, wherein the total distance along the corresponding first edge is greater than two times the total distance along the corresponding first end and is greater than two times the total distance along the corresponding second end, wherein the total distance along the corresponding second edge is greater than two times the total distance along the corresponding first end and is greater than two times the total distance along the corresponding second end, wherein the corresponding first end extends from the corresponding first edge to the corresponding second edge and is located principally within a space between the corresponding first edge and the corresponding second edge, wherein the corresponding second end extends from the corresponding first edge to the corresponding second edge and is located principally within a space between the corresponding first edge and the corresponding second edge, wherein each overlying interconnect conductive structure that is part of the eighth electrical connection has a respective lengthwise centerline oriented along its respective top surface to extend from its corresponding first end to its corresponding second end, with each of the corresponding first edge and the corresponding second edge being substantially straight and oriented substantially parallel to its respective lengthwise centerline.

19. The semiconductor chip as recited in claim 14, wherein the eighth electrical connection includes one or more overlying interconnect conductive structures formed at a respective vertical position within the semiconductor chip overlying some of the at least eight conductive structures so as to be separated from the co-planar top surfaces of the at least eight conductive structures by at least one dielectric material, wherein each overlying interconnect conductive structure that is part of the eighth electrical connection has a respective top surface with an entirety of a periphery of the respective top surface defined by a corresponding first end, a corresponding second end, a corresponding first edge, and a corresponding second edge, such that a total distance along the entirety of the periphery of the respective top surface is equal to a sum of a total distance along the corresponding first edge and a total distance along the corresponding second edge and a total distance along the corresponding first end and a total distance along the corresponding second end, wherein the total distance along the corresponding first edge is greater than two times the total distance along the corresponding first end and is greater than two times the total distance along the corresponding second end, wherein the total distance along the corresponding second edge is greater than two times the total distance along the corresponding first end and is greater than two times the total distance along the corresponding second end, wherein the corresponding first end extends from the corresponding first edge to the corresponding second edge and is located principally within a space between the corresponding first edge and the corresponding second edge, wherein the corresponding second end extends from the corresponding first edge to the corresponding second edge and is located principally within a space between the corresponding first edge and the corresponding second edge, wherein each overlying interconnect conductive structure that is part of the eighth electrical connection has a respective lengthwise centerline oriented along its respective top surface to extend from its corresponding first end to its corresponding second end, with each of the corresponding first edge and the corresponding second edge being substantially straight and oriented substantially parallel to its respective lengthwise centerline.

20. The semiconductor chip as recited in claim 14, wherein three of the first, second, third, fourth, and fifth conductive structures have different lengths.

21. The semiconductor chip as recited in claim 20, wherein the region includes a first connection forming conductive structure positioned to physically join to the top surface of the second conductive structure, wherein the region includes a second connection forming conductive structure positioned to physically join to the top surface of the third conductive structure, wherein the region includes a third connection forming conductive structure positioned to physically join to the top surface of the fourth conductive structure, wherein the region includes a fourth connection forming conductive structure positioned to physically join to the top surface of the fifth conductive structure, wherein at least one of the first, second, third, and fourth connection forming conductive structures is positioned at a respective location that is not directly above any gate electrode of any transistor of the first collection of transistors and that is not directly above any gate electrode of any transistor of the second collection of transistors and that is not directly above the inner sub-region of the region.

22. The semiconductor chip as recited in claim 21, wherein the first connection forming conductive structure is positioned a first connection distance away from a nearest gate electrode forming portion of the second conductive structure, the first connection distance measured in the first direction between closest located portions of the first connection forming conductive structure and the nearest gate electrode forming portion of the second conductive structure,
- wherein the second connection forming conductive structure is positioned a second connection distance away from a nearest gate electrode forming portion of the third conductive structure, the second connection distance measured in the first direction between closest located portions of the second connection forming conductive structure and the nearest gate electrode forming portion of the third conductive structure,
- wherein the third connection forming conductive structure is positioned a third connection distance away from a nearest gate electrode forming portion of the fourth conductive structure, the third connection distance measured in the first direction between closest located portions of the third connection forming conductive structure and the nearest gate electrode forming portion of the fourth conductive structure,
- wherein the fourth connection forming conductive structure is positioned a fourth connection distance away from a nearest gate electrode forming portion of the fifth conductive structure, the fourth connection distance measured in the first direction between closest located portions of the fourth connection forming conductive structure and the nearest gate electrode forming portion of the fifth conductive structure,
- wherein at least two of the first, second, third, and fourth connection distances are different.

23. The semiconductor chip as recited in claim 22, wherein the first connection forming conductive structure is positioned a first extension distance away from an extension end of the second conductive structure, wherein the extension end of the second conductive structure is either the first end or the second end of the second conductive structure, the first extension distance measured in the first direction pointing away from the gate electrode of the second transistor of the first transistor type from a location on the first connection forming conductive structure closest to the extension end of the second conductive structure,
- wherein the second connection forming conductive structure is positioned a second extension distance away from an extension end of the third conductive structure, wherein the extension end of the third conductive structure is either the first end or the second end of the third conductive structure, the second extension distance measured in the first direction pointing away from the gate electrode of the second transistor of the second transistor type from a location on the second connection forming conductive structure closest to the extension end of the third conductive structure,
- wherein the third connection forming conductive structure is positioned a third extension distance away from an extension end of the fourth conductive structure, wherein the extension end of the fourth conductive structure is either the first end or the second end of the fourth conductive structure, the third extension distance measured in the first direction pointing away from the gate electrode of the third transistor of the first transistor type from a location on the third connection forming conductive structure closest to the extension end of the fourth conductive structure,
- wherein the fourth connection forming conductive structure is positioned a fourth extension distance away from an extension end of the fifth conductive structure, wherein the extension end of the fifth conductive structure is either the first end or the second end of the fifth conductive structure, the fourth extension distance measured in the first direction pointing away from the gate electrode of the third transistor of the second transistor type from a location on the fourth connection forming conductive structure closest to the extension end of the fifth conductive structure, and
- wherein at least two of the first, second, third, and fourth extension distances are different.

24. The semiconductor chip as recited in claim 21, wherein at least two of the first, second, third, and fourth connection forming conductive structures is positioned at a respective location that is not directly above any gate electrode of any transistor of the first collection of transistors and that is not directly above any gate electrode of any transistor of the second collection of transistors and that is not directly above the inner sub-region of the region.

25. The semiconductor chip as recited in claim 24, wherein at least one of the at least eight conductive structures within the region is a non-gate forming conductive structure that does not form a gate electrode of any transistor,
- the non-gate forming conductive structure positioned between at least two neighboring conductive structures of the at least eight conductive structures, with at least one of the at least two neighboring conductive structures forming at least one gate electrode of at least one transistor,
- the non-gate forming conductive structure positioned such that its lengthwise centerline is separated from the lengthwise centerlines of each of the at least two neighboring conductive structures by the first pitch as measured in the second direction,
- the non-gate forming conductive structure having a width as measured in the second direction that is substantially equal to a width as measured in the second direction of at least one of the at least two neighboring conductive structures.

26. The semiconductor chip as recited in claim 25, wherein the region includes a first gate contact positioned to physically contact the top surface of the first conductive structure, the first gate contact substantially centered in the second direction upon the first conductive structure, the first gate contact formed to extend in a vertical direction substantially perpendicular to the substrate of the semiconductor chip from the top surface of the first conductive structure through a dielectric material to contact at least one interconnect conductive structure,
- wherein the region includes a second gate contact positioned to physically contact the top surface of the second conductive structure, the second gate contact substantially centered in the second direction upon the second conductive structure, the second gate contact formed to extend in the vertical direction substantially perpendicular to the substrate of the semiconductor chip from the top surface of the second conductive structure through the dielectric material to contact at least one interconnect conductive structure,
- wherein the region includes a third gate contact positioned to physically contact the top surface of the third conductive structure, the third gate contact substantially centered in the second direction upon the third conductive structure, the third gate contact formed to extend in the vertical direction substantially perpendicular to the substrate of the semiconductor chip from the top surface of the third conductive structure through the dielectric material to contact at least one interconnect conductive structure, wherein the region includes a fourth gate contact positioned to physically contact the top surface of the fourth conductive structure, the fourth gate contact substantially centered in the second direction upon the fourth conductive structure, the fourth gate contact formed to extend in the vertical direction substantially perpendicular to the substrate of the semiconductor chip from the top surface of the fourth conductive structure through the dielectric material to contact at least one interconnect conductive structure, wherein the region includes a fifth gate contact positioned to physically contact the top surface of the fifth conductive structure, the fifth gate contact substantially centered in the second direction upon the fifth conductive structure, the fifth gate contact formed to extend in the vertical direction substantially perpendicular to the substrate of the semiconductor chip from the top surface of the fifth conductive structure through the dielectric material to contact at least one interconnect conductive structure.

27. The semiconductor chip as recited in claim 25, wherein the first connection forming conductive structure is positioned a first extension distance away from an extension end of the second conductive structure, wherein the extension end of the second conductive structure is either the first end or the second end of the second conductive structure, the first extension distance measured in the first direction pointing away from the gate electrode of the second transistor of the first transistor type from a location on the first connection forming conductive structure closest to the extension end of the second conductive structure, wherein the second connection forming conductive structure is positioned a second extension distance away from an extension end of the third conductive structure, wherein the extension end of the third conductive structure is either the first end or the second end of the third conductive structure, the second extension distance measured in the first direction pointing away from the gate electrode of the second transistor of the second transistor type from a location on the second connection forming conductive structure closest to the extension end of the third conductive structure, wherein the third connection forming conductive structure is positioned a third extension distance away from an extension end of the fourth conductive structure, wherein the extension end of the fourth conductive structure is either the first end or the second end of the fourth conductive structure, the third extension distance measured in the first direction pointing away from the gate electrode of the third transistor of the first transistor type from a location on the third connection forming conductive structure closest to the extension end of the fourth conductive structure, wherein the fourth connection forming conductive structure is positioned a fourth extension distance away from an extension end of the fifth conductive structure, wherein the extension end of the fifth conductive structure is either the first end or the second end of the fifth conductive structure, the fourth extension distance measured in the first direction pointing away from the gate electrode of the third transistor of the second transistor type from a location on the fourth connection forming conductive structure closest to the extension end of the fifth conductive structure, and wherein at least two of the first, second, third, and fourth extension distances are different.

28. A method for manufacturing an integrated circuit within a semiconductor chip, comprising:

forming a plurality of transistors within a region of the semiconductor chip, each of the plurality of transistors in the region forming part of circuitry associated with execution of one or more logic functions, the plurality of transistors having respective gate electrodes formed by some of at least eight conductive structures present within the region, wherein forming the plurality of transistors includes forming each of the at least eight conductive structures to respectively have a corresponding top surface, wherein an entirety of a periphery of the corresponding top surface is defined by a corresponding first end, a corresponding second end, a corresponding first edge, and a corresponding second edge, such that a total distance along the entirety of the periphery of the corresponding top surface is equal to a sum of a total distance along the corresponding first edge and a total distance along the corresponding second edge and a total distance along the corresponding first end and a total distance along the corresponding second end, wherein the total distance along the corresponding first edge is greater than two times the total distance along the corresponding first end, wherein the total distance along the corresponding first edge is greater than two times the total distance along the corresponding second end, wherein the total distance along the corresponding second edge is greater than two times the total distance along the corresponding first end, wherein the total distance along the corresponding second edge is greater than two times the total distance along the corresponding second end, wherein the corresponding first end extends from the corresponding first edge to the corresponding second edge and is located principally within a space between the corresponding first and second edges, wherein the corresponding second end extends from the corresponding first edge to the corresponding second edge and is located principally within the space between the corresponding first and second edges, the top surfaces of the at least eight conductive structures co-planar with each other, wherein forming the plurality of transistors includes forming each of the at least eight conductive structures to have a corresponding lengthwise centerline oriented in a first direction along its top surface and extending from its first end to its second end, each of the at least eight conductive structures having a length as measured along its lengthwise centerline from its first end to its second end, wherein the first edge of each of the at least eight conductive structures is substantially straight, wherein the second edge of each of the at least eight conductive structures is substantially straight, each of the at least eight conductive structures having both its first edge and its second edge oriented substantially parallel to its lengthwise centerline, each of the at least eight conductive structures having a width measured in a second direction perpendicular to the first direction at a midpoint of its lengthwise centerline, wherein the width of each of the at least eight conductive structures is less than 45 nanometers, each of the first direction and the second direction oriented substantially parallel to the co-planar top surfaces of the at least eight conductive structures, wherein forming the plurality of transistors includes positioning the at least eight conductive structures in a side-by-side manner such that each of the at least eight conductive structures is positioned to have at least a portion of its length beside at least a portion of the length of another of the at least eight conductive structures, and wherein each of the at least eight conductive structures is positioned such that a distance as measured in the second direction between its lengthwise centerline and the lengthwise centerline of at least one other of the at least eight conductive structures is substantially equal to a first pitch that is less than or equal to about 193 nanometers, the at least eight conductive structures including a first conductive structure, the first conductive structure including a portion that forms a gate electrode of first transistor of a first transistor type, the first conductive structure including a portion that forms a gate electrode of a first transistor of a second transistor type, the at least eight conductive structures including a second conductive structure, the second conductive structure including a portion that forms a gate electrode of a second transistor of the first transistor type, wherein any transistor having its gate electrode formed by the second conductive structure is of the first transistor type, the at least eight conductive structures including a third conductive structure, the third conductive structure including a portion that forms a gate electrode of a second transistor of the second transistor type, wherein any transistor having its gate electrode formed by the third conductive structure is of the second transistor type, the at least eight conductive structures including a fourth conductive structure, the fourth conductive structure including a portion that forms a gate electrode of a third transistor of the first transistor type, wherein any transistor having its gate electrode formed by the fourth conductive structure is of the first transistor type, the at least eight conductive structures including a fifth conductive structure, the fifth conductive structure including a portion that forms a gate electrode of a third transistor of the second transistor type, wherein any transistor having its gate electrode formed by the fifth conductive structure is of the second transistor type, the first transistor of the first transistor type including a first diffusion terminal electrically connected to a first diffusion terminal of the second transistor of the first transistor type through a first electrical connection, the first transistor of the second transistor type including a first diffusion terminal electrically connected to a first diffusion terminal of the second transistor of the second transistor type through a second electrical connection, the second transistor of the first transistor type including a second diffusion terminal electrically connected to a first diffusion terminal of the third transistor of the first transistor type through a third electrical connection, the second transistor of the second transistor type including a second diffusion terminal electrically connected to a first diffusion terminal of the third transistor of the second transistor type through a fourth electrical connection, the third transistor of the first transistor type including a second diffusion terminal electrically connected to a first diffusion terminal of a fourth transistor of the first transistor type through a fifth electrical connection, the third transistor of the second transistor type including a second diffusion terminal electrically connected to a first diffusion terminal of a fourth transistor of the second transistor type through a sixth electrical connection, wherein the third electrical connection is electrically connected to the fourth electrical connection through a seventh electrical connection, wherein the seventh electrical connection is formed to include one or more overlying interconnect conductive structures formed at a respective vertical position within the semiconductor chip overlying some of the at least eight conductive structures so as to be separated from the co-planar top surfaces of the at least eight conductive structures by at least one dielectric material, wherein each overlying interconnect conductive structure that is part of the seventh electrical connection has a respective top surface with an entirety of a periphery of the respective top surface defined by a corresponding first end, a corresponding second end, a corresponding first edge, and a corresponding second edge, such that a total distance along the entirety of the periphery of the respective top surface is equal to a sum of a total distance along the corresponding first edge and a total distance along the corresponding second edge and a total distance along the corresponding first end and a total distance along the corresponding second end, wherein the total distance along the corresponding first edge is greater than two times the total distance along the corresponding first end and is greater than two times the total distance along the corresponding second end, wherein the total distance along the corresponding second edge is greater than two times the total distance along the corresponding first end and is greater than two times the total distance along the corresponding second end, wherein the corresponding first end extends from the corresponding first edge to the corresponding second edge and is located principally within a space between the corresponding first edge and the corresponding second edge, wherein the corresponding second end extends from the corresponding first edge to the corresponding second edge and is located principally within a space between the corresponding first edge and the corresponding second edge, wherein each overlying interconnect conductive structure that is part of the seventh electrical connection has a respective lengthwise centerline oriented along its respective top surface to extend from its corresponding first end to its corresponding second end, with each of the corresponding first edge and the corresponding second edge being substantially straight and oriented substantially parallel to its respective lengthwise centerline, wherein the gate electrode of the second transistor of the first transistor type is electrically connected to the gate electrode of the third transistor of the second transistor type through an eighth electrical connection, wherein each transistor of the first transistor type having its gate electrode formed by any of the at least eight conductive structures is included in a first collection of transistors, and wherein each transistor of the second transistor type having its gate electrode formed by any of the at least eight conductive structures is included in a second collection of transistors, wherein the first collection of transistors is separated from the second collection of transistors by an inner sub-region of the region, wherein the inner sub-region does not include a source or a drain of any transistor, wherein the region has a size of about 965 nanometers as measured in the second direction.

29. The method as recited in claim 28, further comprising:

forming a first interconnect conductive structure positioned within either of a first interconnect level, a second interconnect level, a third interconnect level, or a fourth interconnect level, the first interconnect conductive structure formed to have a top surface, an entirety of a periphery of the top surface of the first interconnect conductive structure defined by a first end of the first interconnect conductive structure, a second end of the first interconnect conductive structure, a first edge of the first interconnect conductive structure, and a second edge of the first interconnect conductive structure, such that a total distance along the entirety of the periphery of the top surface of the first interconnect conductive structure is equal to a sum of a total distance along the first edge of the first interconnect conductive structure and a total distance along the second edge of the first interconnect conductive structure and a total distance along the first end of the first interconnect conductive structure and a total distance along the second end of the first interconnect conductive structure, wherein the total distance along the first edge of the first interconnect conductive structure is greater than two times the total distance along the first end of the first interconnect conductive structure, wherein the total distance along the first edge of the first interconnect conductive structure is greater than two times the total distance along the second end of the first interconnect conductive structure, wherein the total distance along the second edge of the first interconnect conductive structure is greater than two times the total distance along the first end of the first interconnect conductive structure, wherein the total distance along the second edge of the first interconnect conductive structure is greater than two times the total distance along the second end of the first interconnect conductive structure, wherein the first end of the first interconnect conductive structure extends from the first edge of the first interconnect conductive structure to the second edge of the first interconnect conductive structure and is located principally within a space between the first and second edges of the first interconnect conductive structure, wherein the second end of the first interconnect conductive structure extends from the first edge of the first interconnect conductive structure to the second edge of the first interconnect conductive structure and is located principally within the space between the first and second edges of the first interconnect conductive structure, the first interconnect conductive structure having a lengthwise centerline oriented in the first direction along its top surface and extending from its first end to its second end, wherein the first edge of the first interconnect conductive structure is substantially straight and is oriented substantially parallel to the lengthwise centerline of the first interconnect conductive structure, wherein the second edge of the first interconnect conductive structure is substantially straight and is oriented substantially parallel to the lengthwise centerline of the first interconnect conductive structure, wherein the first interconnect conductive structure has a length measured along its lengthwise centerline from its first end to its second end, wherein the first interconnect conductive structure has a width measured in the second direction perpendicular to the first direction at a midpoint of the lengthwise centerline of the first interconnect conductive structure; and forming a second interconnect conductive structure at a position next to and spaced apart from the first interconnect conductive structure in a same interconnect level as the first interconnect conductive structure, the second interconnect conductive structure formed to have a top surface, an entirety of a periphery of the top surface of the second interconnect conductive structure defined by a first end of the second interconnect conductive structure, a second end of the second interconnect conductive structure, a first edge of the second interconnect conductive structure, and a second edge of the second interconnect conductive structure, such that a total distance along the entirety of the periphery of the top surface of the second interconnect conductive structure is equal to a sum of a total distance along the first edge of the second interconnect conductive structure and a total distance along the second edge of the second interconnect conductive structure and a total distance along the first end of the second interconnect conductive structure and a total distance along the second end of the second interconnect conductive structure, wherein the total distance along the first edge of the second interconnect conductive structure is greater than two times the total distance along the first end of the second interconnect conductive structure, wherein the total distance along the first edge of the second interconnect conductive structure is greater than two times the total distance along the second end of the second interconnect conductive structure, wherein the total distance along the second edge of the second interconnect conductive structure is greater than two times the total distance along the first end of the second interconnect conductive structure, wherein the total distance along the second edge of the second interconnect conductive structure is greater than two times the total distance along the second end of the second interconnect conductive structure, wherein the first end of the second interconnect conductive structure extends from the first edge of the second interconnect conductive structure to the second edge of the second interconnect conductive structure and is located principally within a space between the first and second edges of the second interconnect conductive structure, wherein the second end of the second interconnect conductive structure extends from the first edge of the second interconnect conductive structure to the second edge of the second interconnect conductive structure and is located principally within the space between the first and second edges of the second interconnect conductive structure, the second interconnect conductive structure having a lengthwise centerline oriented in the first direction along its top surface and extending from its first end to its second end, wherein the first edge of the second interconnect conductive structure is substantially straight and is oriented substantially parallel to the lengthwise centerline of the second interconnect conductive structure, wherein the second edge of the second interconnect conductive structure is substantially straight and is oriented substantially parallel to the lengthwise centerline of the second interconnect conductive structure, wherein the second interconnect conductive structure has a length measured along its lengthwise centerline from its first end to its second end, wherein the second interconnect conductive structure has a width measured in the second direction perpendicular to the first direction at a midpoint of the lengthwise centerline of the second interconnect conductive structure, wherein the first and second interconnect conductive structures are positioned such that a distance as measured in the second direction between their lengthwise centerlines is substantially equal to a second pitch, wherein the second pitch is a fractional multiple of the first pitch, and wherein the second pitch is less than or equal to the first pitch, wherein the first interconnect level is formed at a vertical position within the semiconductor chip above the at least eight conductive structures, wherein the first interconnect level is separated from the co-planar top surfaces of the at least eight conductive structures by at least one dielectric material, wherein the second interconnect level is formed at a vertical position within the semiconductor chip above the first interconnect level, wherein the third interconnect level is formed at a vertical position within the semiconductor chip above the second interconnect level, and wherein the fourth interconnect level is formed at a vertical position within the semiconductor chip above the third interconnect level.

30. The method as recited in claim 29, wherein the eighth electrical connection is formed to include one or more overlying interconnect conductive structures formed at a respective vertical position within the semiconductor chip overlying some of the at least eight conductive structures so as to be separated from the co-planar top surfaces of the at least eight conductive structures by at least one dielectric material, wherein each overlying interconnect conductive structure that is part of the eighth electrical connection has a respective top surface with an entirety of a periphery of the respective top surface defined by a corresponding first end, a corresponding second end, a corresponding first edge, and a corresponding second edge, such that a total distance along the entirety of the periphery of the respective top surface is equal to a sum of a total distance along the corresponding first edge and a total distance along the corresponding second edge and a total distance along the corresponding first end and a total distance along the corresponding second end, wherein the total distance along the corresponding first edge is greater than two times the total distance along the corresponding first end and is greater than two times the total distance along the corresponding second end, wherein the total distance along the corresponding second edge is greater than two times the total distance along the corresponding first end and is greater than two times the total distance along the corresponding second end, wherein the corresponding first end extends from the corresponding first edge to the corresponding second edge and is located principally within a space between the corresponding first edge and the corresponding second edge, wherein the corresponding second end extends from the corresponding first edge to the corresponding second edge and is located principally within a space between the corresponding first edge and the corresponding second edge, wherein each overlying interconnect conductive structure that is part of the eighth electrical connection has a respective lengthwise centerline oriented along its respective top surface to extend from its corresponding first end to its corresponding second end, with each of the corresponding first edge and the corresponding second edge being substantially straight and oriented substantially parallel to its respective lengthwise centerline.

* * * * *